US010818848B2

(12) United States Patent
Cho et al.

(10) Patent No.: US 10,818,848 B2
(45) Date of Patent: Oct. 27, 2020

(54) ORGANIC LIGHT EMITTING DEVICE

(71) Applicant: LG CHEM, LTD., Seoul (KR)

(72) Inventors: Seong Mi Cho, Daejeon (KR); Min Woo Jung, Daejeon (KR); Sang Young Jeon, Daejeon (KR); Minwoo Choi, Daejeon (KR); Hyeon Soo Jeon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 41 days.

(21) Appl. No.: 16/319,203

(22) PCT Filed: Apr. 4, 2018

(86) PCT No.: PCT/KR2018/003954
§ 371 (c)(1),
(2) Date: Jan. 18, 2019

(87) PCT Pub. No.: WO2019/031679
PCT Pub. Date: Feb. 14, 2019

(65) Prior Publication Data
US 2019/0372012 A1 Dec. 5, 2019

(30) Foreign Application Priority Data

Aug. 10, 2017 (KR) .................. 10-2017-0101813

(51) Int. Cl.
*H01L 51/00* (2006.01)
*H01L 51/50* (2006.01)
*H01L 51/52* (2006.01)

(52) U.S. Cl.
CPC ...... *H01L 51/0067* (2013.01); *H01L 51/0072* (2013.01); *H01L 51/0073* (2013.01); *H01L 51/0074* (2013.01); *H01L 51/5056* (2013.01); *H01L 51/5072* (2013.01); *H01L 51/5206* (2013.01); *H01L 51/5221* (2013.01)

(58) Field of Classification Search
None
See application file for complete search history.

(56) References Cited

U.S. PATENT DOCUMENTS

| 2016/0093808 | A1 | 3/2016 | Adamovich et al. |
| 2016/0141505 | A1 | 5/2016 | Park et al. |
| 2016/0197285 | A1 | 7/2016 | Zeng et al. |
| 2017/0054087 | A1 | 2/2017 | Zeng et al. |
| 2017/0186965 | A1 | 6/2017 | Parham et al. |
| 2017/0207399 | A1 | 7/2017 | Parham et al. |

FOREIGN PATENT DOCUMENTS

| EP | 3336159 A1 | 6/2018 |
| JP | 2016-128432 A | 7/2016 |
| JP | 2017-107992 A | 6/2017 |
| KR | 2000-0051826 A | 8/2000 |
| KR | 10-2015-0042650 A | 4/2015 |
| KR | 10-2016-0027940 A | 3/2016 |
| KR | 10-2016-0028524 A | 3/2016 |
| KR | 10-1614738 B1 | 4/2016 |
| KR | 10-2016-0080090 A | 7/2016 |
| KR | 10-1744248 B1 | 6/2017 |
| WO | 2016/015810 A1 | 2/2016 |

Primary Examiner — Jay Yang
(74) Attorney, Agent, or Firm — Dentons US LLP

(57) ABSTRACT

The present invention provides an organic light emitting device comprising at least one light emitting layer which comprises a first host compound and a second host compound, and the organic light emitting device has improved driving voltage, efficiency and lifetime.

11 Claims, 1 Drawing Sheet

[FIG. 1]
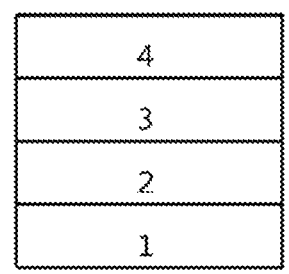
[FIG. 2]
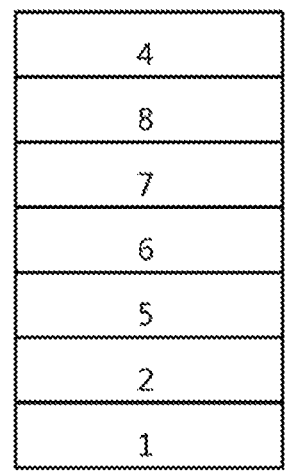

ORGANIC LIGHT EMITTING DEVICE

CROSS-REFERENCE TO RELATED APPLICATION(S)

This application is a National Stage Entry of International Application No. PCT/KR2018/003954, filed on Apr. 4, 2018, and claims the benefit of and priority to Korean Application No. 10-2017-0101813, filed on Aug. 10, 2017, all of which are hereby incorporated by reference in their entirety for all purposes as if fully set forth herein.

The present invention relates to an organic light emitting device having improved driving voltage, efficiency and lifetime.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently have a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and the electrons meet each other, an exciton is formed, and light is emitted when the exciton falls to a ground state again.

There is a continuing demand for developing an organic light emitting device having improved driving voltage, efficiency and lifetime.

PRIOR ART LITERATURE

Patent Literature (Patent Literature 0001) Korean Patent Laid-open Publication No. 10-2000-0051826

DETAILED DESCRIPTION OF THE INVENTION

Technical Problem

It is one object of the present invention to provide an organic light emitting device having improved driving voltage, efficiency and lifetime.

Technical Solution

The present invention provides an organic light emitting device as follows:

An organic light emitting device comprising:
a cathode; an anode; and at least one light emitting layer interposed between the cathode and the anode,
wherein the light emitting layer comprises a first host compound represented by Chemical Formula 1 below, and a second host compound represented by Chemical Formula 2 below:

[Chemical Formula 1]

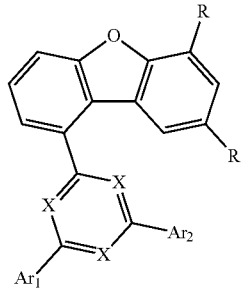

in Chemical Formula 1,
X is N, or CH, with the proviso that at least one X is N,
$Ar_1$ and $Ar_2$ are each independently a substituted or unsubstituted $C_{6-60}$ aryl; or a $C_{2-60}$ heteroaryl containing N, O, or S,
each R is identical and is —L—$Ar_3$,
L is a bond; or a substituted or unsubstituted $C_{6-60}$ arylene,
$Ar_3$ is a substituted or unsubstituted $C_{6-60}$ aryl; or a $C_{2-60}$ heteroaryl containing N, O, or S,

[Chemical Formula 2]

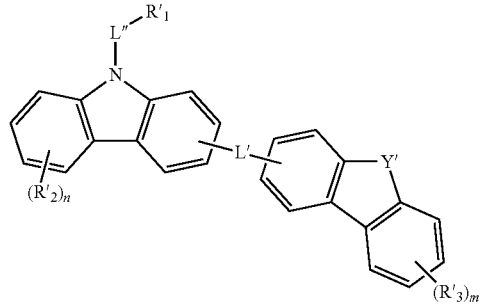

in Chemical Formula 2,
Y' is O, S, NW, or CR'R",
wherein R' and R" are each independently hydrogen; deuterium; halogen; cyano; nitro; amino; a substituted or unsubstituted $C_{1-60}$ alkyl; a substituted or unsubstituted $C_{1-60}$ haloalkyl; a substituted or unsubstituted $C_{1-60}$ haloalkoxy; a substituted or unsubstituted $C_{3-60}$ cycloalkyl; a substituted or unsubstituted $C_{2-60}$ alkenyl; a substituted or unsubstituted $C_{6-60}$ aryl; or a substituted or unsubstituted $C_{2-60}$ heteroaryl containing at least one of O, N, Si and S, or R' and R" together form a substituted or unsubstituted $C_{6-60}$ aromatic ring,
L' and L" are each independently a single bond; a substituted or unsubstituted $C_{6-60}$ arylene; or a substituted or unsubstituted $C_{2-60}$ heteroarylene containing at least one of O, N, Si and S, R'₁ is a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl containing at least one of O, N, Si and S, R'₂ and R'₃ are each independently hydrogen; deuterium; halogen; cyano; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl containing at least one of O, N, Si and S, and m and n are each independently an integer of 0 to 4.

Advantageous Effects

The organic light emitting device described above is excellent in driving voltage, efficiency, and lifetime.

BRIEF DESCRIPTION OF DRAWINGS

FIG. 1 shows an example of an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 7, an electron transport layer 8, and a cathode 4.

DETAILED DESCRIPTION OF THE EMBODIMENTS

Hereinafter, the present invention will be described in more detail to help understanding of the present invention.

In the present specification,

means a bond connected to another substituent group.

As used herein, the term "substituted or unsubstituted" means that substitution is performed by one or more substituent groups selected from the group consisting of deuterium; a halogen group; a nitrile group; a nitro group; a hydroxyl group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; or a heterocyclic group containing at least one of N, O, and S atoms, or there is no substituent group, or substitution is performed by a substituent group where two or more substituent groups of the exemplified substituent groups are connected or there is no substituent group. For example, the term "substituent group where two or more substituent groups are linked" may be a biphenyl group. That is, the biphenyl group may be an aryl group, or may be interpreted as a substituent group where two phenyl groups are connected.

In the present specification, the number of carbon atoms in a carbonyl group is not particularly limited, but is preferably 1 to 40 carbon atoms.

Specifically, the carbonyl group may be compounds having the following structures, but is not limited thereto.

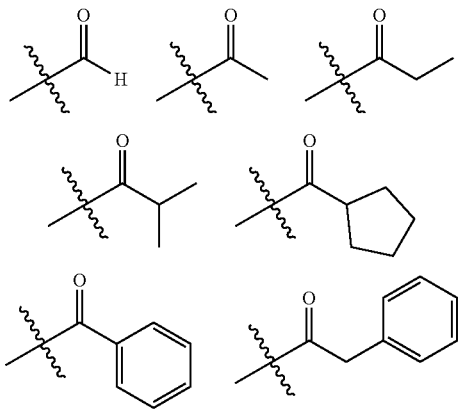

In the present specification, the ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be compounds having the following structures, but is not limited thereto.

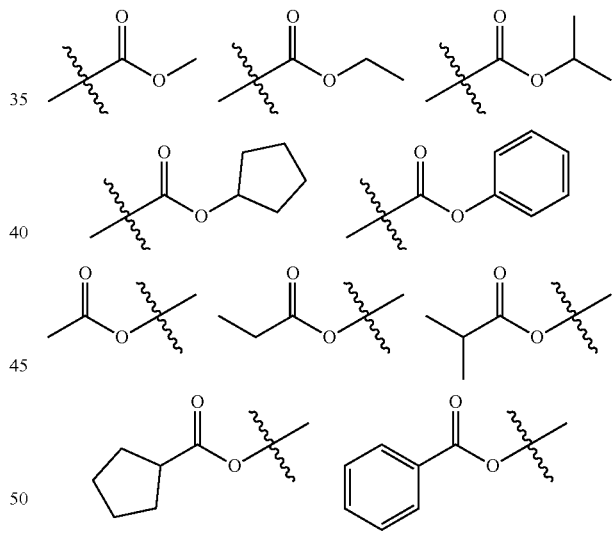

In the present specification, the number of carbon atoms in an imide group is not particularly limited, but is preferably 1 to 25. Specifically, the imide group may be compounds having the following structures, but is not limited thereto.

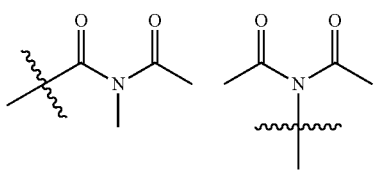

-continued

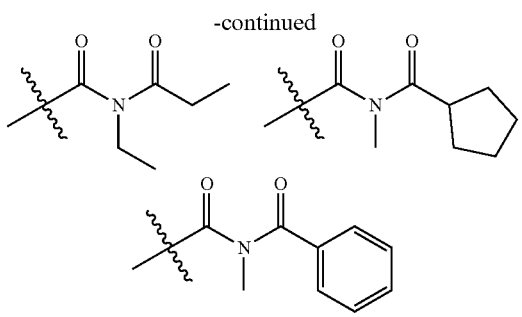

In the present specification, the silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but is not limited thereto.

In the present specification, the boron group specifically includes a trimethylboron group, a triethylboron group, a t-butyldimethylboron group, a triphenylboron group, a phenylboron group, and the like, but is not limited thereto.

In the present specification, examples of a halogen group include fluorine, chlorine, bromine, or iodine.

In the present specification, an alkyl group may be a straight chain or a branched chain, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present specification, the alkenyl group may be a straight chain or a branched chain, and the number of carbon atoms thereof is not particularly limited, but is preferably 2 to 40. According to one embodiment, the alkenyl group has 2 to 20 carbon atoms. According to another embodiment, the alkenyl group has 2 to 10 carbon atoms. According to still another embodiment, the alkenyl group has 2 to 6 carbon atoms. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, the cycloalkyl group is not particularly limited, but the number of carbon atoms thereof is preferably 3 to 60. According to one embodiment, the cycloalkyl group has 3 to 30 carbon atoms. According to another embodiment, the cycloalkyl group has 3 to 20 carbon atoms. According to another embodiment, the cycloalkyl group has 3 to 6 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the aryl group is not particularly limited, but preferably has 6 to 60 carbon atoms, and may be a monocyclic aryl group or a polycyclic aryl group. According to one embodiment, the aryl group has 6 to 30 carbon atoms. According to one embodiment, the aryl group has 6 to 20 carbon atoms. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrycenyl group, a fluorenyl group or the like, but is not limited thereto.

In the present specification, the fluorenyl group may be substituted, and two substituent groups may be connected with each other to form a spiro structure. In the case where the fluorenyl group is substituted,

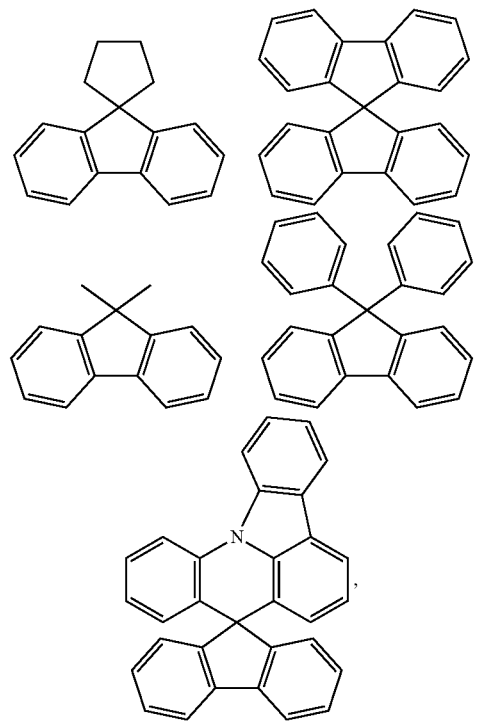

and
the like can be formed. However, the structure is not limited thereto.

In the present specification, the heterocyclic group is a heterocyclic group containing at least one of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamines can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

The present invention provides the following organic light emitting device:

An organic light emitting device comprising: a cathode; an anode; and at least one light emitting layer interposed between the cathode and the anode, wherein the light emitting layer includes a first host compound represented by Chemical Formula 1-1 or Chemical Formula 1-2 and a second host compound represented by Chemical Formula 2.

Hereinafter, the present invention will be described in detail for each configuration.

Cathode and Anode

The anode and cathode used in the present invention are electrodes used in an organic light emitting device.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or SNO$_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or LiO$_2$/Al, and the like, but are not limited thereto.

In addition, a hole injection layer may be further included on the anode. The hole injection layer is composed of a hole injection material, and the hole injection material is preferably a compound which has an ability of transporting the holes, thus a hole injection effect in the anode and an excellent hole injection effect to the light emitting layer or the light emitting material, prevents movement of an exciton generated in the light emitting layer to the electron injection layer or the electron injection material, and has an excellent thin film forming ability.

It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Light Emitting Layer

The light emitting layer according to the present invention comprises a first host compound represented by Chemical Formula 1, and a second host compound represented by Formula 2.

In Chemical Formula 1, preferably, each X is N.

Preferably, Ar$_1$ and Ar$_2$ are each independently phenyl, or biphenylyl.

In Chemical Formula 1, the phrase "each R is identical" means that not only the structure of R but also the substitution position of R is the same. For example, when R is pyridinyl, it means that the substitution position where pyridinyl is substituted by dibenzofuran is also the same.

Preferably, L is a bond, phenylene, or naphthylene.

Preferably, Ar$_3$ is phenyl, cyano-substituted phenyl, biphenylyl, terphenylyl, naphthyl, phenanthrenyl, triphenylenyl, pyridinyl, dibenzofuranyl, dibenzothiophenyl, 9,9-dimethyl-9H-fluorenyl, carbazolyl, 9-phenyl-9H-carbazolyl, 9,9-dimethyl-9H-xanthenyl, or phenoxanthinyl.

Representative examples of the compound represented by Chemical Formula 1 are as follows:

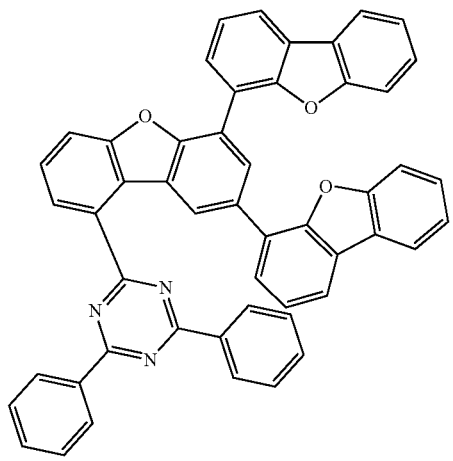

-continued
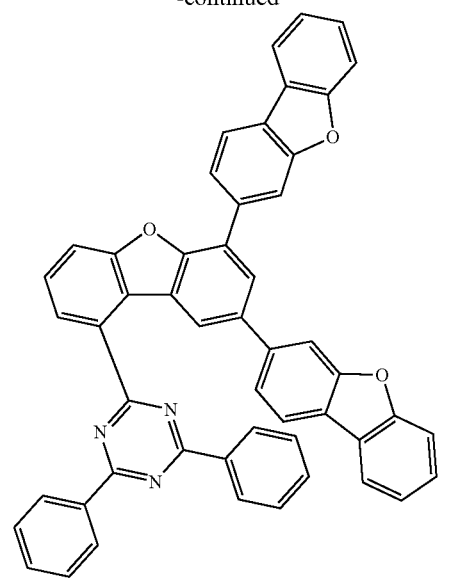
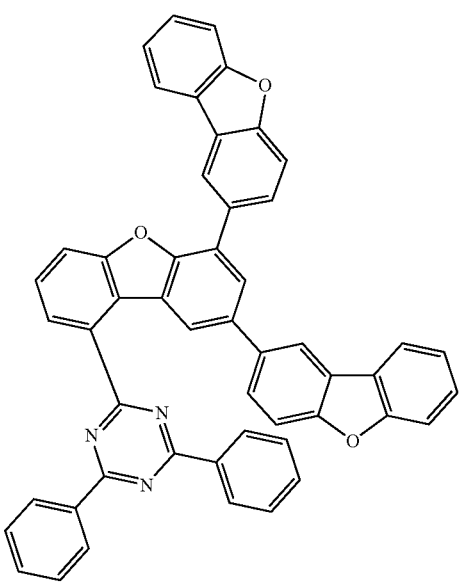
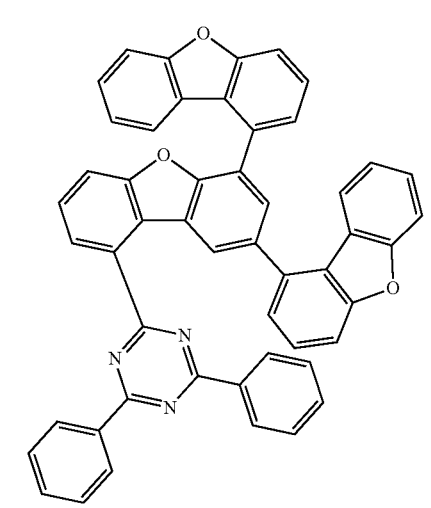
-continued
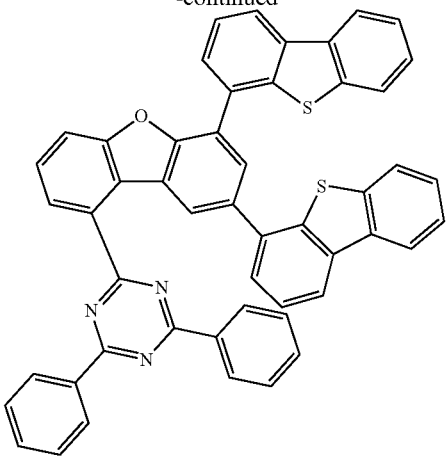
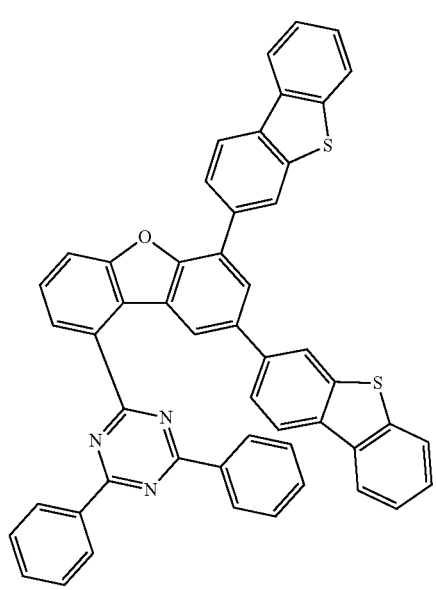
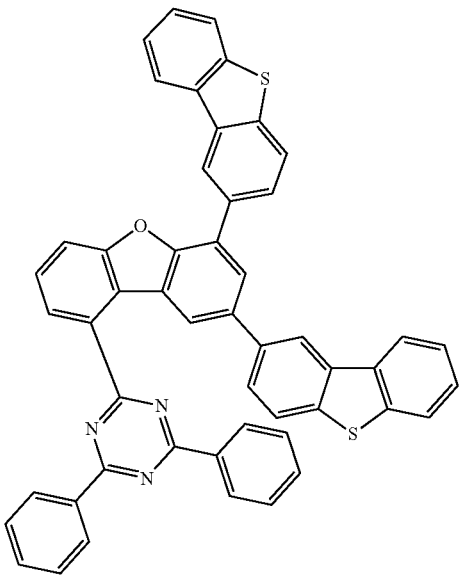

-continued
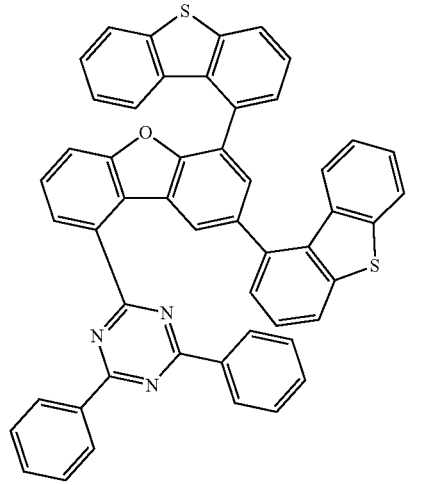
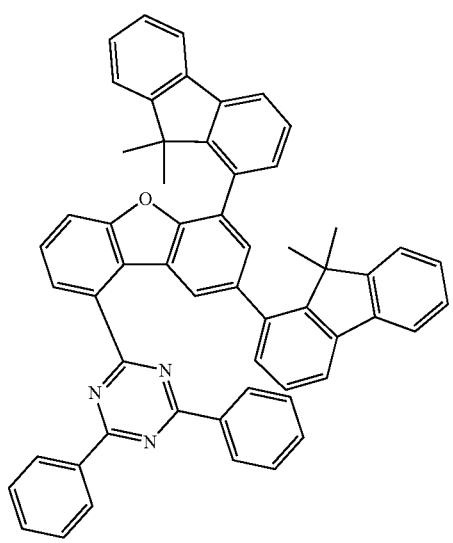
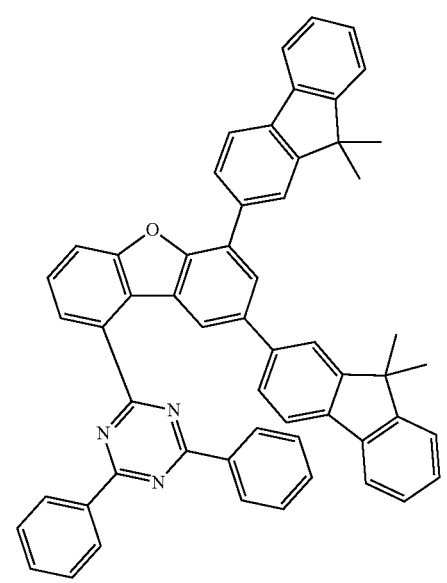
-continued
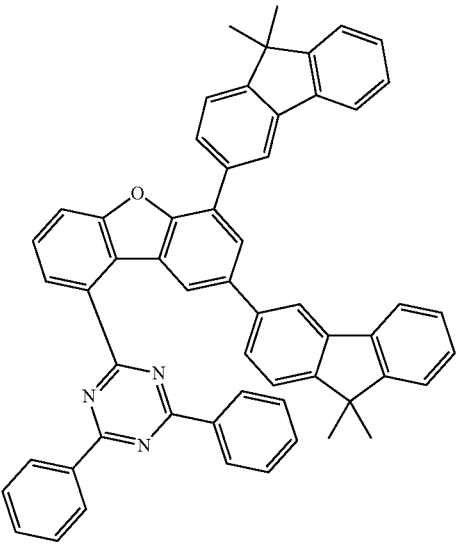
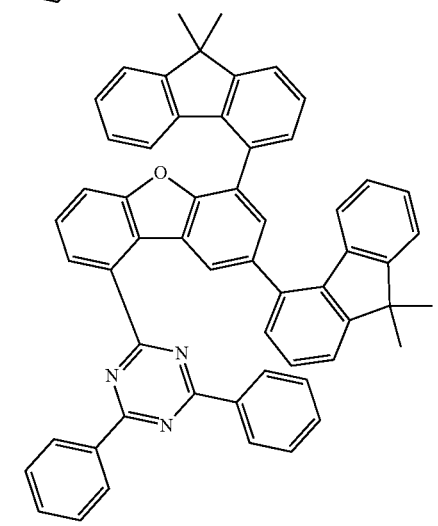
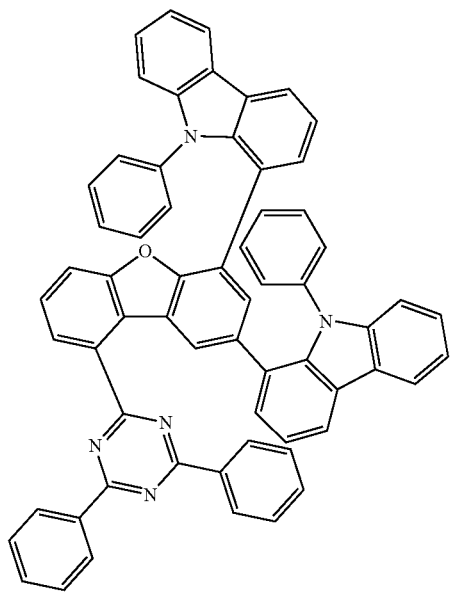

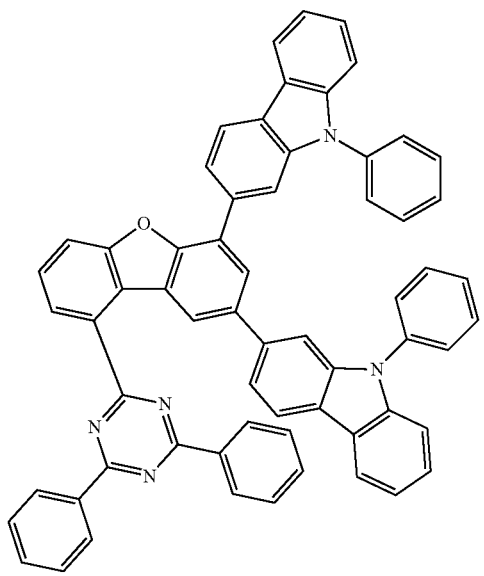
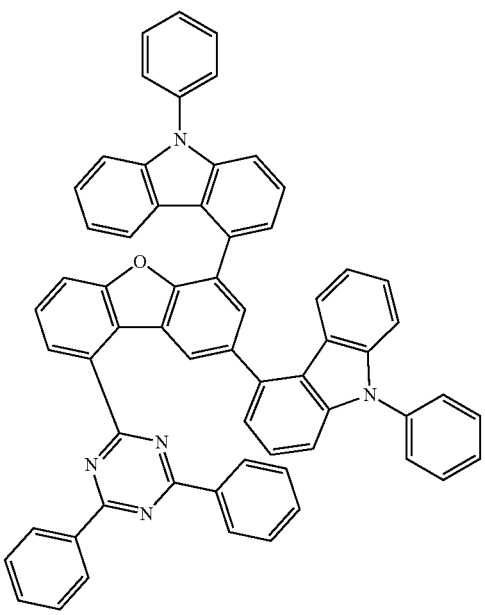
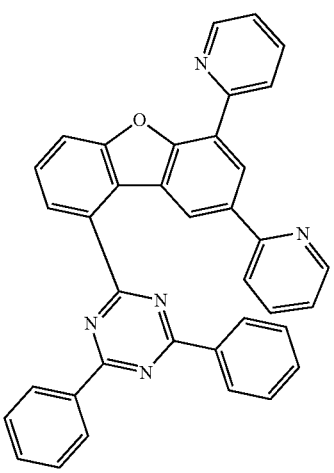
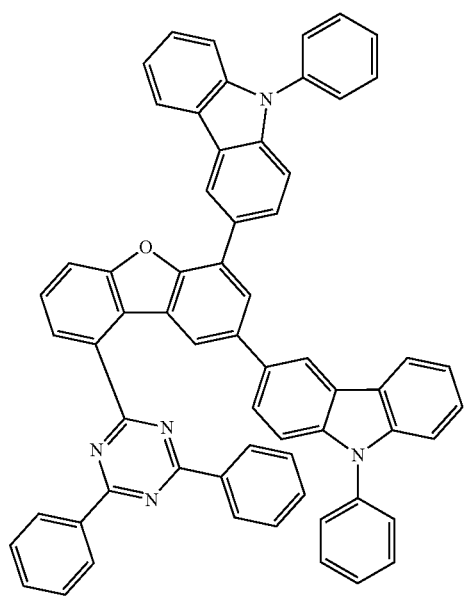
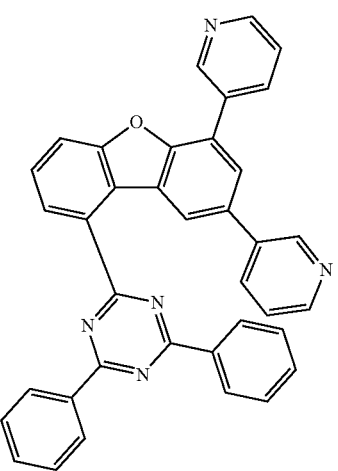

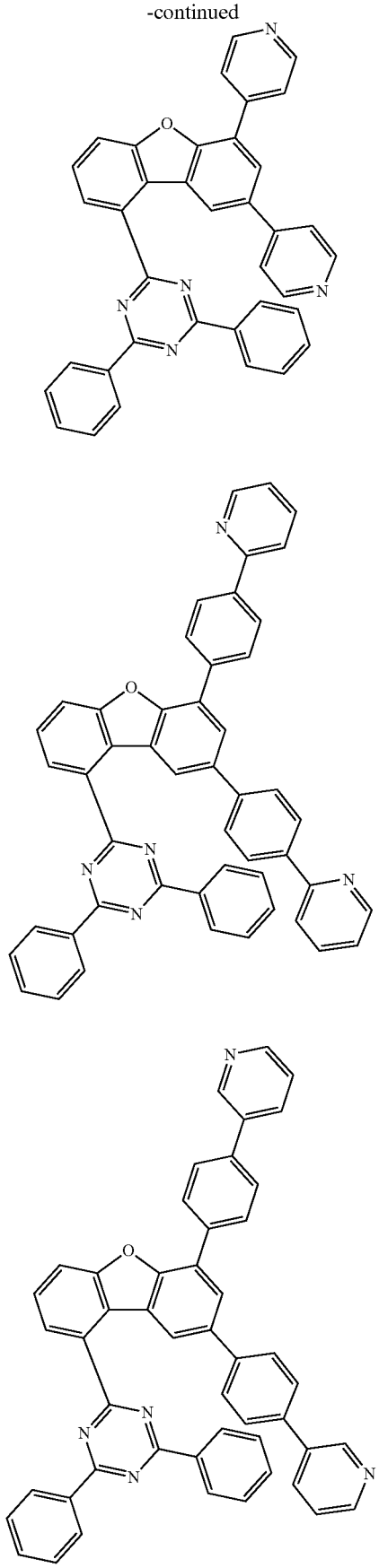
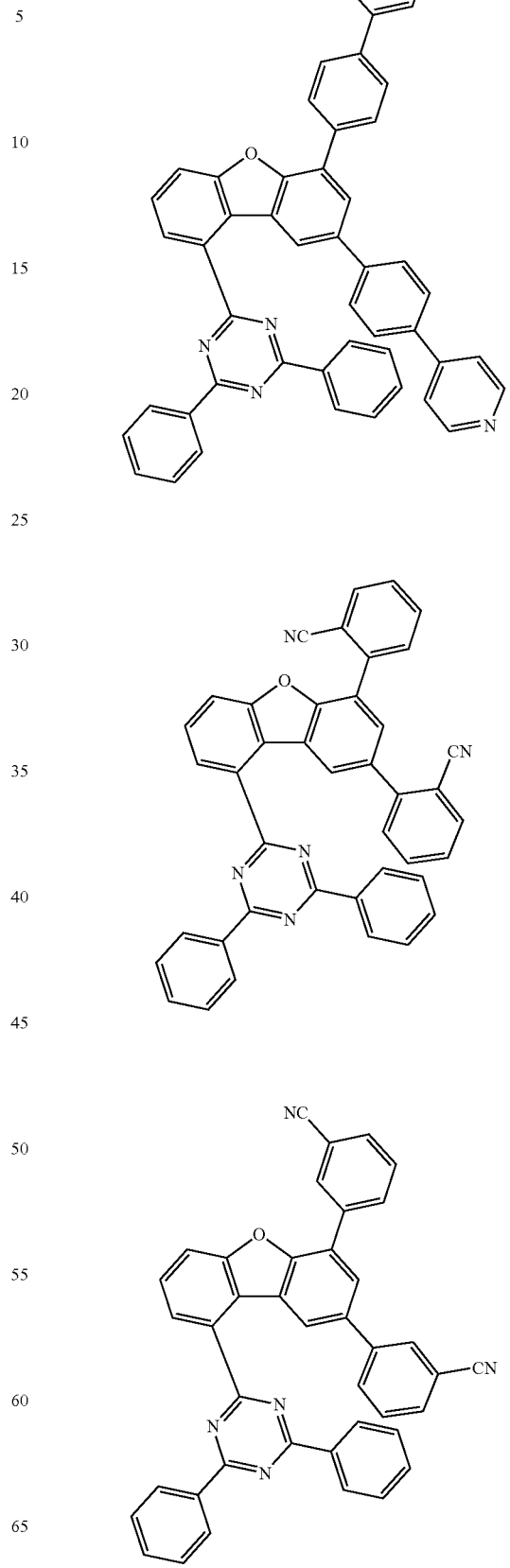

-continued
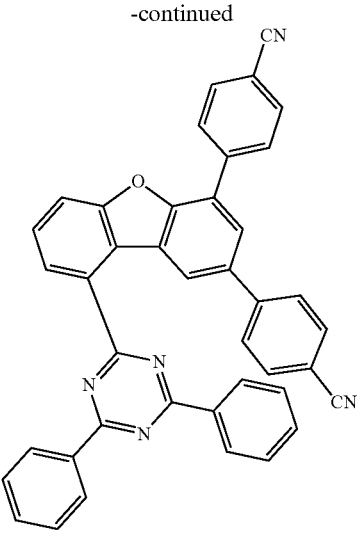
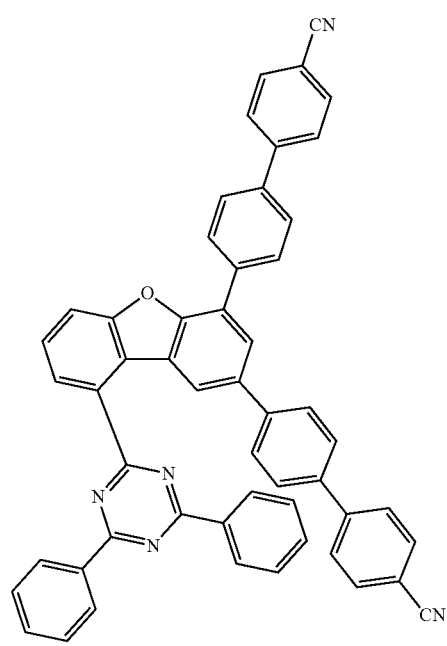
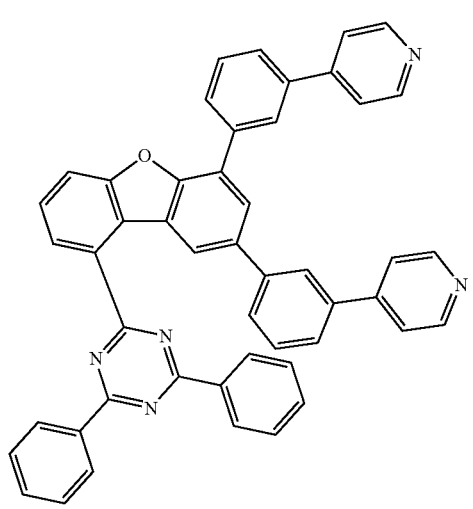
-continued
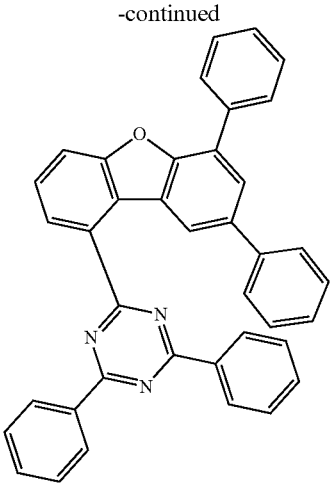
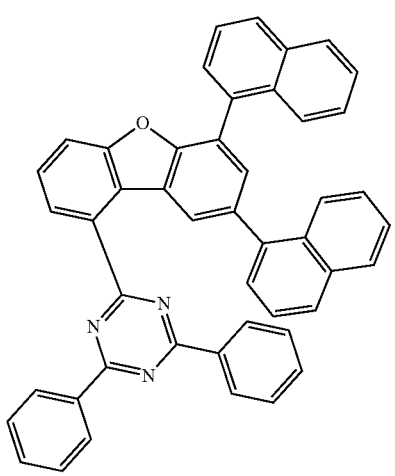
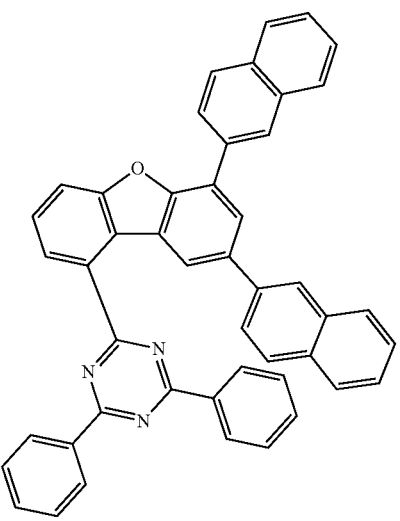

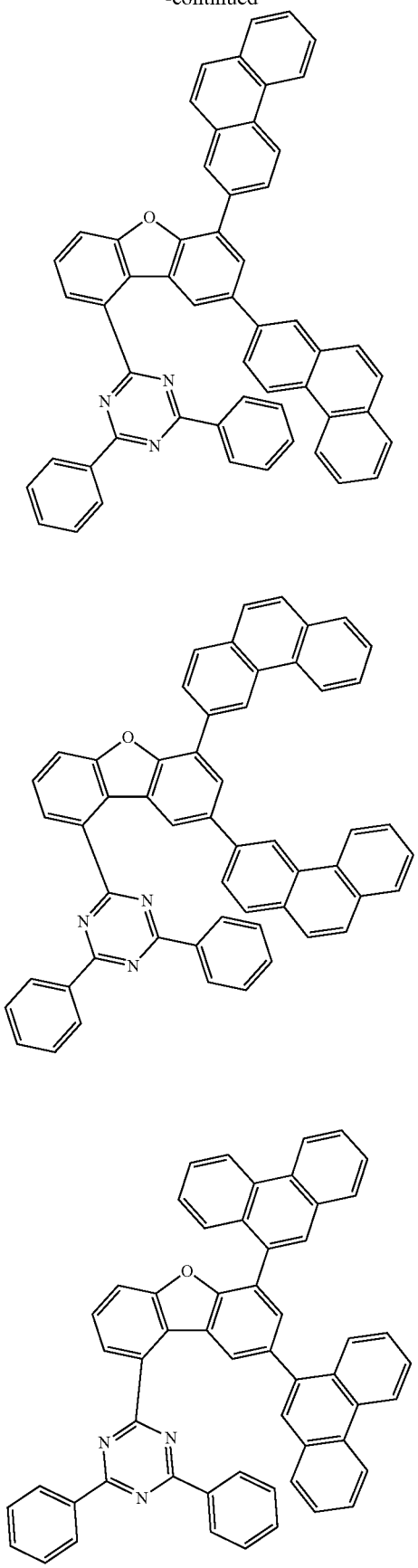 [SMILES: c1ccc(-c2nc(-c3ccccc3)nc(-c3cccc4oc5c(-c6ccc7c(ccc8ccccc87)c6)cc(-c6ccc7c(ccc8ccccc87)c6)cc5c34)n2)cc1 ; c1ccc(-c2nc(-c3ccccc3)nc(-c3cccc4oc5c(-c6ccc7ccc8ccccc8c7c6)cc(-c6ccc7ccc8ccccc8c7c6)cc5c34)n2)cc1 ; c1ccc(-c2nc(-c3ccccc3)nc(-c3cccc4oc5c(-c6cc7ccccc7c7ccccc67)cc(-c6cc7ccccc7c7ccccc67)cc5c34)n2)cc1]
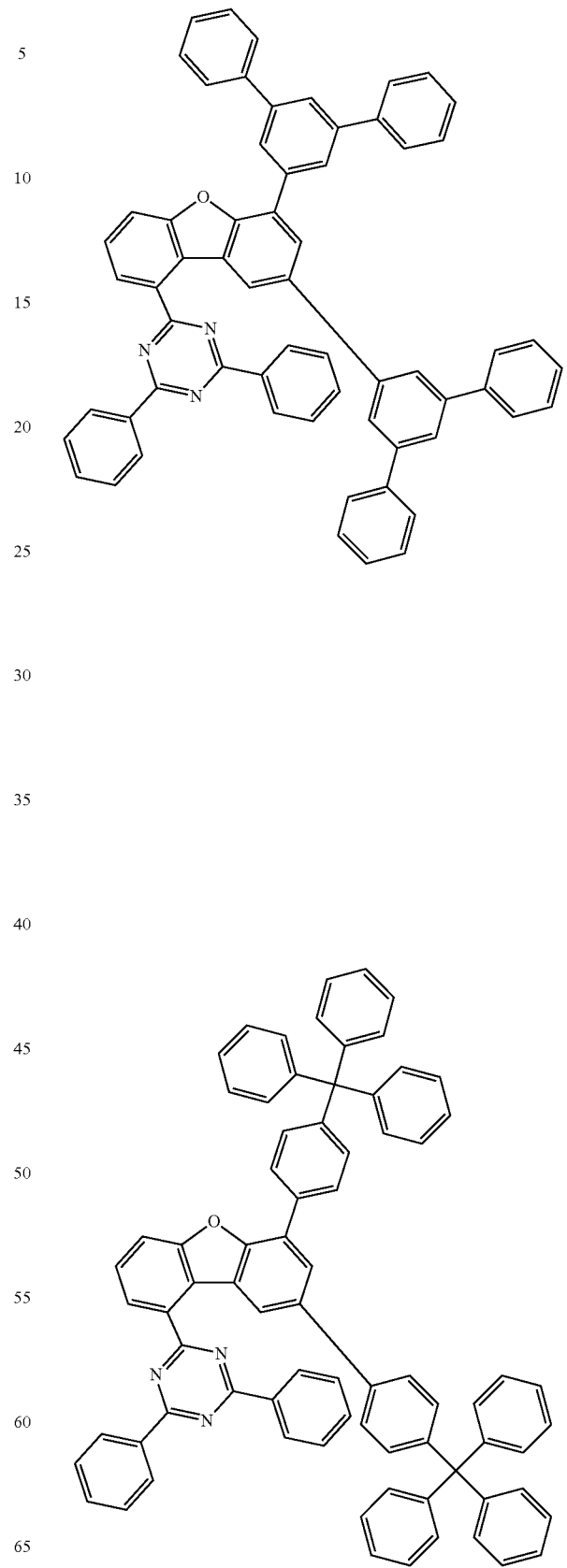

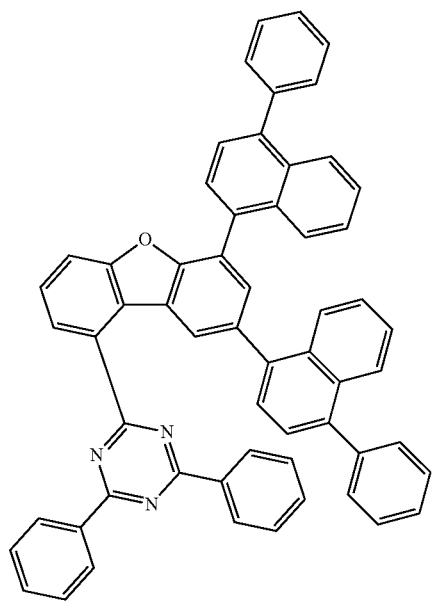
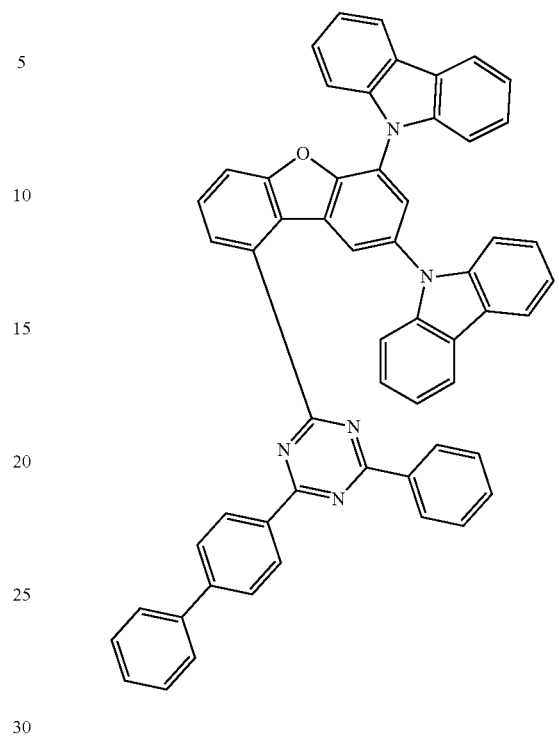
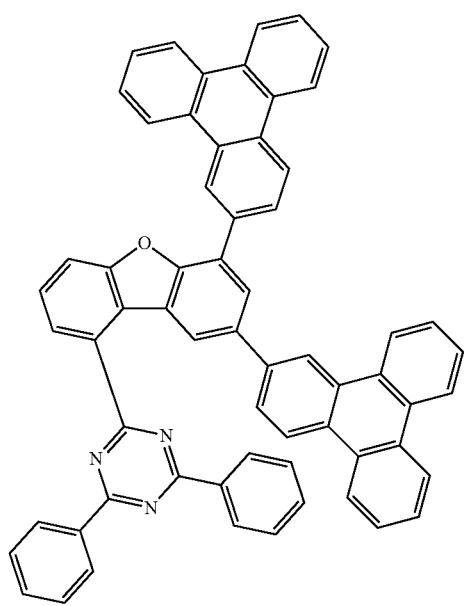
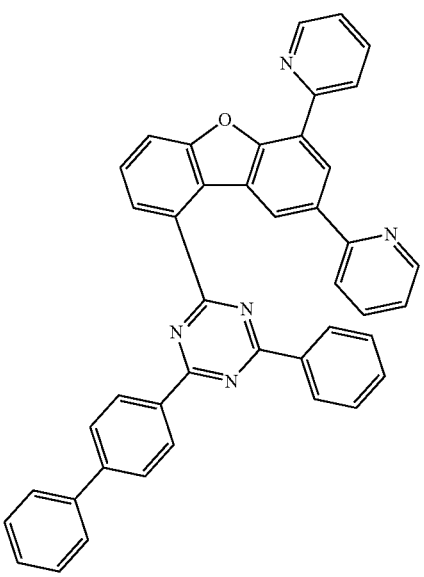

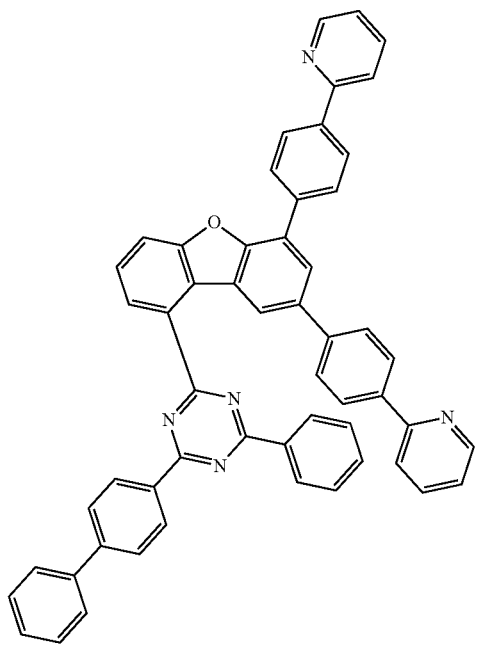
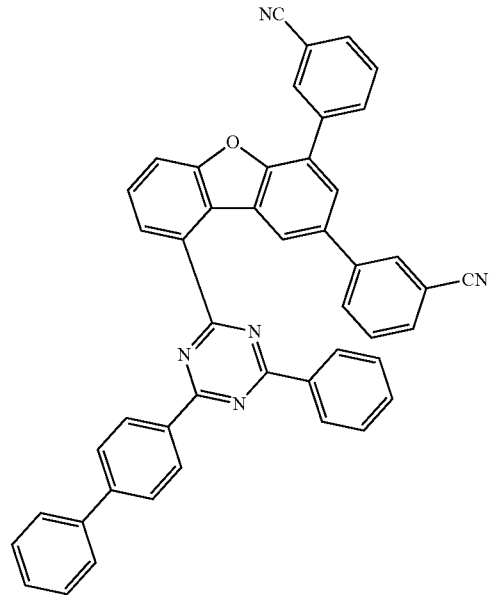
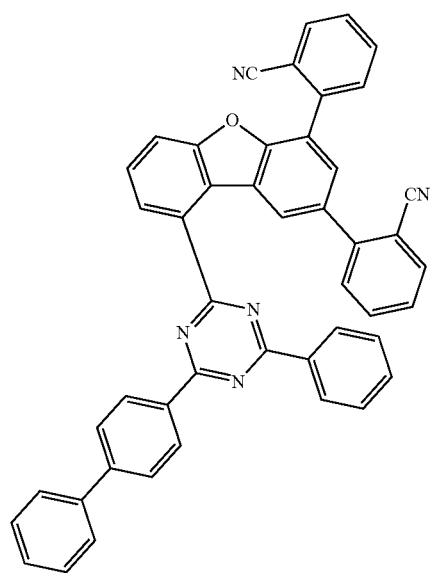
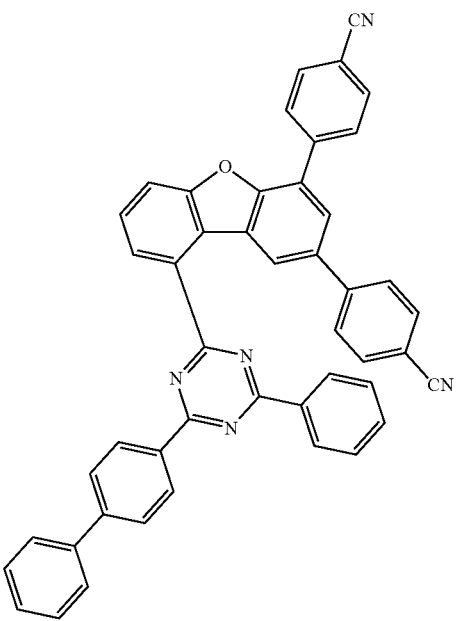

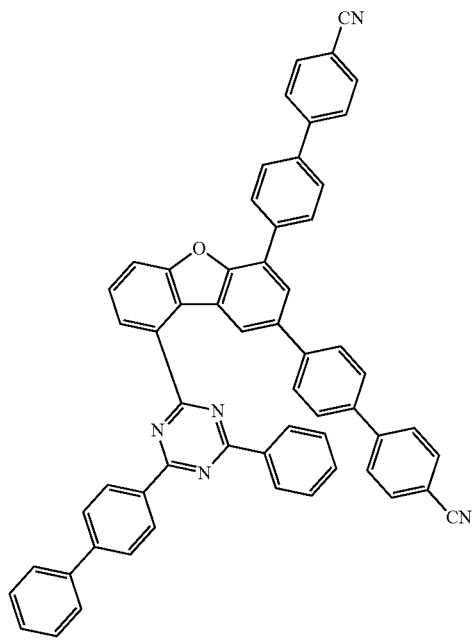
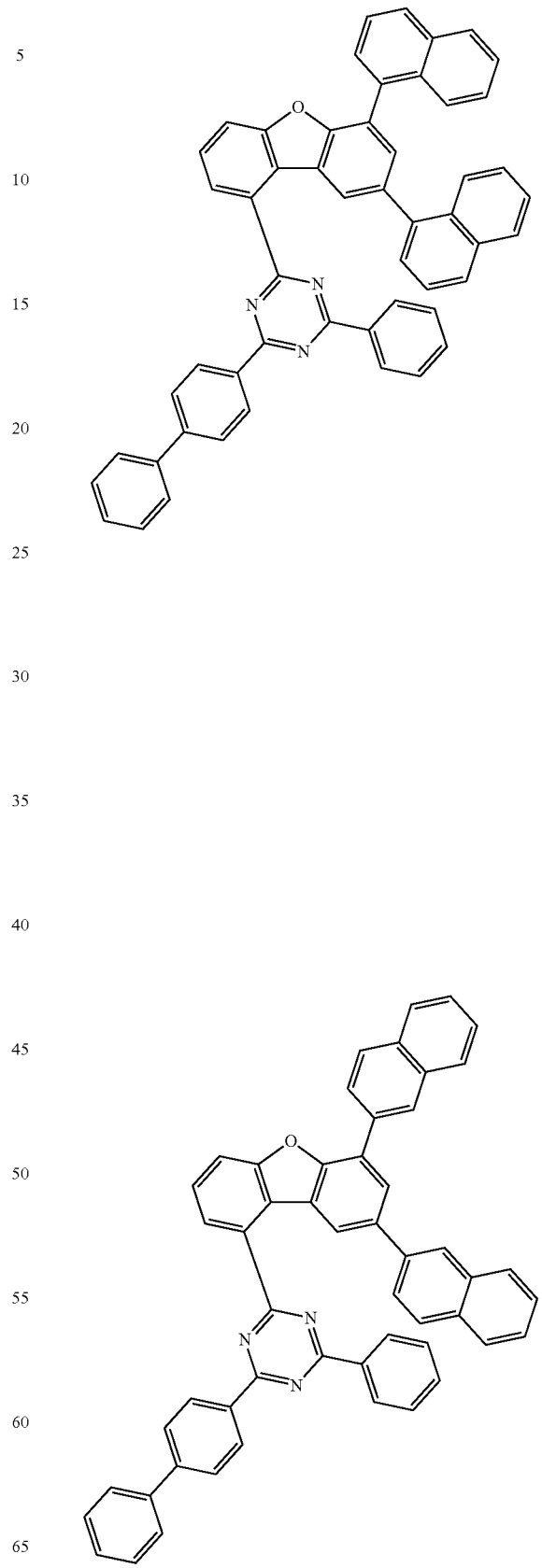

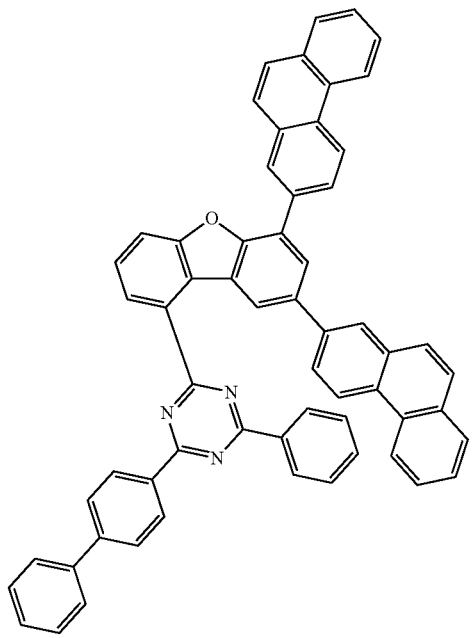
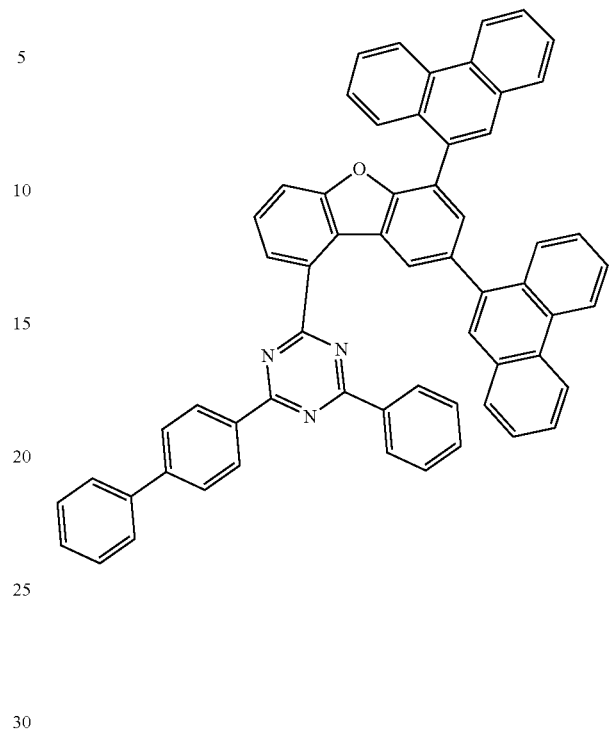
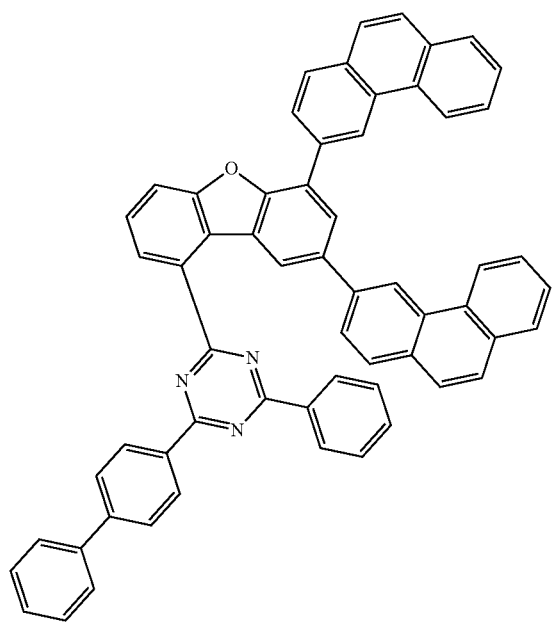
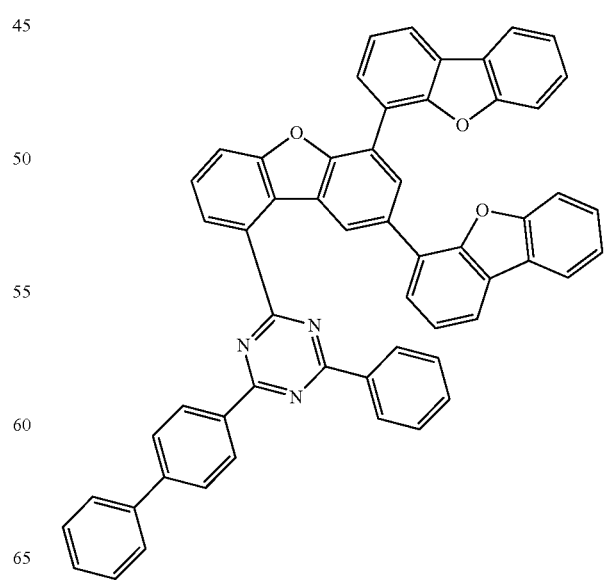

-continued
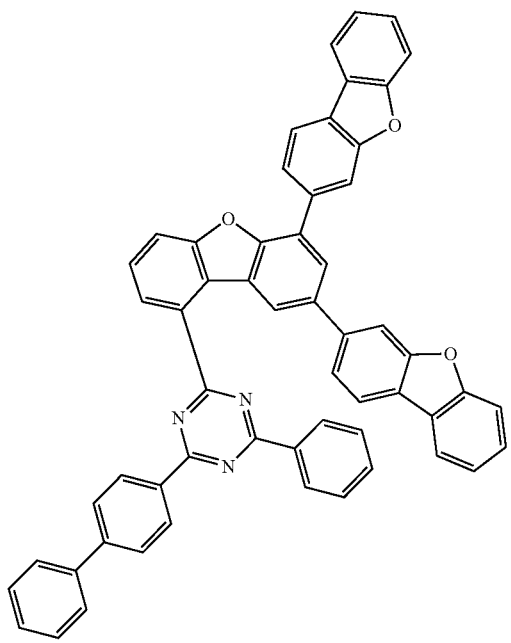
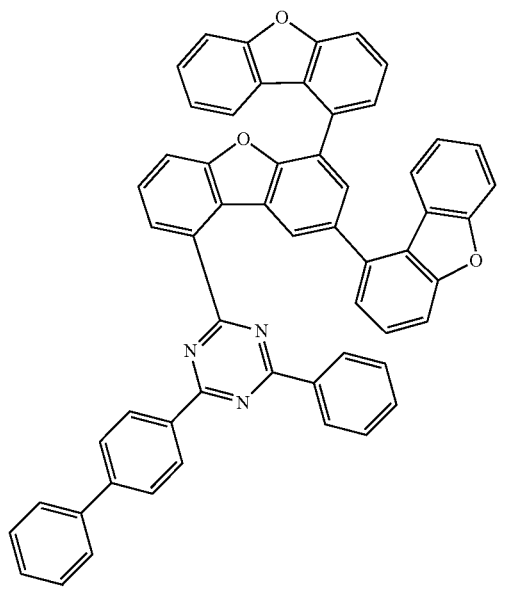
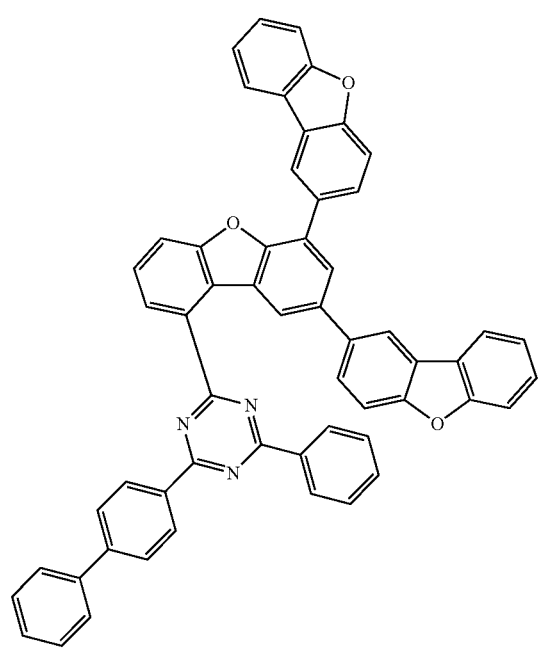
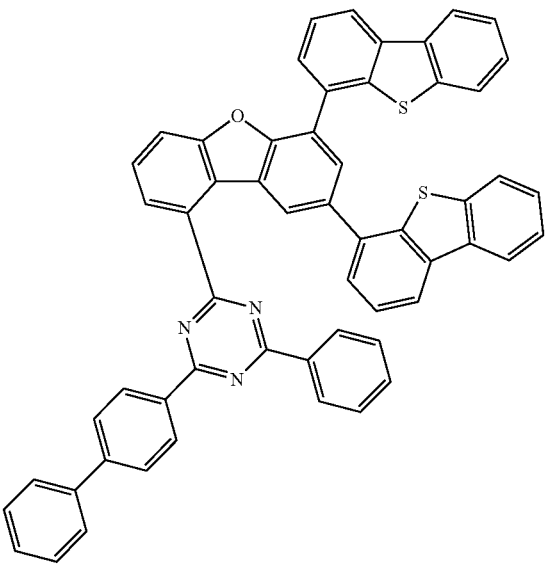

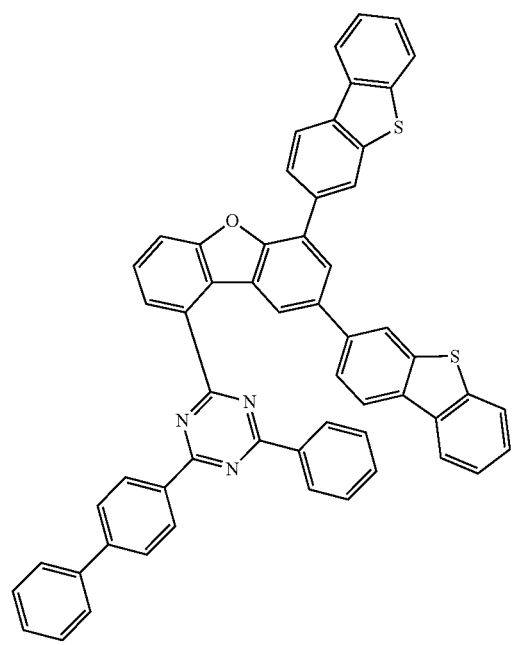
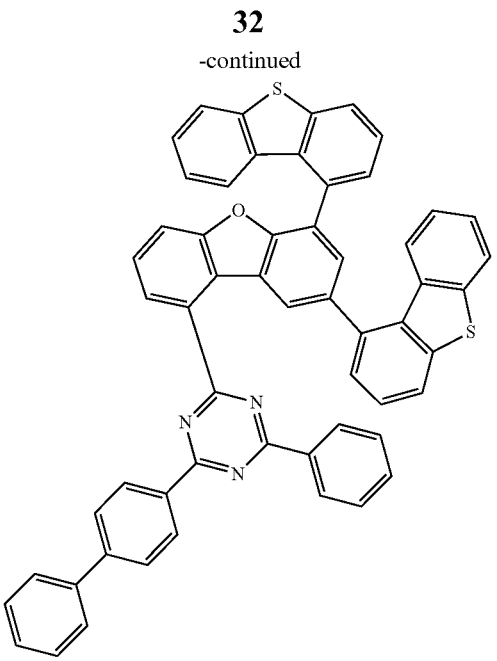
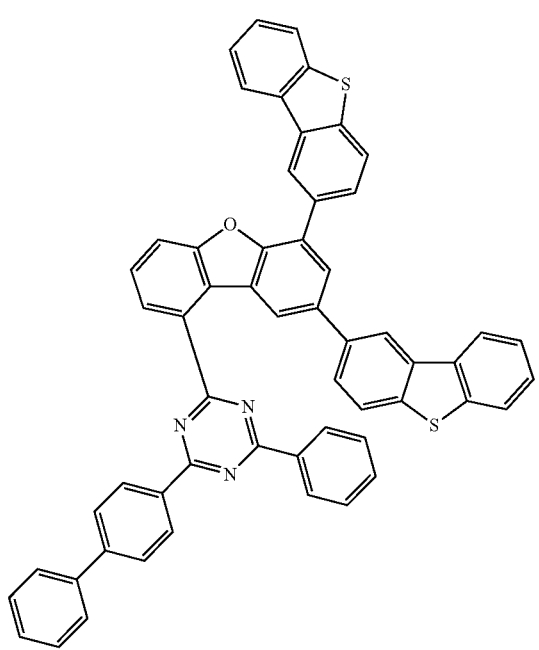
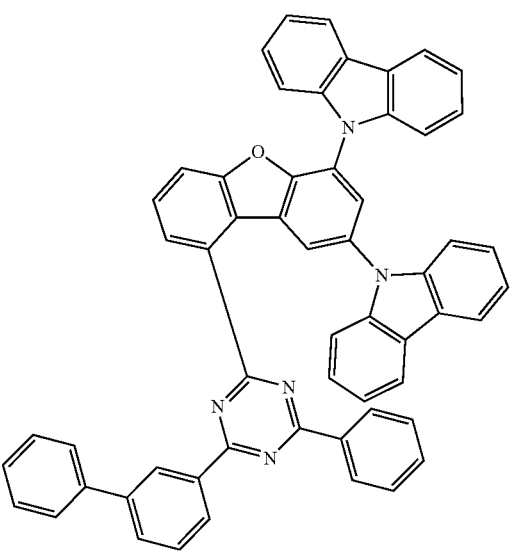
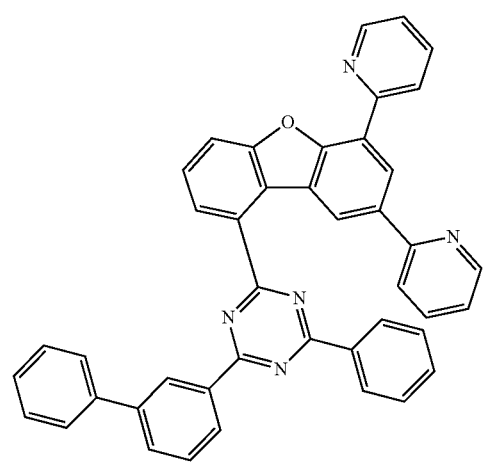

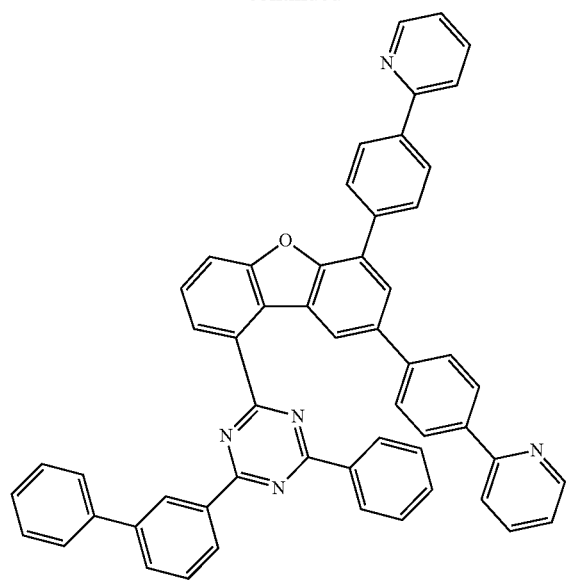
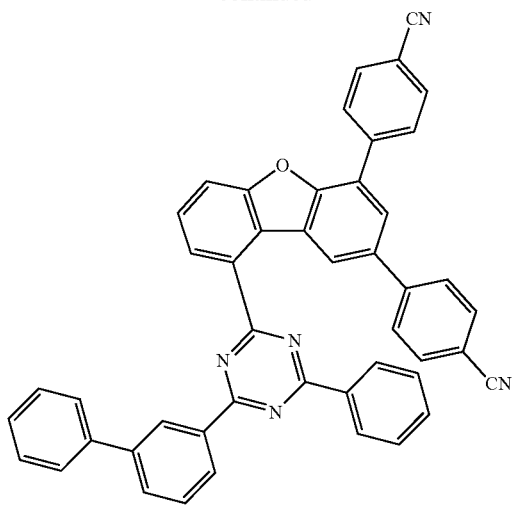
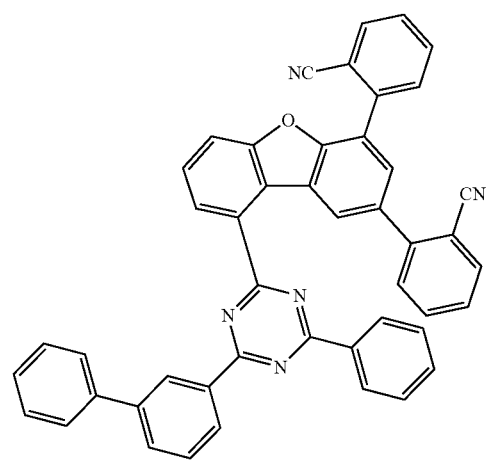
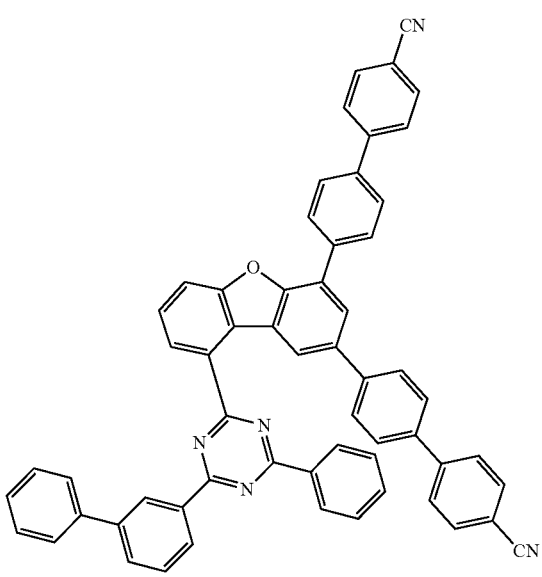
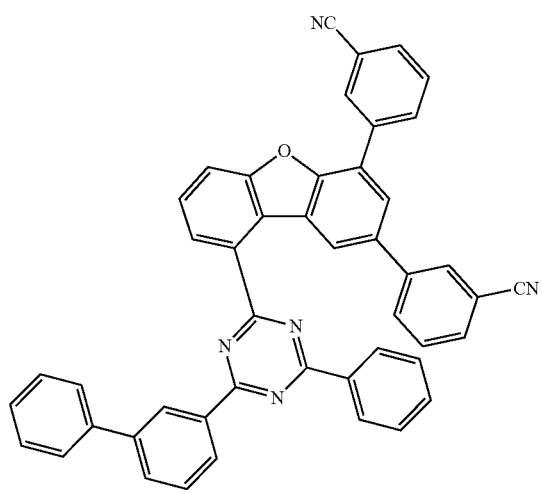
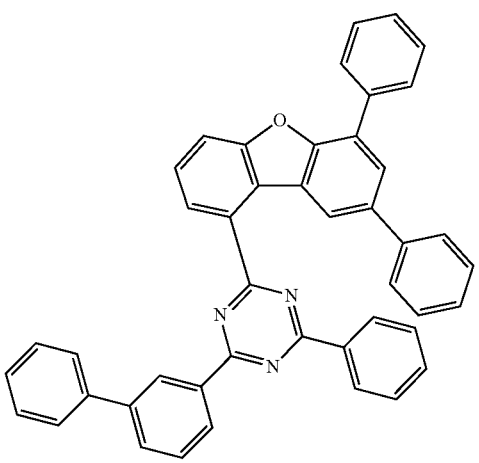

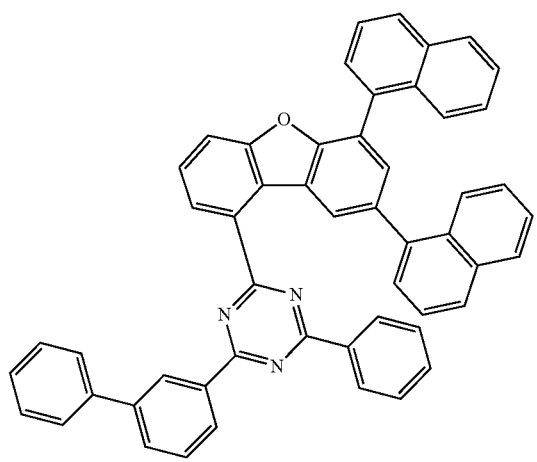
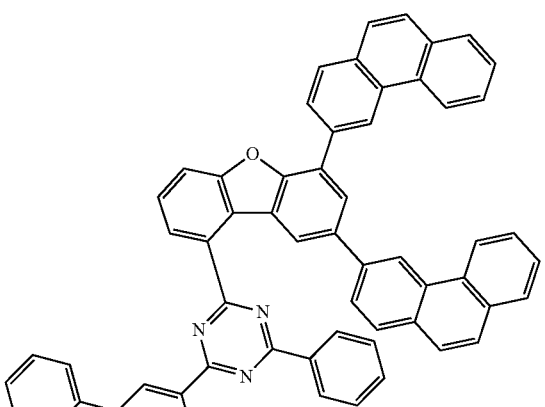
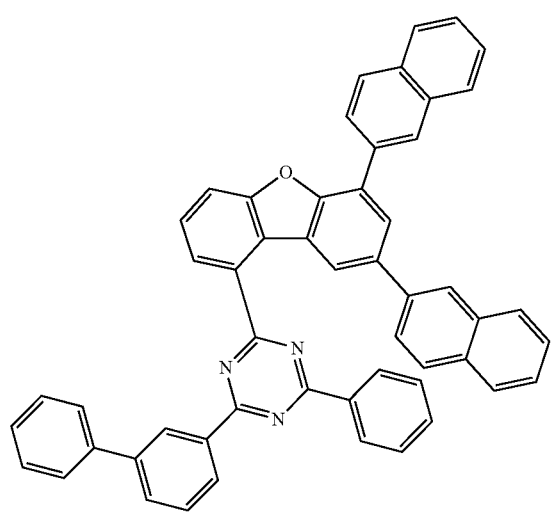
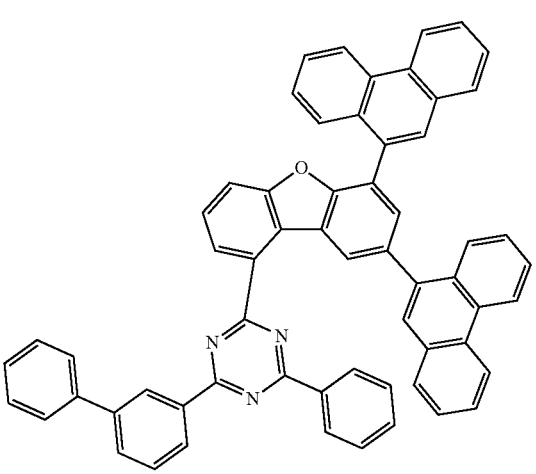
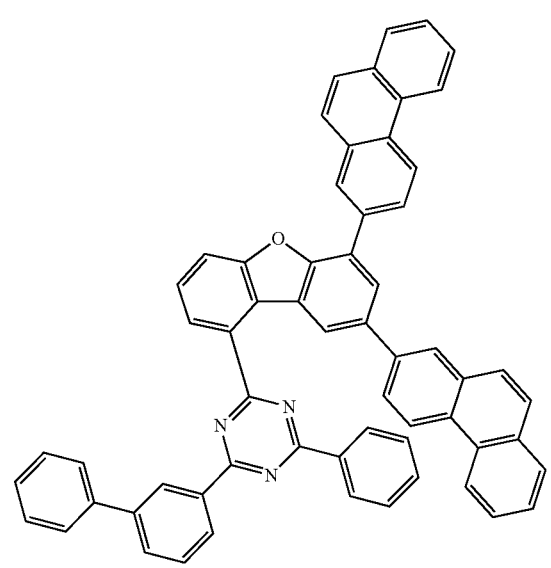
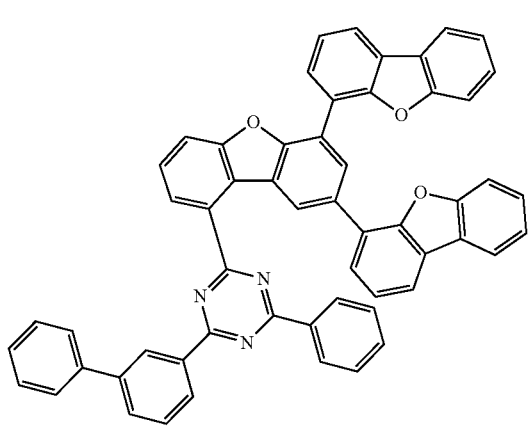

37
-continued
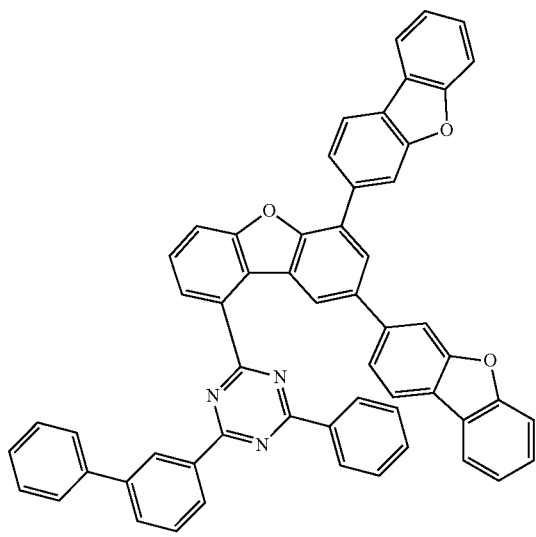
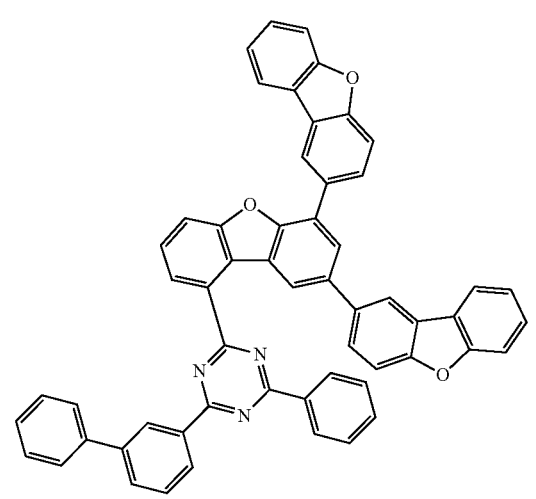
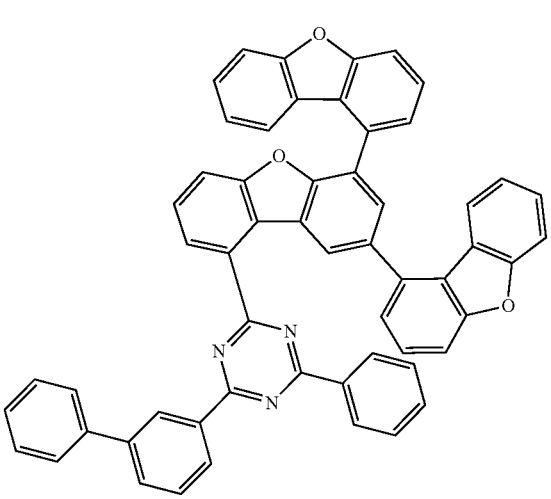
38
-continued
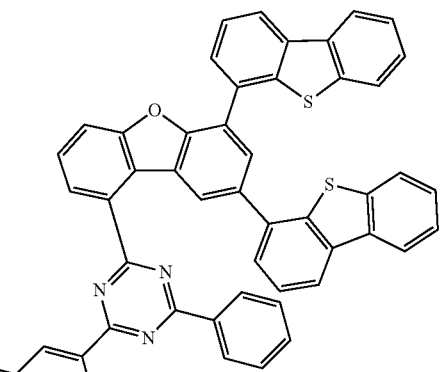
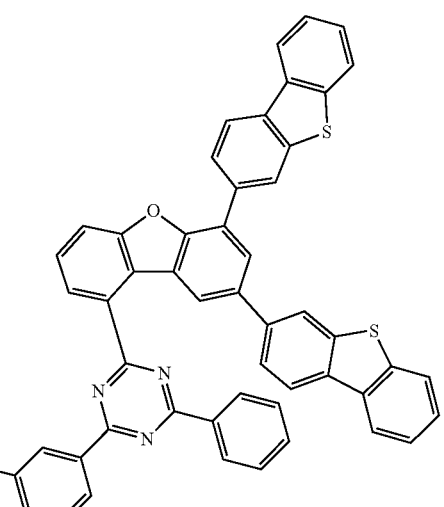
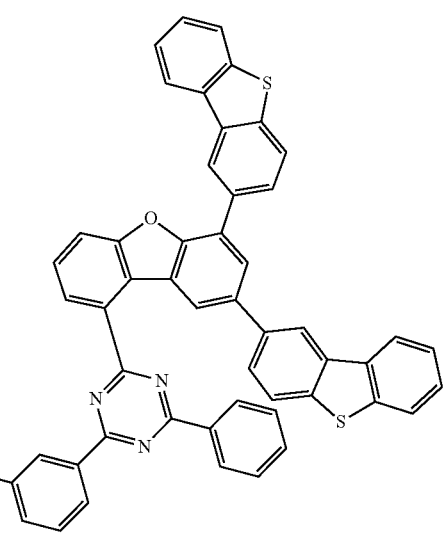

-continued
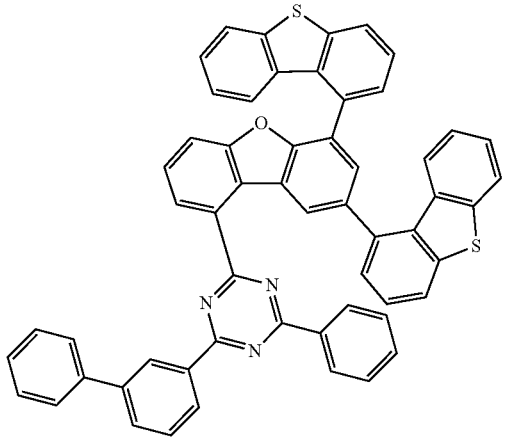
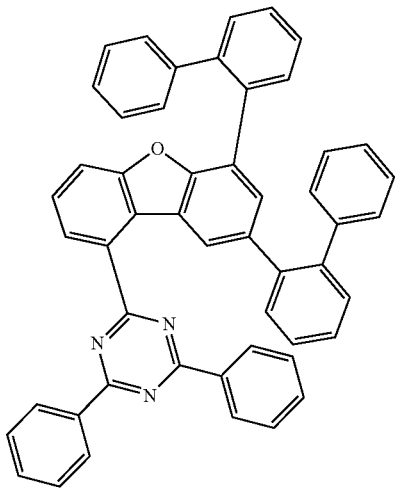
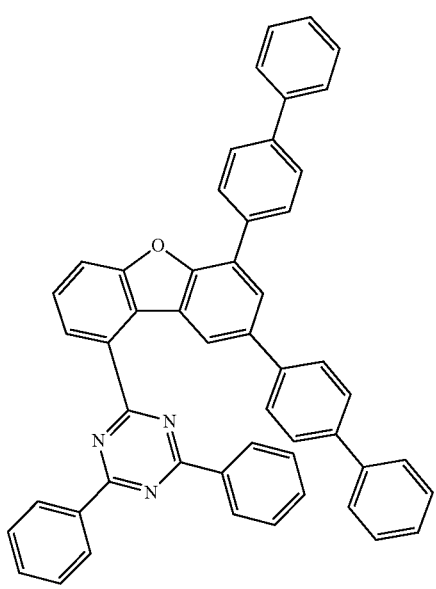
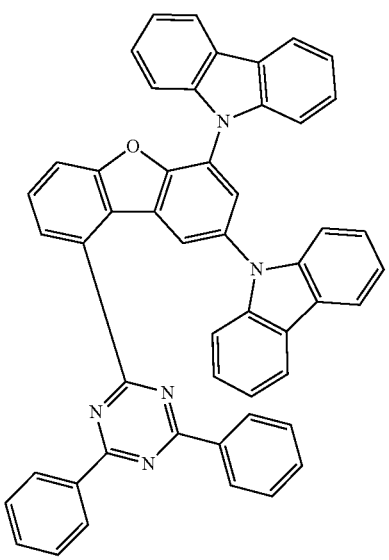
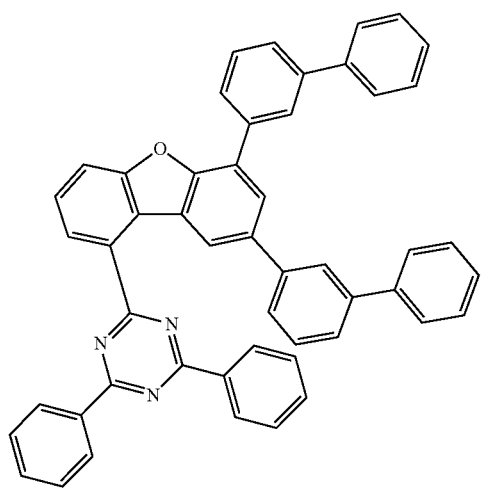
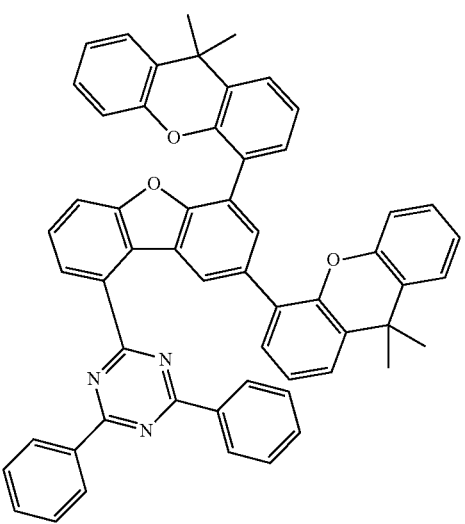

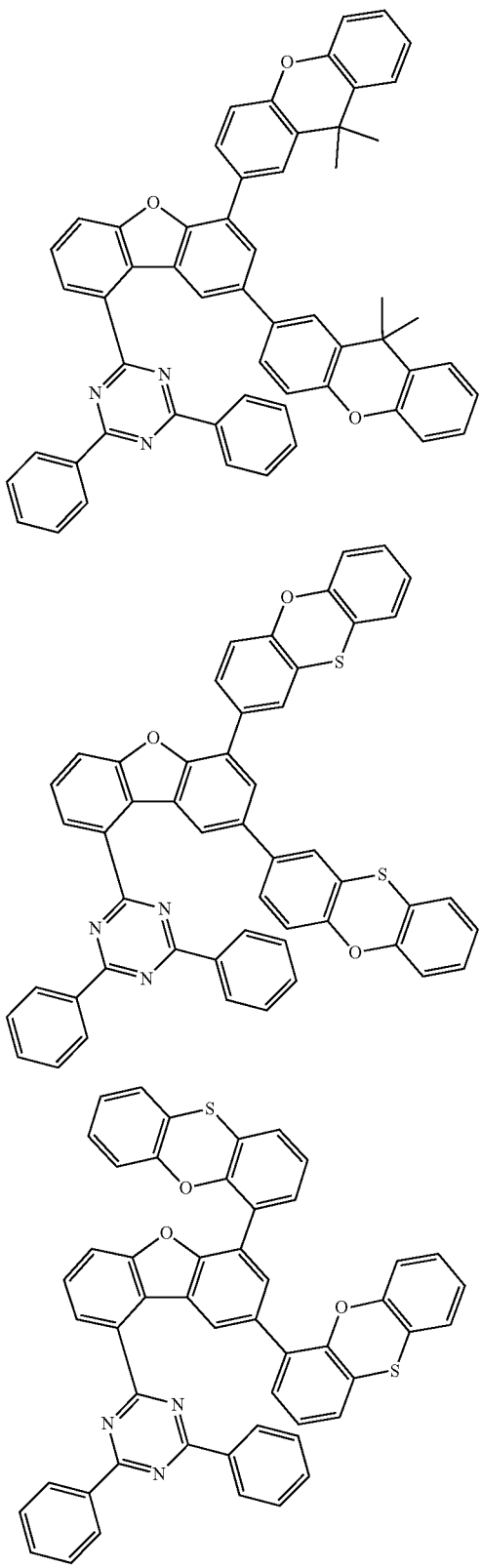

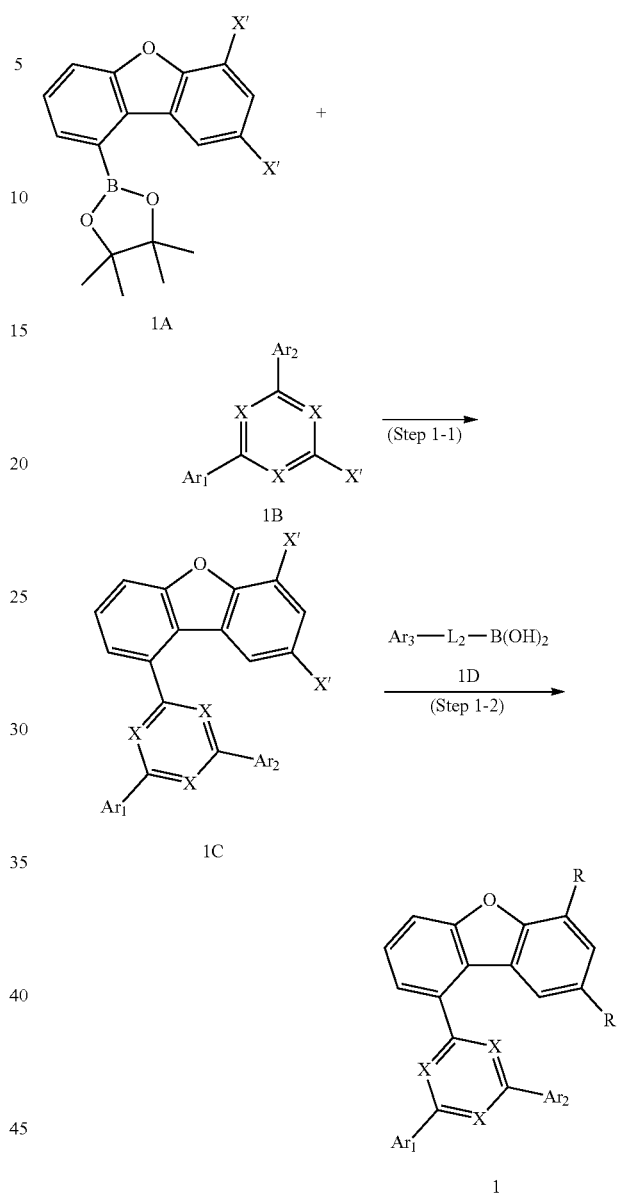

The compound represented by Chemical Formula 1 can be prepared according to the following Reaction Scheme 1.

Step 1-1 is a step of reacting the compound represented by Formula 1A and the compound represented by Formula 1B to prepare a compound represented by Formula 1C. The reaction is a Suzuki coupling reaction and is preferably carried out in the presence of a palladium catalyst and a base. The reactive group for the Suzuki coupling reaction can be changed as known in the art. In one example, X' is halogen, more preferably bromo or chloro.

Step 1-2 is a step of reacting the compound represented by Formula 1C and the compound represented by Formula 1D to prepare a compound represented by Formula 1. The reaction is a Suzuki coupling reaction and is preferably carried out in the presence of a palladium catalyst and a base. The reactive group for the Suzuki coupling reaction can be changed as known in the art. In one example, X' is halogen, more preferably bromo or chloro.

The above preparation method can be further specified in Preparation Examples to be described later.

In Chemical Formula 2, preferably, Y' is O, NR', C(CH$_3$)$_2$, or

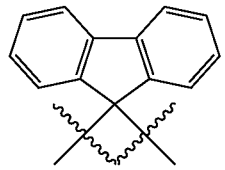

where R' is phenyl, cyano-substituted phenyl, biphenylyl, triphenylenyl, cyclohexyl, dimethylfluorenyl, or dibenzofuranyl.

Preferably, L' and L" are single bonds.

Preferably, R'$_1$ is phenyl, biphenylyl, terphenylyl, triphenylenyl, or phenanthrenyl.

Preferably, R'$_2$ and R'$_3$ are each independently hydrogen; phenyl; cyano-substituted phenyl; or pyridinyl.

Representative examples of the compound represented by Chemical Formula 2 are as follows:

-continued

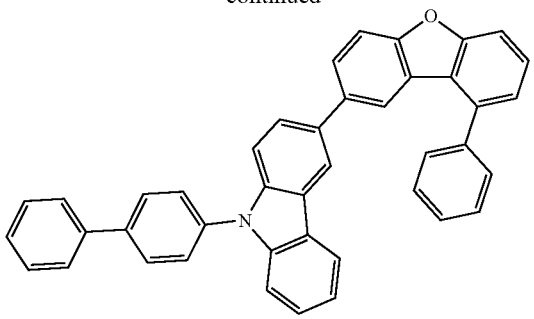

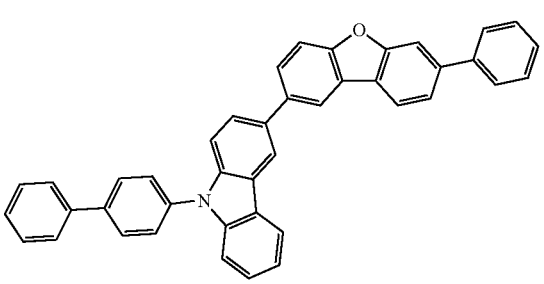

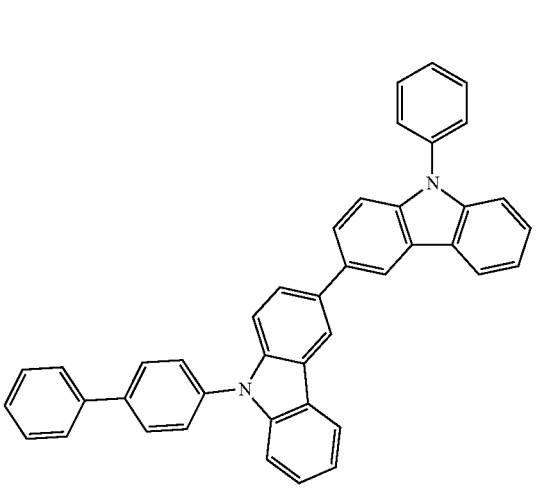

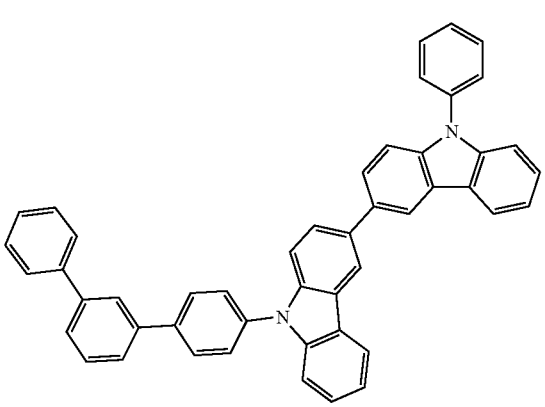

-continued
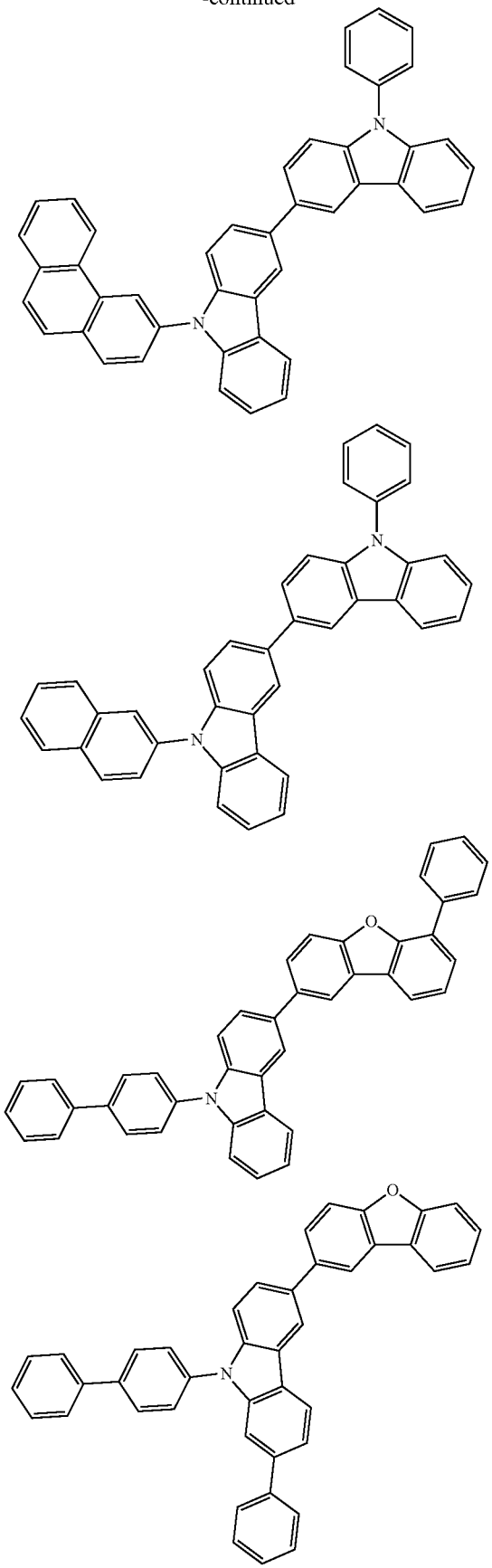
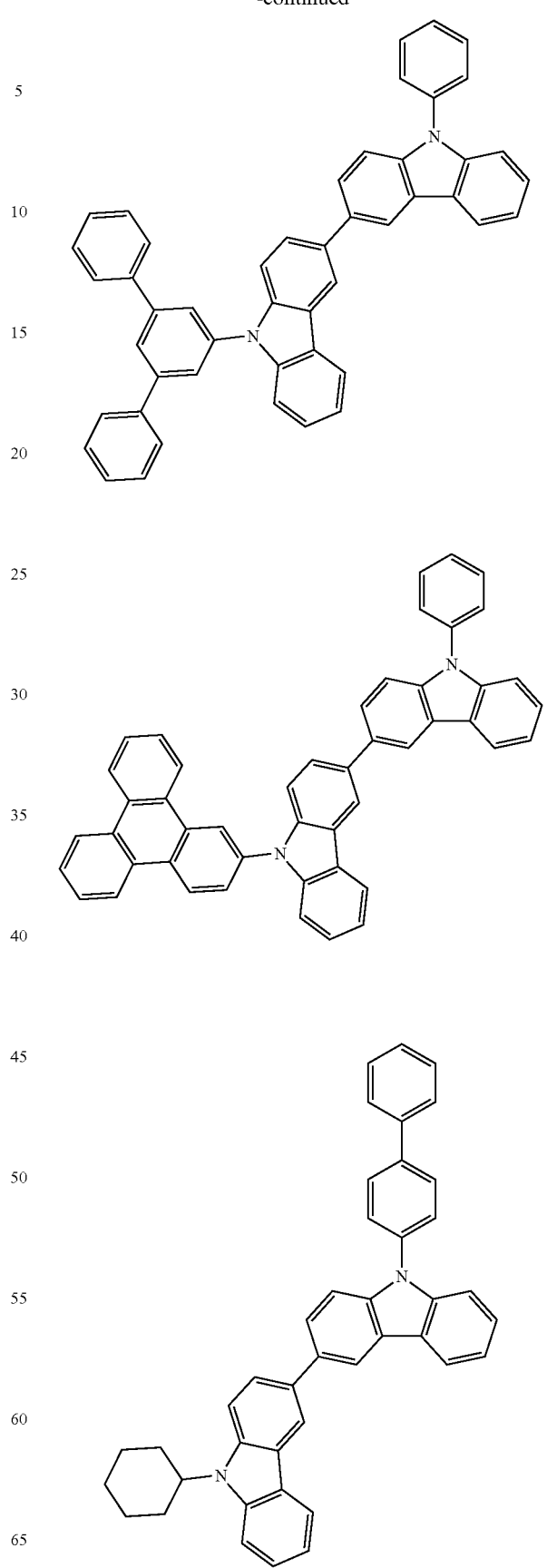

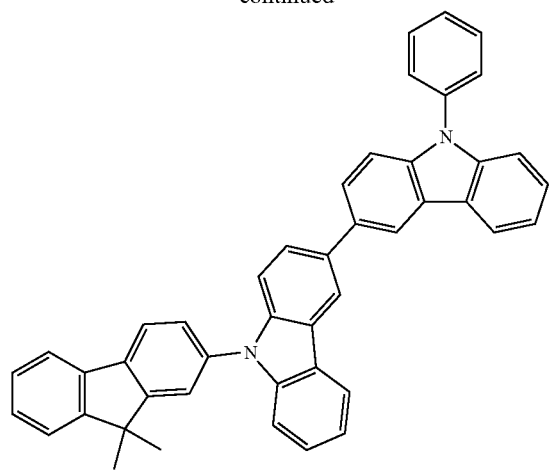
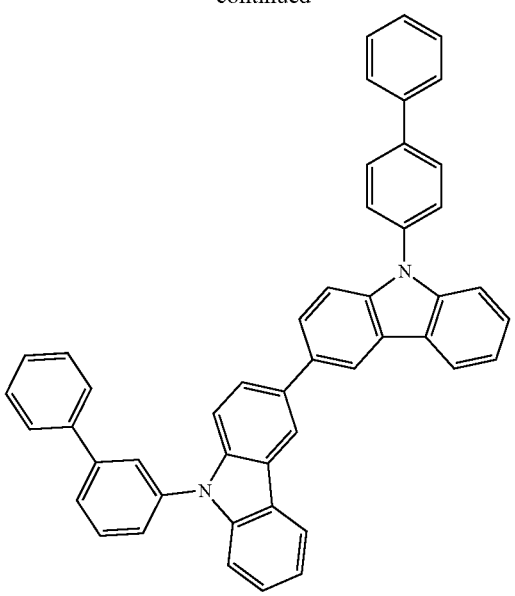
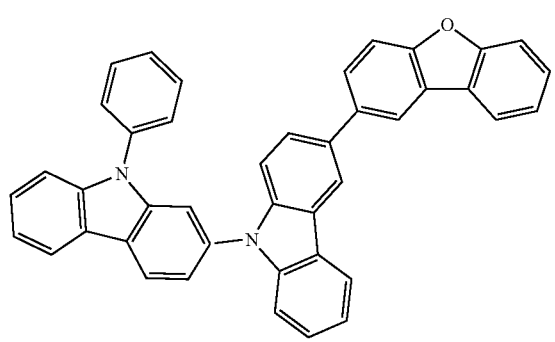
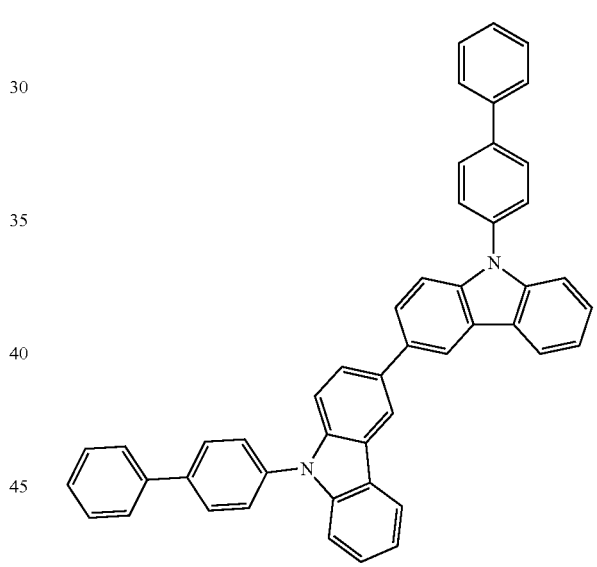
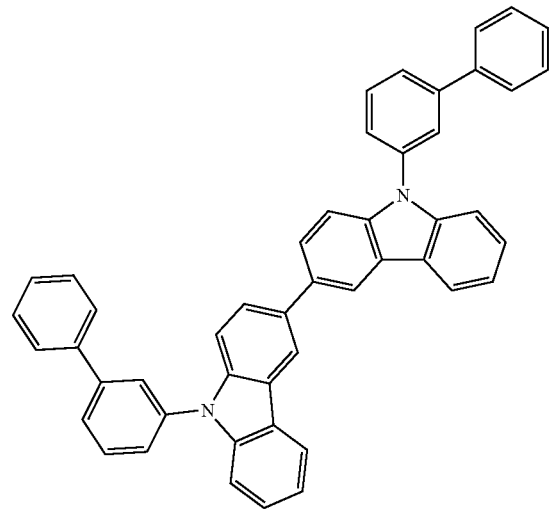
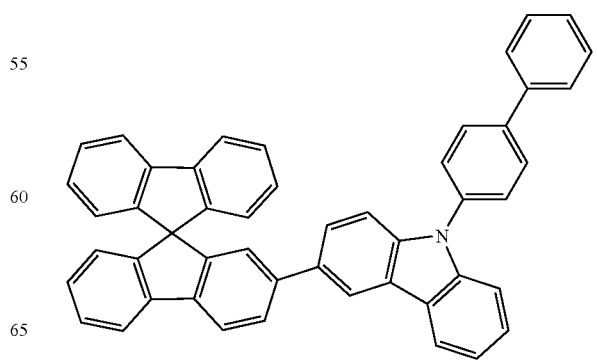

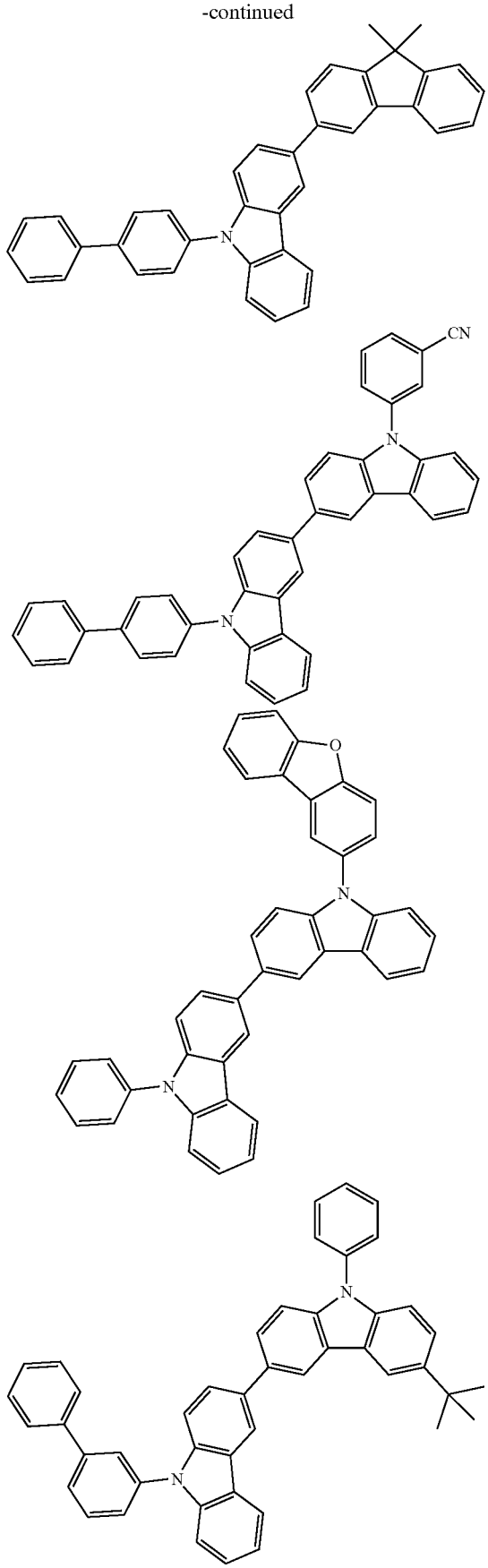
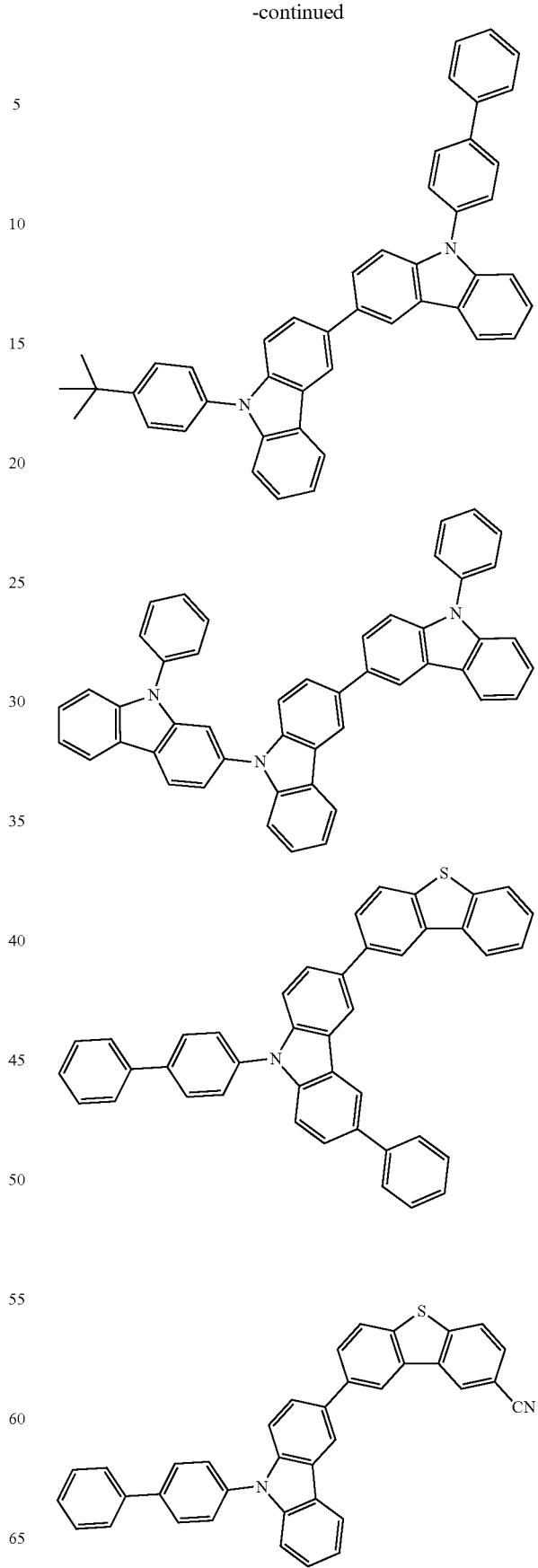

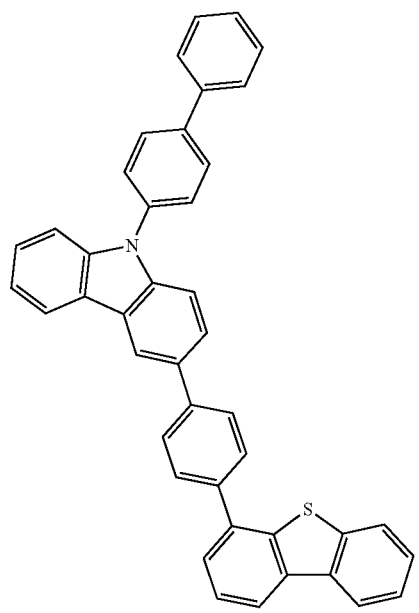
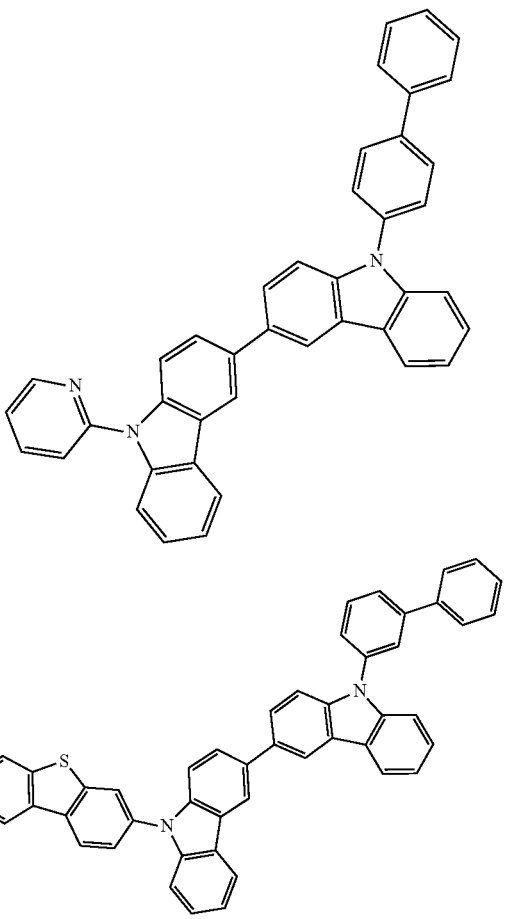
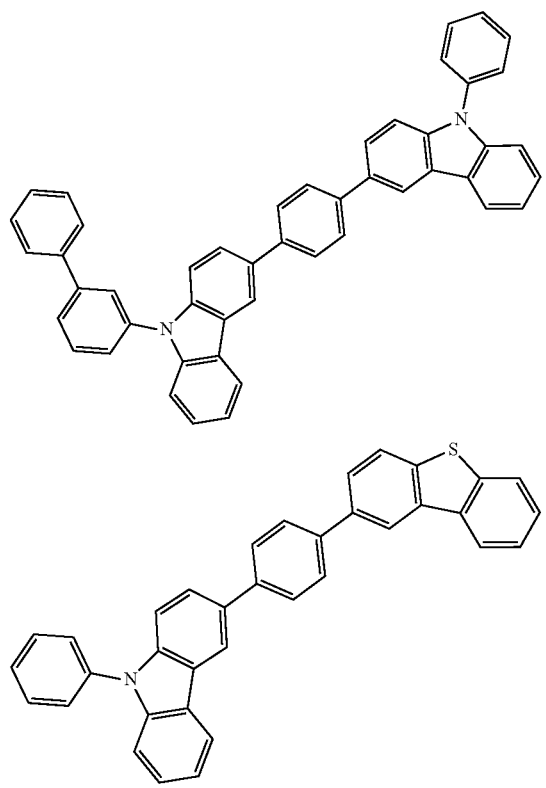

53
-continued
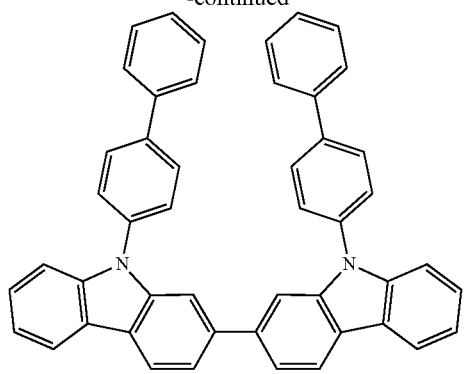
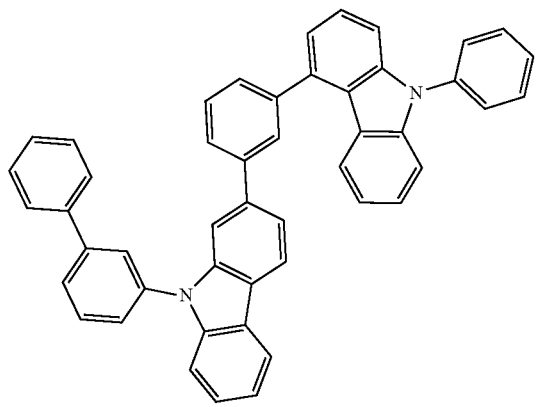
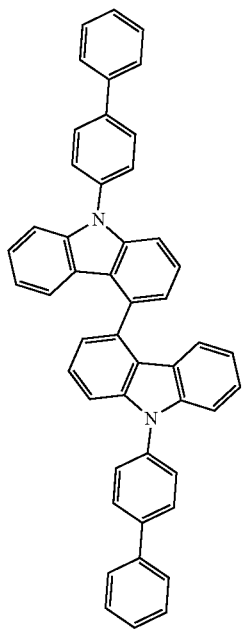
54
-continued
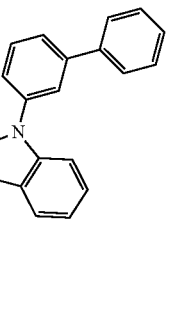
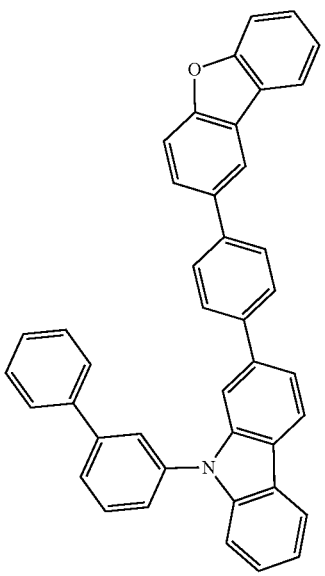
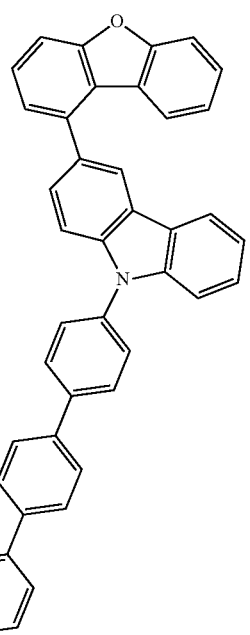

55
-continued
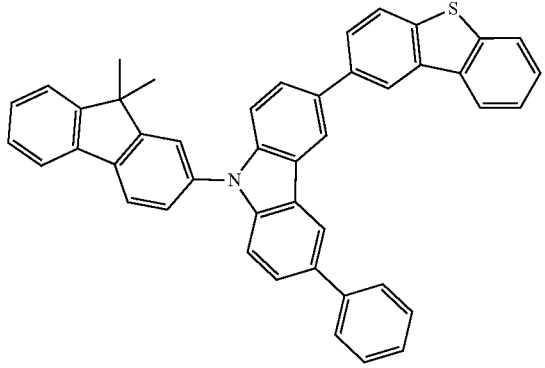
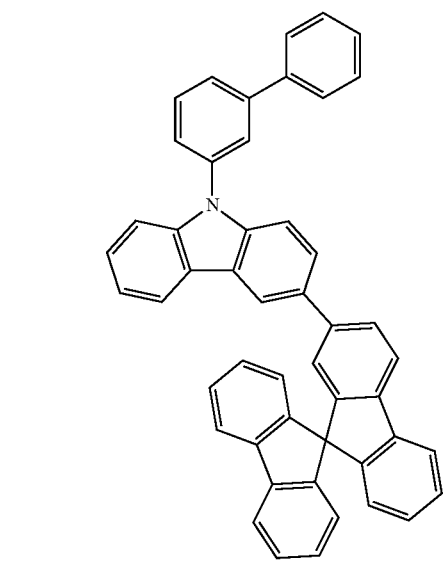
56
-continued
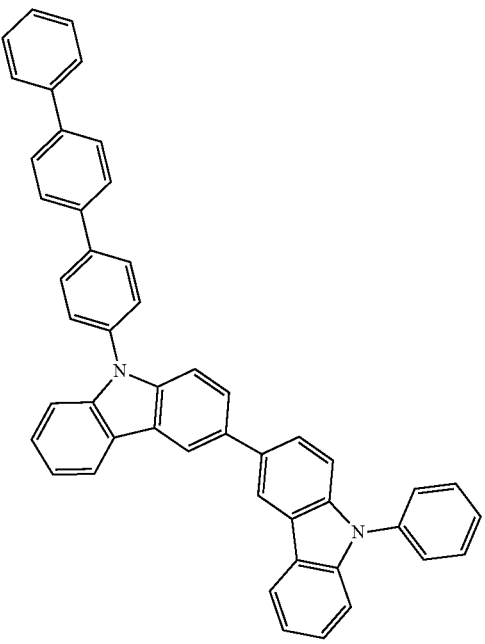
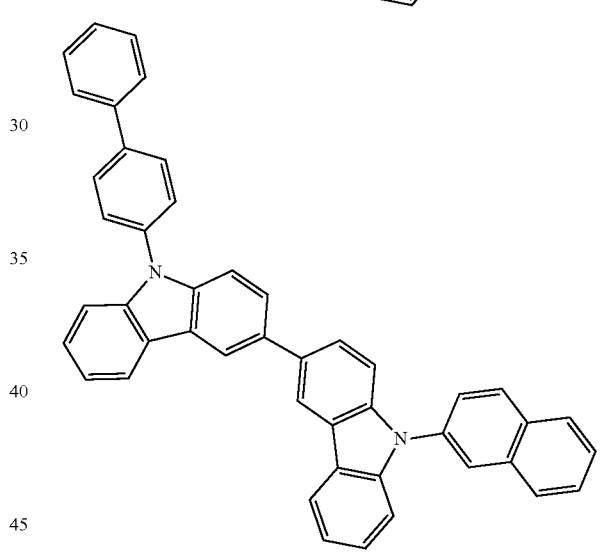
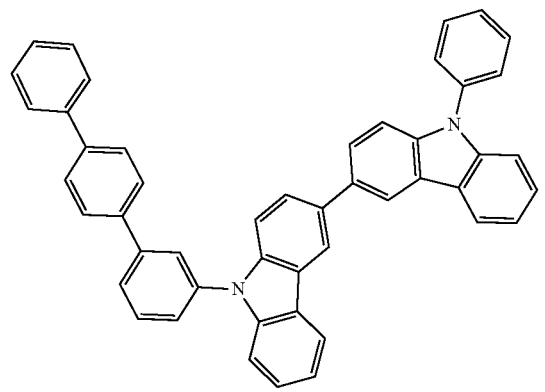
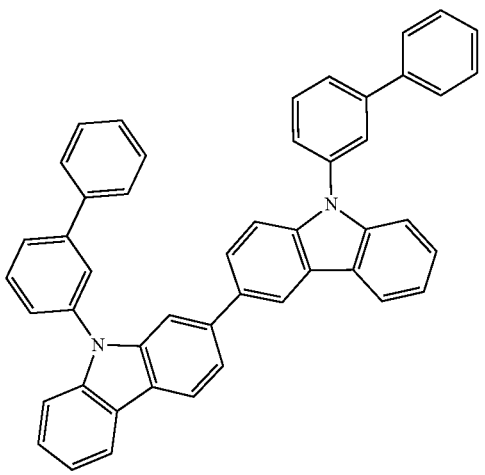

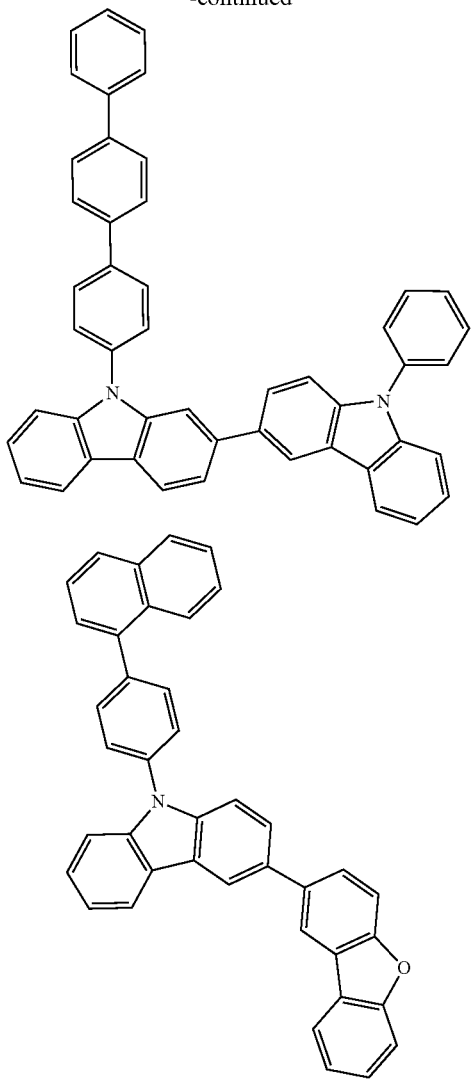

The compound represented by Chemical Formula 2 can be prepared according to the following Reaction Formula 2.

[Reaction Scheme 2]

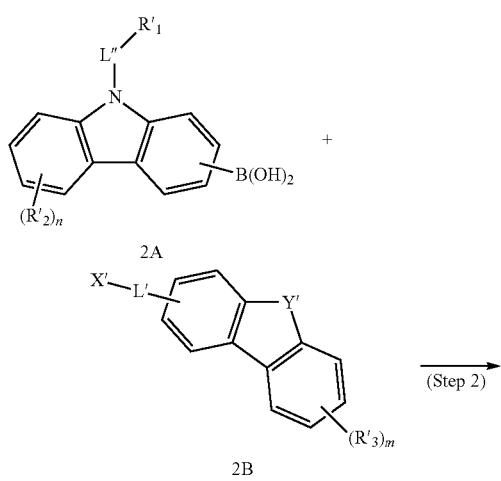

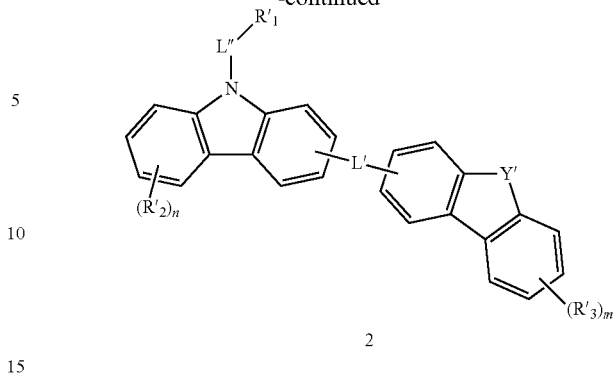

Step 2 is a step of reacting the compound represented by Formula 2A and the compound represented by Formula 2B to prepare a compound represented by Formula 2. The reaction is a Suzuki coupling reaction and is preferably carried out in the presence of a palladium catalyst and a base. The reactive group for the Suzuki coupling reaction can be changed as known in the art. In one example, X' is halogen, more preferably bromo or chloro.

The above preparation method can be further specified in Preparation Examples to be described later.

Preferably, the weight ratio between the first host compound and the second host compound is 1:99 to 99:1.

In addition, the light emitting layer may include a dopant material in addition to the host compound. The dopant material is not particularly limited as long as it is used for an organic light emitting device, and examples thereof include an aromatic amine derivative, a styrylamine compound, a boron complex, a fluoranthene compound, a metal complex, and the like.

Specifically, the aromatic amine derivative is a condensed aromatic cyclic derivative having a substituted or unsubstituted arylamino group, examples thereof include pyrene, anthracene, chrysene, and periflanthene having the arylamino group, and the like, the styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

Other Layers

In addition, the organic light emitting device according to the present invention may include a hole injection layer, a hole transport layer, an electron transfer layer, and/or an electron transmission layer, if necessary.

The hole injection layer is a layer injecting the holes from the electrode, and the hole injection material is preferably a compound which has an ability of transporting the holes, thus a hole injection effect in the anode and an excellent hole injection effect to the light emitting layer or the light emitting material, prevents movement of an exciton generated in the light emitting layer to the electron injection layer or the electron injection material, and has an excellent thin film forming ability. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline, polythiophene-based conductive polymer, and the like, but are not limited thereto.

The hole transport layer is a layer that can receive the holes from the anode or the hole injection layer and transport the holes to the light emitting layer. The hole transport material is suitably a material having large mobility to the holes, which may receive holes from the anode or the hole injection layer and transfer the holes to the light emitting layer. Specific examples thereof include an arylamine-based organic material, a conductive polymer, a block copolymer in which a conjugate portion and a non-conjugate portion are present together, and the like, but are not limited thereto.

The electron transport layer is a layer receiving the electrons from the electron injection layer or the cathode and transporting the electrons to the light emitting layer, the electron transport material is a material that can receive the electrons well from the cathode and transport the electrons to the light emitting layer, and a material having large mobility to the electrons is suitable. Specific examples thereof include an 8-hydroxyquinoline Al complex; a complex including $Alq_3$; an organic radical compound; a hydroxyflavone-metal complex, and the like, but are not limited thereto. The electron transport layer may be used together with a predetermined desired cathode material as used according to the prior art. Particularly, an example of an appropriate cathode material is a general material having the low work function and followed by an aluminum layer or a silver layer. Specific examples thereof include cesium, barium, calcium, ytterbium, and samarium, and each case is followed by the aluminum layer or the silver layer.

The electron injection layer is a layer injecting the electrons from the electrode, and a compound which has an ability of transporting the electrons, an electron injection effect from the cathode, and an excellent electron injection effect to the light emitting layer or the light emitting material, prevents movement of an exciton generated in the light emitting layer to the hole injection layer, and has an excellent thin film forming ability is preferable. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone, and the like, and its derivative, a metal complex compound, a nitrogen-containing 5-membered cyclic derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

The organic light emitting device according to the present invention can be manufactured by materials and methods known in the art, except that the light emitting layer includes a first host and a second host.

For example, the organic light emitting device according to the present invention may be manufactured by sequentially laminating the anode, the organic material layer and the cathode on the substrate. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming the organic material layer including the hole injection layer, the hole transport layer, the light emitting layer, and/or the electron transport layer thereon, and then depositing a material that can be used as the cathode thereon. In addition to such a method, the organic light emitting device may be manufactured by sequentially depositing a cathode material, the organic material layer, and an anode material on the substrate.

Further, the first host compound and the second host compound may be formed as the light emitting layer by a vacuum deposition method as well as a solution coating method during the production of the organic light emitting device. The solution coating method as used herein means spin coating, dip coating, doctor blading, inkjet printing, screen printing, spray method, roll coating, or the like, but is not limited thereto.

In addition to such a method, the organic light emitting device may be manufactured by sequentially depositing an anode material, an organic material layer, and a cathode material on a substrate (International Publication WO 2003/012890). However, the manufacturing method is not limited thereto.

The organic light emitting device according to the present invention may be a front side light emitting type, a rear side light emitting type, or a double side light emitting type depending on the material used.

The preparation of the above-mentioned organic light emitting device will be described in detail in the following examples. However, these examples are presented for illustrative purposes only, and the scope of the present invention is not limited thereto.

[Preparation Example] Preparation of Intermediate Compound A

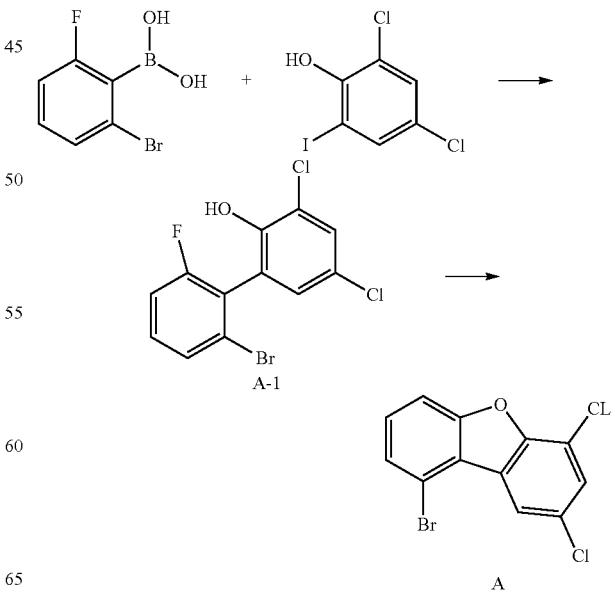

1) Preparation of Compound A-1

2-Bromo-6-fluorophenyl)boronic acid (30.0 g, 137 mmol) and 2,4-dichloro-6-iodophenol (43.6 g, 150 mmol) were added to 400 mL of tetrahydrofuran under a nitrogen atmosphere, and the mixture was stirred and refluxed. Then, potassium carbonate (56.8 g, 411 mmol) was dissolved in 150 mL of water and added. The mixture was stirred and tetrakis triphenylphosphine palladium (4.8 g, 1 mol %) was added thereto. After reaction for 12 hours, the temperature of the mixture was lowered to room temperature, and the organic and aqueous layers were separated. Then, the organic layer was distilled under reduced pressure. The concentrated compound was extracted with chloroform and water, and then the organic layer was dried over magnesium sulfate. Subsequently, the organic layer was dried, and column chromatography was performed with hexane and ethyl acetate to produce Compound A-1 (23.5 g, yield 51%).

2) Preparation of Compound A

Compound A-1 (23.5 g, 70 mmol) was added to 200 mL of dimethylformamide under a nitrogen atmosphere and stirred. Potassium carbonate (19.3 g, 140 mmol) was then added and refluxed. After 2 hours, the reaction mixture was cooled to room temperature and filtrated. The filtrate was extracted with chloroform and water, and the organic layer was dried over anhydrous magnesium sulfate. Subsequently, the organic layer was distilled under reduced pressure and then recrystallized using ethyl acetate. The resulting solid was filtered and then dried to produce Compound A (18 g, yield 81%).

MS: [M+H]$^+$=314

Example 1

1) Preparation of Compound 1

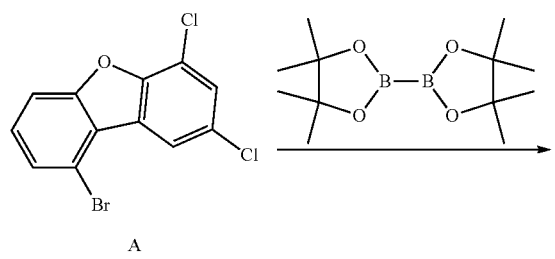

A

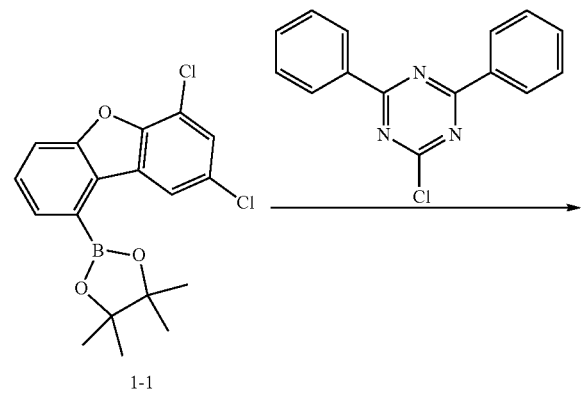

1-1

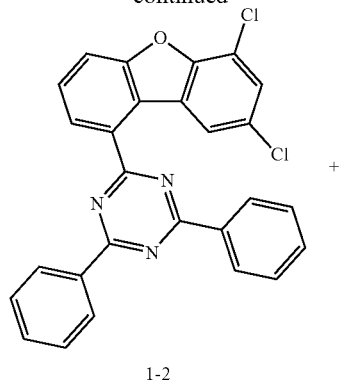

1-2

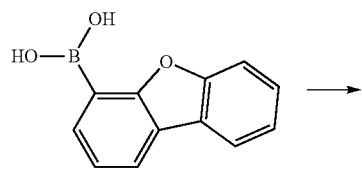

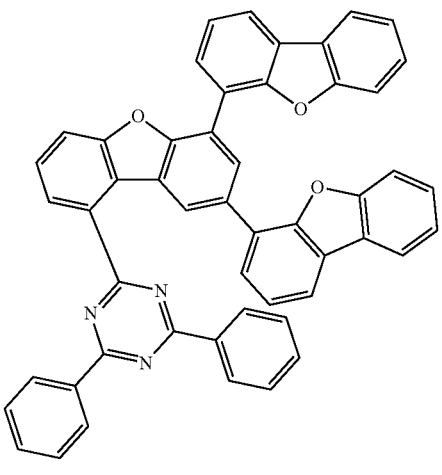

1 a) Preparation of Compound 1-1

Intermediate A (15.0 g, 48 mmol) and potassium acetate (14 g, 142 mmol) were mixed under a nitrogen atmosphere. The mixture was added to 150 mL of 1,4-dioxane and heated with stirring. Bis(dibenzylidineacetone)palladium (0.8 g, 3 mol %) and tricyclohexylphosphine (0.8 g, 6 mol %) were added under reflux, and then stirred under heating for 3 hours. After completion of the reaction, the reaction solution was cooled to room temperature and then filtered. The filtrate was poured into water, extracted with chloroform, and the organic layer was dried over anhydrous magnesium sulfate. The resulting material was distilled under reduced pressure and then recrystallized from ethanol to produce Compound 1-1 (15.7 g, yield 91%).

b) Preparation of Compound 1-2

Intermediate 1-1 (15.7 g, 50 mmol) and 2-chloro-4,6-diphenyl-1,3,5-triazine (14.6 g, 55 mmol) were added to 200 mL of tetrahydrofuran under a nitrogen atmosphere, and the mixture was stirred and refluxed. Then, potassium carbonate (20.6 g, 149 mmol) was dissolved in 60 mL of water and added thereto. The mixture was then sufficiently stirred, and then tetrakis triphenylphosphine palladium (1.7 g, 1 mol %) was added thereto. After reaction for 18 hours, the reaction solution was cooled to room temperature and filtered. The filtrate was extracted with chloroform and water, and the organic layer was dried over anhydrous magnesium sulfate. Subsequently, the organic layer was concentrated under reduced pressure and then recrystallized using ethyl acetate. The resulting solid was filtered and then dried to produce Compound 1-2 (17.9 g, yield 77%).

c) Preparation of Compound 1

Intermediate 1-2 (10.0 g, 21 mmol) and dibenzo[b,d]furan-4-ylboronic acid (10.0 g, 47 mmol) were added to 200 mL of tetrahydrofuran under a nitrogen atmosphere, and the mixture was stirred and refluxed. Then, potassium phosphate (27.2 g, 128 mmol) was dissolved in 60 mL of water and added thereto. The mixture was then sufficiently stirred, and bis(dibenzylidineacetone)palladium (0.7 g, 1 mol %) and tricyclohexylphosphine (0.7 g, 2.6 mmol) were added thereto. After reaction for 24 hours, the reaction solution was cooled to room temperature and filtered. The filtrate was extracted with chloroform and water. The organic layer was stirred by addition of anhydrous magnesium sulfate, filtered, and concentrated under reduced pressure. The concentrated compound was recrystallized by adding chloroform and ethyl acetate. The resulting solid was filtered and then dried to produce Compound 1 (7 g, yield: 45%).

MS:[M+H]$^+$=732

2) Preparation of Compound 2

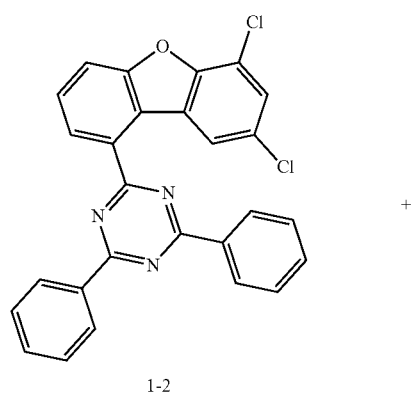

1-2

+

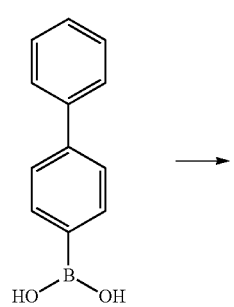

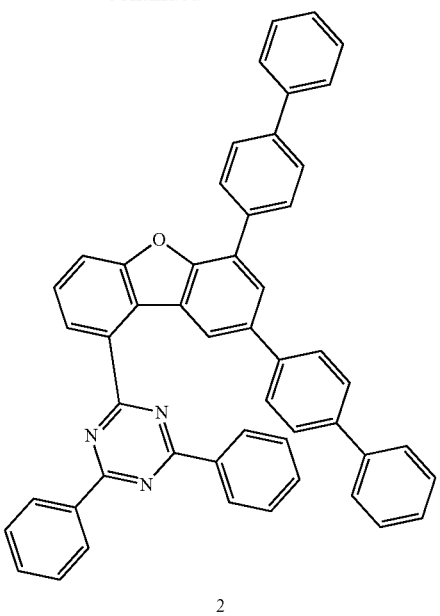

2

Compound 2 (13 g, yield 78%) was prepared in the same manner as in the Preparation of Compound 1 except for that Intermediate 1-2 and 1,1'-biphenyl-4-ylboronic acid were used.

MS: [M+H]$^+$=704

3) Preparation of Compound 3

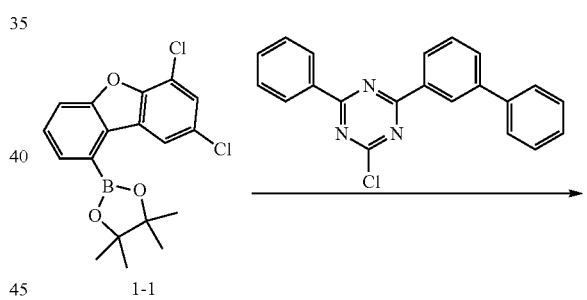

1-1

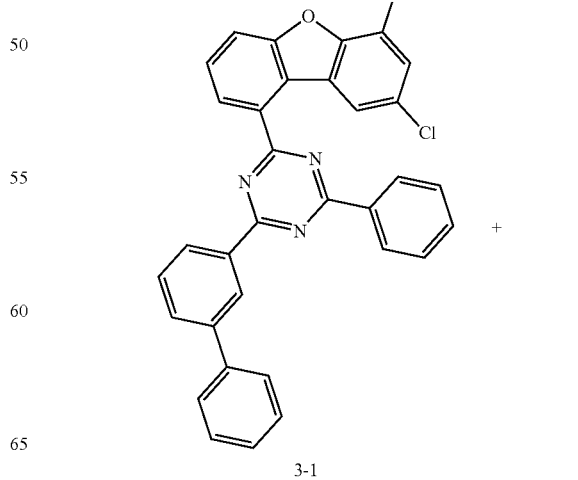

3-1

+

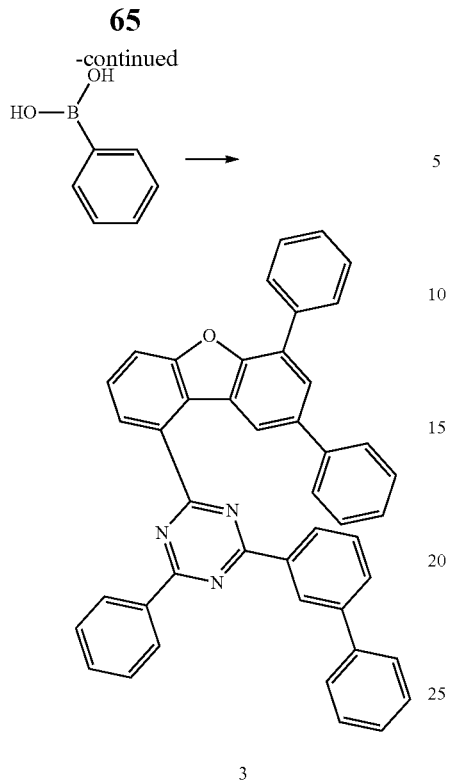

3

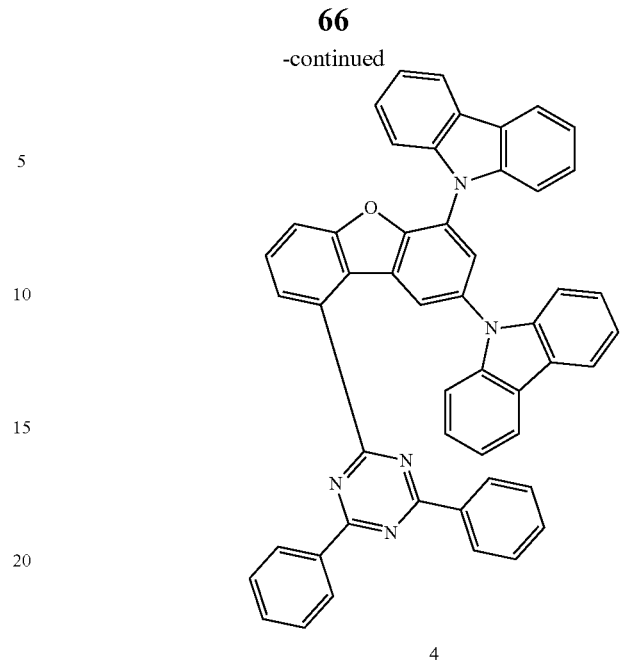

4 a) Preparation of Compound 3-1

Compound 3-1 (22.8 g, yield 76%) was prepared in the same manner as in the Preparation of Compound 1-2 except for that Intermediate 1-1 (20 g, 55 mmol) and 2-(1,1'-biphenyl-3-yl)-4-chloro-6-phenyl-1,3,5-triazine (19.0 g, 55 mmol) were used.

b) Preparation of compound 3

Compound 3 (23.6 g, yield 82%) was prepared in the same manner as in the Preparation of Compound 1 except for that Intermediate 3-1 (20 g, 46 mmol) and phenylboronic acid (12.3 g, 101 mmol) were used.

MS:[M+H]$^+$=628

4) Preparation of Compound 4

Intermediate 1-2 (15.0 g, 32 mmol) and 9H-carbazole (11.8 g, 70 mmol) were added to 100 mL of xylene under a nitrogen atmosphere, and the mixture was stirred and refluxed. Then, sodium tert-butoxide (6.2 g, 64 mmol) was added thereto and then sufficiently stirred. Then, bis(tri-tert-butylphosphine) palladium (0) (160 mg, 1 mol %) was added thereto. After reaction for 24 hours, the reaction solution was cooled to room temperature and filtered. The filtrate was extracted with chloroform and water. The organic layer was dried over anhydrous magnesium sulfate. Subsequently, the organic layer was concentrated under reduced pressure and recrystallized with toluene to produce Compound 4 (16.6 g, yield 71%).

MS:[M+H]$^+$=730

5) Preparation of Compound 5

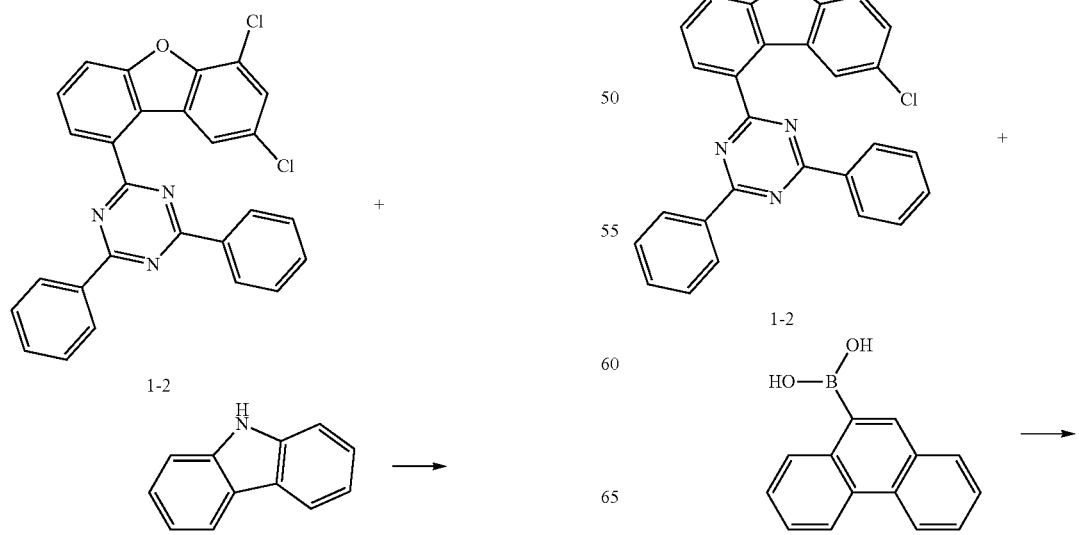

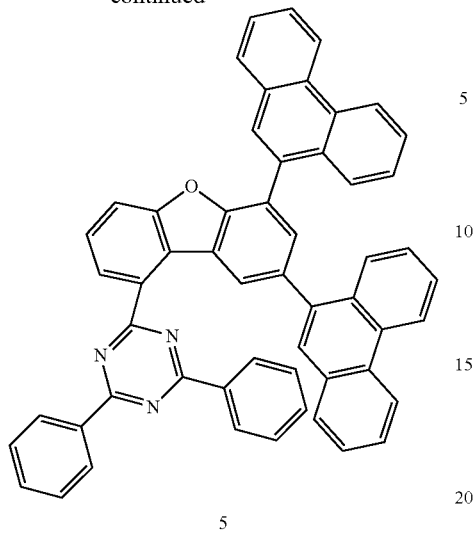

5

Intermediate 1-2 (10.0 g, 21 mmol) and phenanthrene-9-ylboronic acid (10.4 g, 47 mmol) were added to tetrahydrofuran (200 mL) under a nitrogen atmosphere, and the mixture was stirred and refluxed. Then, potassium phosphate (27.2 g, 128 mmol) was dissolved in 60 mL of water and added thereto. The mixture was then sufficiently stirred and bis(dibenzylidineacetone)palladium (0.7 g, 1 mol %) and tricyclohexylphosphine (0.7 g, 2.6 mmol) were added thereto. After reaction for 24 hours, the reaction solution was cooled to room temperature and filtered. The filtrate was extracted with chloroform and water. The organic layer was dried over anhydrous magnesium sulfate. Subsequently, the organic layer was concentrated under reduced pressure and recrystallized using ethyl acetate. The resulting solid was filtered and then dried to produce Compound 5 (12.6 g, yield 81%).

MS:[M+H]$^+$=752

6) Preparation of Compound 6

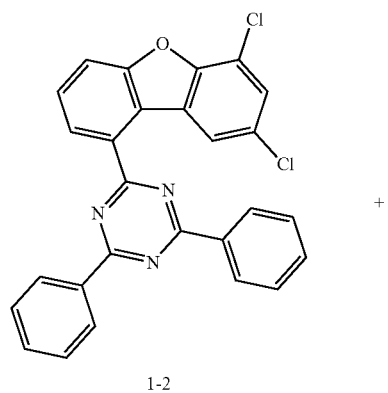

1-2

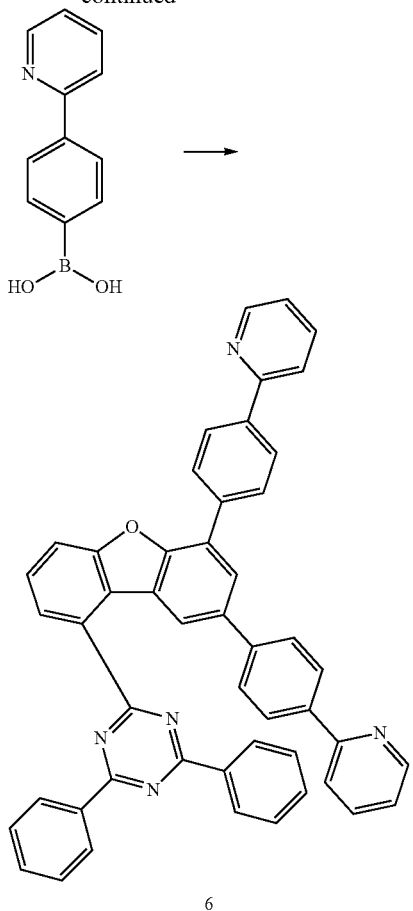

6

Compound 6 (16.9 g, yield 75%) was prepared in the same manner as in the Preparation of Compound 1-2, except for that Intermediate 1-2 (15 g, 32 mmol) and (4-(pyridin-2-yl)phenyl)boronic acid (14.0 g, 70.5 mmol) were used.

MS:[M+H]$^+$=706

7) Preparation of Compound 7

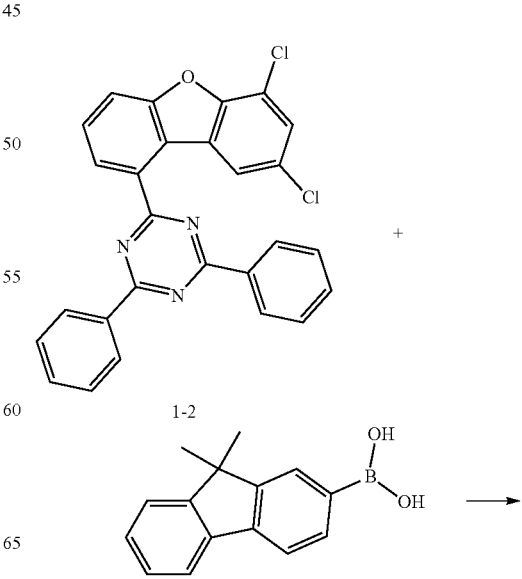

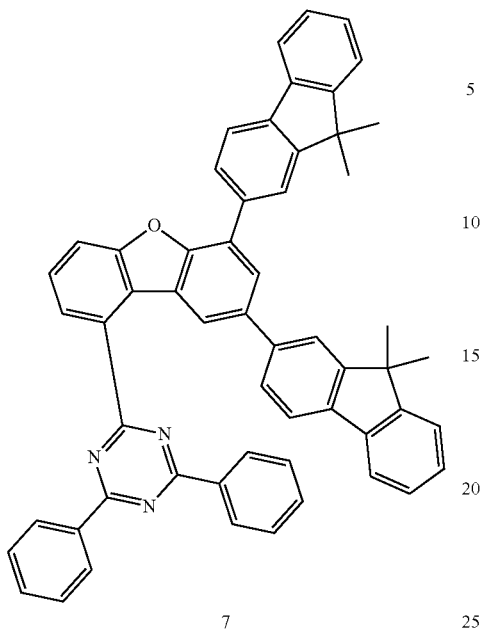

7

Compound 7 (18.3 g, yield 73%) was prepared in the same manner as in the Preparation of Compound 1-2, except for that Intermediate 1-2 (15 g, 32 mmol) and (9,9-dimethyl-9H-fluoren-2-yl)boronic acid (16.8 g, 70.5 mmol) were used.

MS:[M+H]⁺=784

8) Preparation of Compound 8

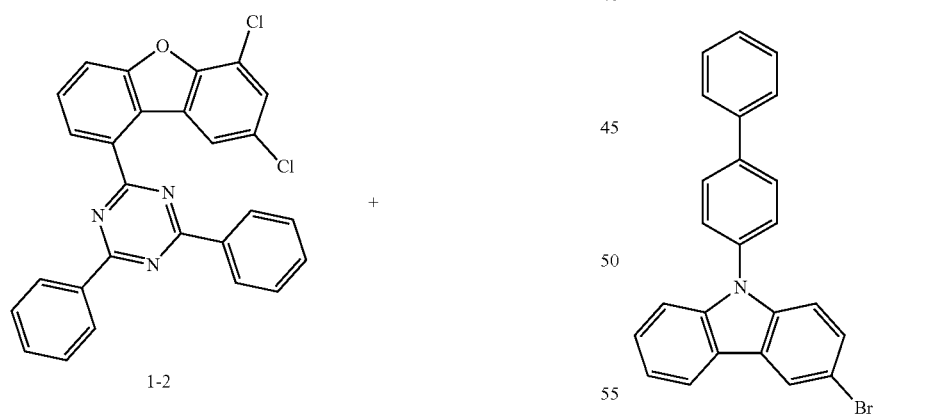

1-2

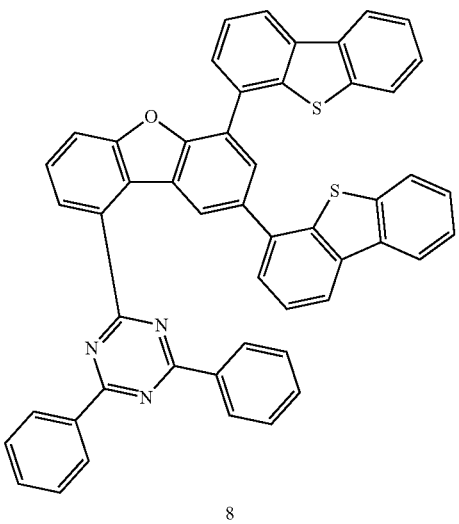

8

Compound 8 (18.3 g, yield 75%) was prepared in the same manner as in the Preparation of Compound 1-2, except for that Intermediate 1-2 (15 g, 32 mmol) and dibenzo[b,d]thiophen-4-ylboronic acid (16.0 g, 70.5 mmol) were used.

MS:[M+H]⁺=764

Example 2

1) Preparation of Compound 2-1

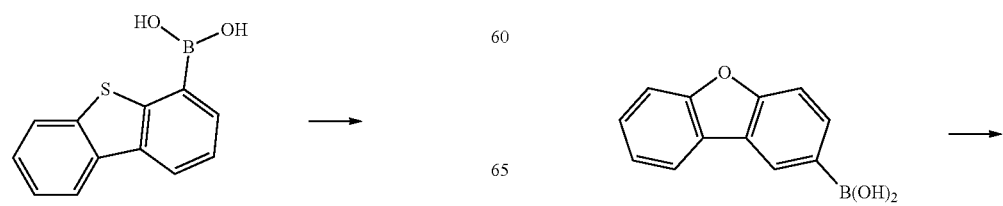

-continued

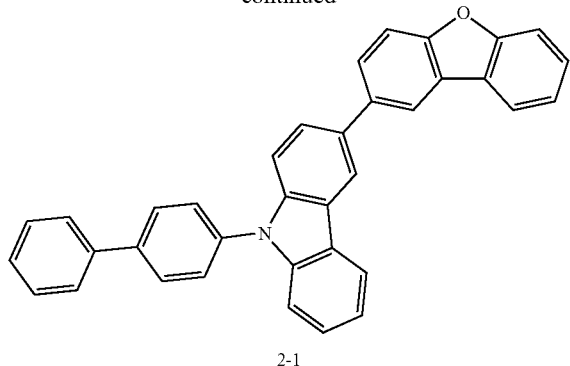

2-1

9-(1,1'-biphenyl)-4-yl)-3-bromo-9H-carbazole (15 g, 27 mmol) and dibenzo[b,d]furan-2-ylboronic acid (5.7 g, 27 mmol) were dispersed in 80 mL of tetrahydrofuran, and 2 M aqueous potassium carbonate solution (40 mL, 81 mmol) was added and tetrakis triphenylphosphine palladium (0.3 g, 1 mol %) was added thereto. The mixture was then stirred and refluxed for 6 hours. The temperature of the mixture was lowered to room temperature, the aqueous layer was removed and concentrated under reduced pressure, to which ethyl acetate was added and stirred under reflux for 1 hour. The mixture was cooled to room temperature and the solid was filtered. Chloroform was added to the resulting solid, dissolved under reflux, and recrystallized by adding ethyl acetate to produce Compound 2-1 (11.5 g, yield 73%).

MS:[M+H]$^+$=486

2) Preparation of Compound 2-2

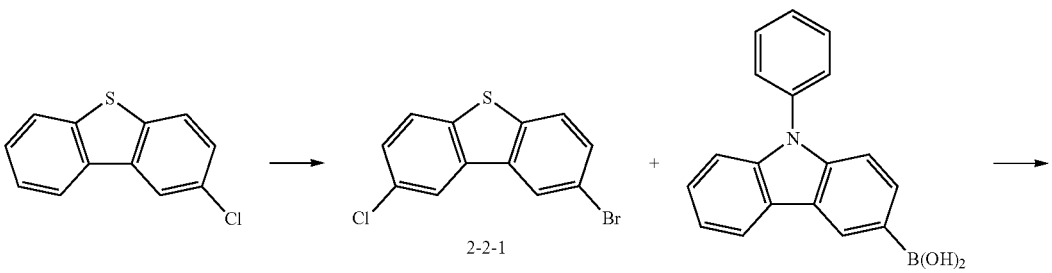

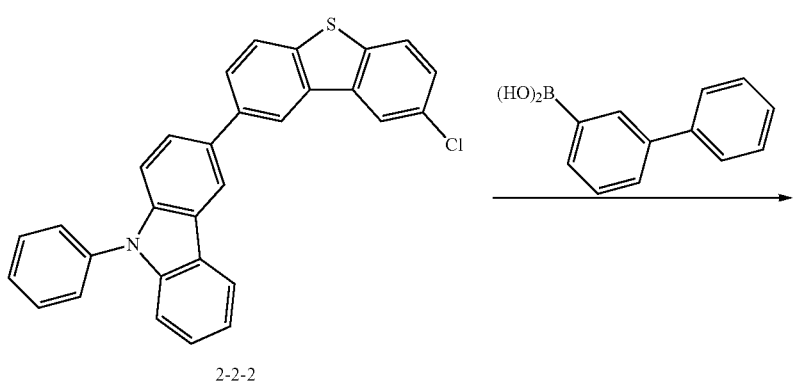

2-2-2

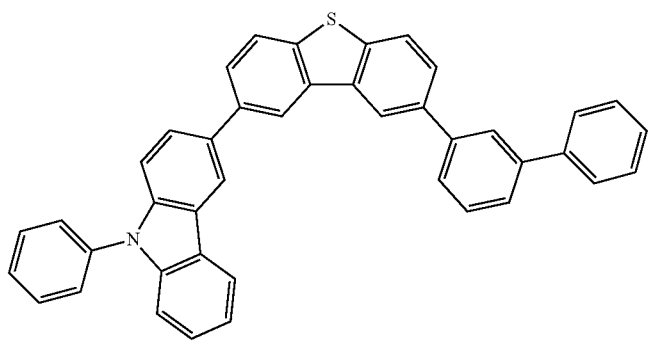

2-2 a) Preparation of Compound 2-2-1

2-Chlorodibenzo[b,d]thiophene (22 g, 101 mmol) was dissolved in 50 mL of chloroform, cooled down to 0° C., and $Br_2$ solution (5.5 mL, 108 mmol) was slowly added dropwise. After the reaction was completed by stirring for 3 hours, an aqueous sodium bicarbonate solution was added and stirred. The aqueous layer was separated and the organic layer was collected, dried over anhydrous magnesium sulfate, filtered and concentrated under reduced pressure. The concentrated compound was isolated through a column purification to produce Compound 2-2-1 (10 g, yield 49%).

b) Preparation of compound 2-2-2

Compound 2-2-1 (15 g, 50 mmol) and (9-phenyl-9H-carbazol-3-yl)boronic acid (15.2 g, 53 mmol) were dispersed in 200 mL of tetrahydrofuran, and 2 M aqueous potassium carbonate solution (75 mL, 151 mmol) was added and tetrakis triphenylphosphine palladium (0.6 g, 1 mol %) was added thereto. The mixture was then stirred and refluxed for 6 hours. The temperature of the mixture was lowered to room temperature, the aqueous layer was removed and concentrated under reduced pressure. Ethyl acetate was added and stirred for 3 hours, and the precipitated solid was filtered. The resulting solid was further stirred with a mixture of chloroform and ethanol, and then filtered to produce Compound 2-2-2 (18.8 g, yield 81%).

c) Preparation of compound 2-2

Compound 2-2-2 (17 g, 37 mmol) and 1,1'-biphenyl-3-ylboronic acid (8.7 g, 43.5 mmol) were dispersed in 160 mL of tetrahydrofuran, and 2 M aqueous potassium carbonate solution (65 mL, 111 mmol) was added and tetrakis triphenylphosphine palladium (0.4 g, 1 mol %) was added thereto. The mixture was then stirred and refluxed for 6 hours. The temperature of the mixture was lowered to room temperature, the aqueous layer was removed and concentrated under reduced pressure. The concentrated compound was dissolved in 300 mL of chloroform, washed with water and separated. The organic layer was treated with anhydrous magnesium sulfate and filtered. The filtrate was heated to remove almost a half thereof under reflux. 100 mL of ethyl acetate was added and recrystallized to produce Compound 2-2 (14.2 g, yield 73%).

MS:[M+H]$^+$=527

3) Preparation of Compound 2-3

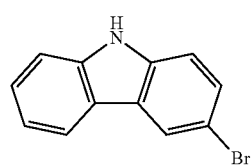

+

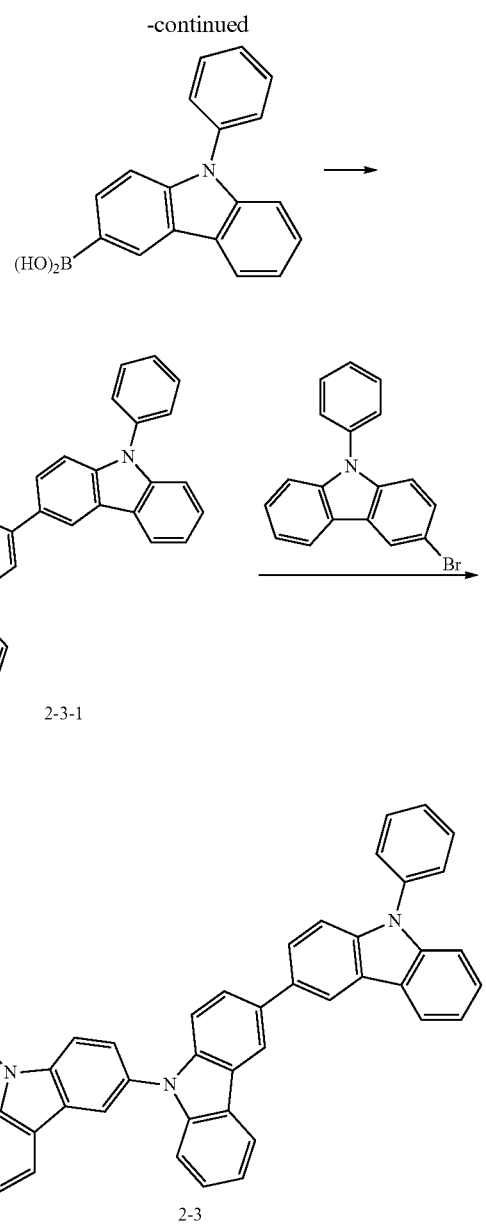

a) Preparation of Compound 2-3-1

Compound 2-3-1 (20.2 g, yield 81%) was prepared in the same manner as in the Preparation of Compound 2-1, except that 3-bromo-9H-carbazole (15 g, 61 mmol) and (9-phenyl-9H-carbazol-3-yl)boronic acid (18.4 g, 64 mmol) were used.

b) Preparation of Compound 2-3

Compound 2-3-1 (12 g, 30 mmol) and 3-bromo-9-phenyl-9H-carbazole (9.5 g, 30 mmol) were added to 150 mL of toluene and dissolved to which sodium tert-butoxide (5.6 g, 59 mmol) was added and heated. Bis(tri-tert-butylphosphine)palladium (0.15 g, 1 mol %) was added thereto, and the mixture was stirred under reflux for 12 hours. When the reaction was completed, the temperature of the mixture was lowered to room temperature and the resulting solid was filtered. The pale yellow solid was dissolved in chloroform, washed twice with water, and the organic layer was separated. Anhydrous magnesium sulfate and acidic white clay were added, stirred, filtered and distilled under reduced pressure. Recrystallization was performed using chloroform and ethyl acetate to prepare a white solid compound of Chemical Formula 2-3 (14.5 g, yield 76%).

MS: [M+H]⁺=650

4) Preparation of Compound 2-4

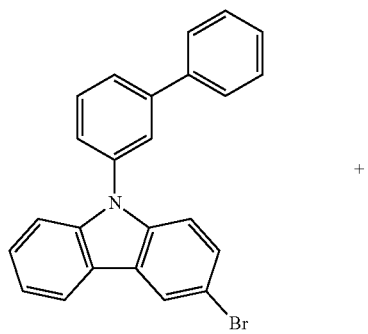

+

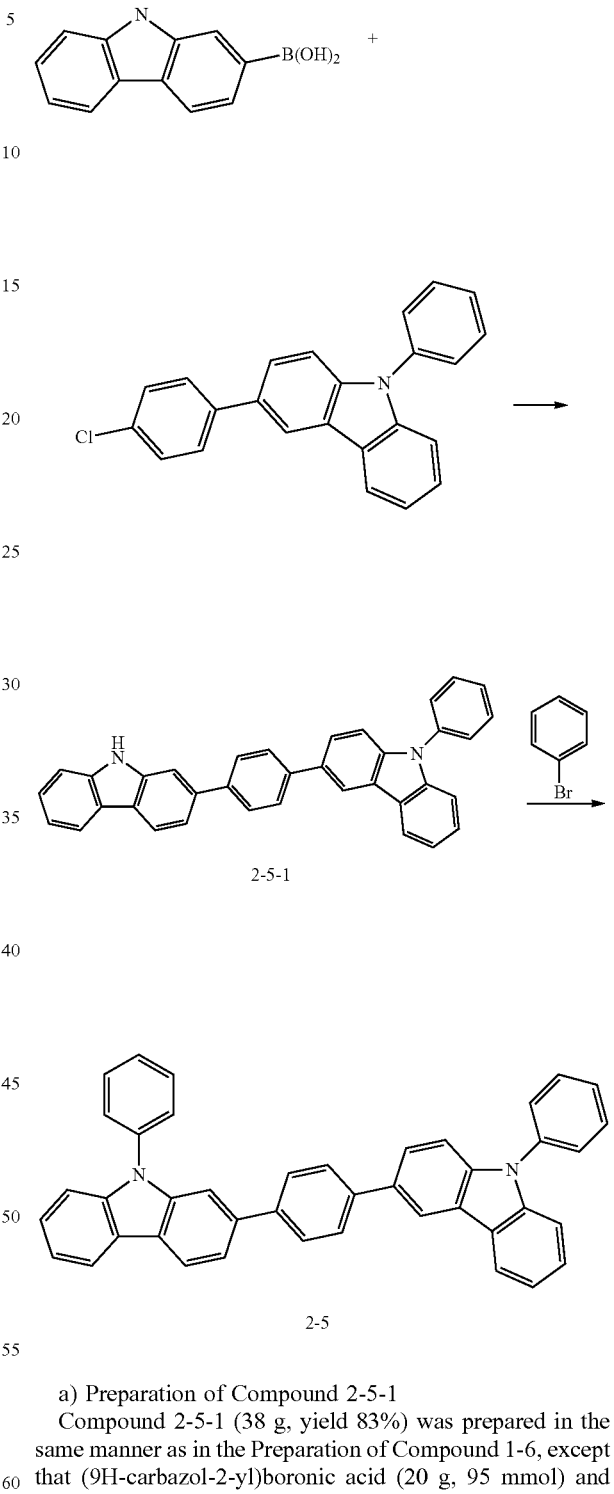

a) Preparation of Compound 2-5-1

Compound 2-5-1 (38 g, yield 83%) was prepared in the same manner as in the Preparation of Compound 1-6, except that (9H-carbazol-2-yl)boronic acid (20 g, 95 mmol) and 3-(4-chlorophenyl)-9-phenyl-9H-carbazole (33.5 g, 95 mmol) were used.

b) Preparation of Compound 2-5

Compound 2-5 (13.1 g, yield 76%) was prepared in the same manner as in the Preparation of Compound 2-3, except that Compound 2-5-1 (15 g, 31 mmol) and bromobenzene (4.90 g, 31 mmol) were used.

Compound 2-4 (19.7 g, yield 77%) was prepared in the same manner as in the Preparation of Compound 2-1, except that 9-(1,1'-biphenyl-3-yl)-3-bromo-9H-carbazole (16 g, 40 mmol) and 9-(1,1'-biphenyl-3-yl)-9H-carbazol-3-yl)boronic acid (14.6 g, 40 mmol) were used.

MS:[M+H]⁺=637

5) Preparation of Compound 2-5

MS: [M+H]⁺=561

6) Preparation of Compound 2-6

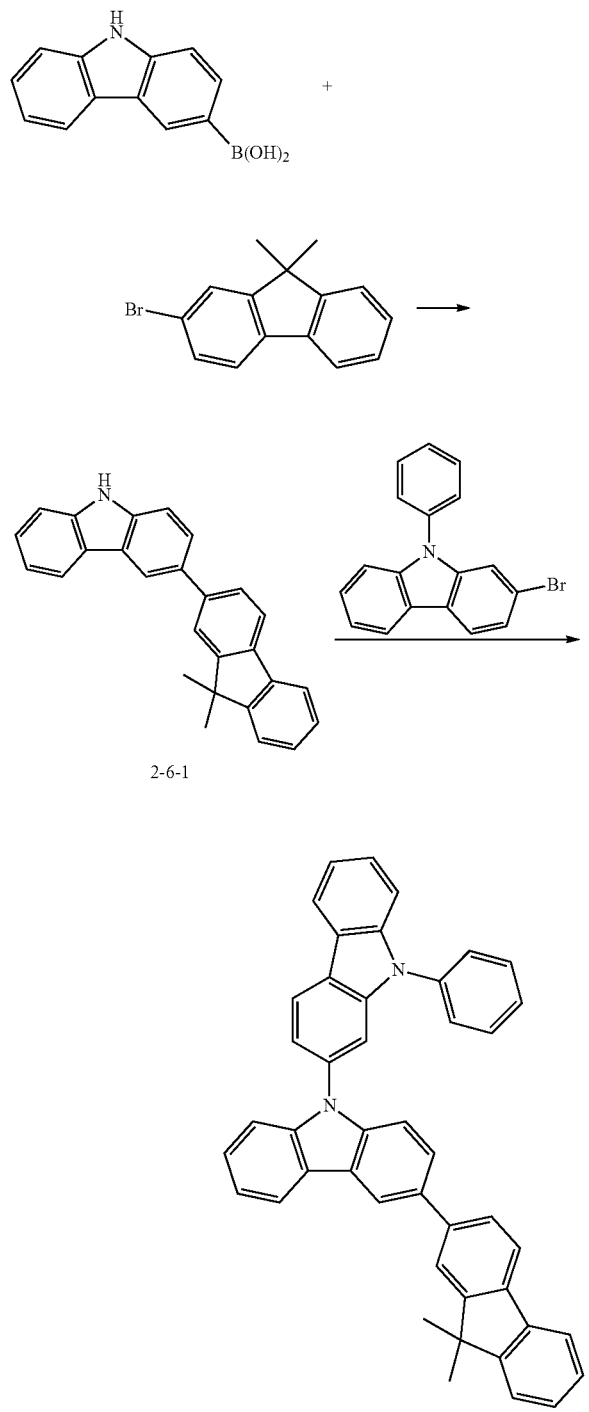

2-6-1

2-6 a) Preparation of Compound 2-6-1

Compound 2-6-1 (18.4 g, yield 83%) was prepared in the same manner as in the Preparation of Compound 2-1, except that bromo-9,9'-dimethyl-9H-fluorene (15 g, 55 mmol) and (9H-carbazol-3-yl)boronic acid (13 g, 61.6 mmol) were used.

b) Preparation of Compound 2-6

Compound 2-6 (19.0 g, yield 76%) was prepared in the same manner as in the Preparation of Compound 2-3, except that Compound 2-6-1 (15 g, 41.7 mmol) and bromo-9-phenyl-9H-carbazole (13.4 g, 41.7 mmol) were used.

MS: [M+H]⁺=601

7) Preparation of compound 2-7

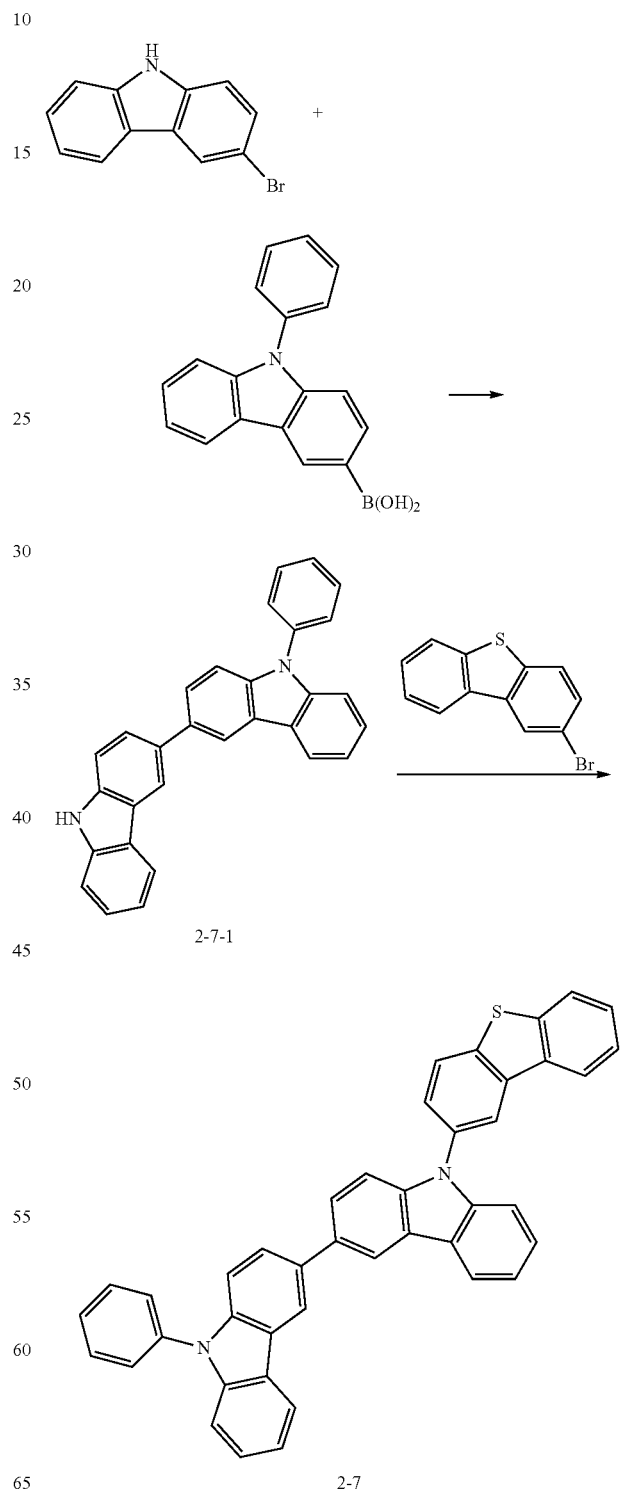

2-7-1

2-7 a) Preparation of Compound 2-7-1

Compound 2-7-1 (24 g, yield 81%) was prepared in the same manner as in the Preparation of Compound 2-1, except that 3-bromo-9H-carbazole (15 g, 61 mmol) and 9-([1,1'-biphenyl]-4-yl)-9H-carbazol-3-yl)boronic acid (22 g, 61 mmol) were used.

b) Preparation of Compound 2-7

Compound 2-7 (16.3 g, yield 75%) was prepared in the same manner as in the Preparation of Compound 2-3, except that Compound 2-7-1 (15 g, 36.7 mmol) and 2-bromo[b,d]thiophene (9.7 g, 36.7 mmol) were used.

EXPERIMENTAL EXAMPLE

Experimental Example 1

A glass substrate on which a thin film of ITO (indium tin oxide) was coated in a thickness of 1,300 Å was put into distilled water containing the detergent dissolved therein and washed by the ultrasonic wave. The used detergent was a product commercially available from Fisher Co. and the distilled water was one which had been twice filtered by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol, acetone, and methanol solvent, and dried, after which it was transported to a plasma cleaner. Then, the substrate was cleaned with oxygen plasma for 5 minutes, and then transferred to a vacuum evaporator.

On the ITO transparent electrode thus prepared, a compound HI-1 was thermally vacuum-deposited in a thickness of 50 Å to form a hole injection layer. A compound HT-1 was thermally vacuum-deposited on the hole injection layer in a thickness of 250 Å to form a hole transport layer. A compound HT-2 was vacuum deposited on the HT-1 vapor deposition layer in a thickness of 50 Å to form an electron blocking layer. Then, the compound 1 previously prepared and the compound 2-4 previously prepared were deposited by co-evaporation at a weight ratio shown in Table 1 below, wherein a compound YGD as a phosphorescent dopant was co-deposited at the weight ratio shown in Table 1 (12%: relative to the total weight of Compound 1, Compound 2-4, and YGD) to form a light emitting layer in a thickness (400 Å) in Table 1 below. A compound ET-1 was vacuum deposited on the light emitting layer in a thickness of 250 Å, and further a compound ET-2 was co-deposited with 2 wt % Li in a thickness of 100 Å to form an electron transport layer and an electron injection layer. Aluminum was deposited on the electron injection layer in a thickness of 1000 Å to form a cathode.

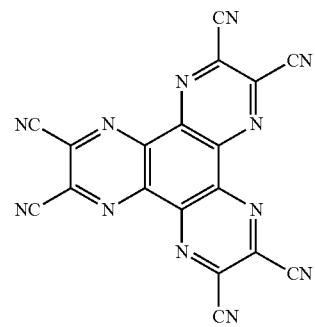

HI-1

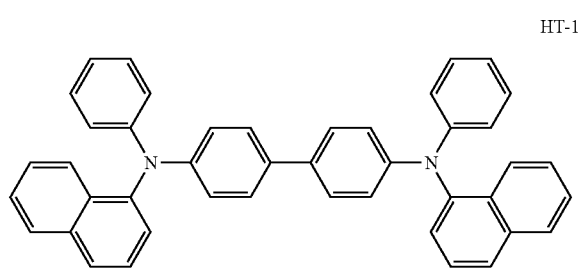

HT-1

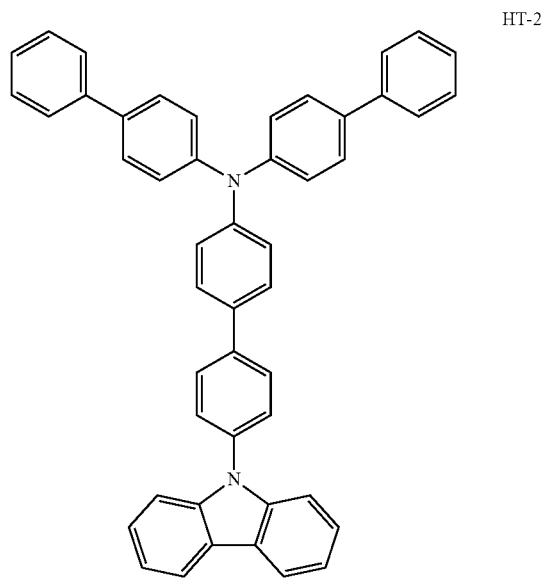

HT-2

YGO

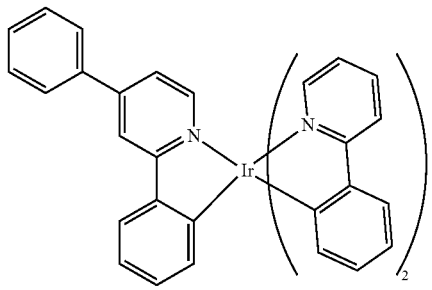

ET-1

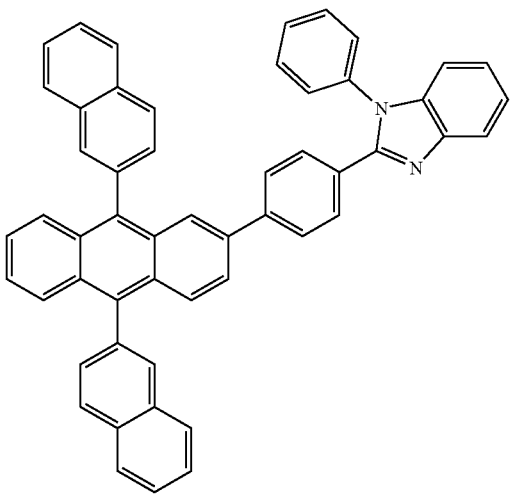

ET-2

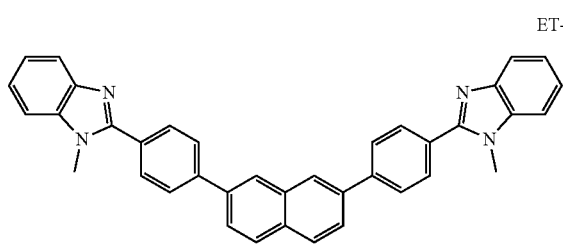

In the above process, the vapor deposition rate of the organic material was maintained at 0.4 to 0.7 Å/sec, the deposition rate of aluminum was maintained at 2 Å/sec, and the degree of vacuum during vapor deposition was maintained at $1\times10^{-7}$~$5\times10^{-8}$ torr.

Experimental Examples 2 to 119

The organic light emitting devices were manufactured in the same manner as in Experimental Example 1, except that the contents of the phosphorescent host material and the dopant were changed as shown in Table 1 below, respectively.

Comparative Experimental Examples 1 to 11

The organic light emitting devices were manufactured in the same manner as in Experimental Example 1, except that the contents of the phosphorescent host material and the dopant were changed as shown in Table 1 below, respectively. At this time, the host compounds A to E, PH-1 used are as follows.

Compound A

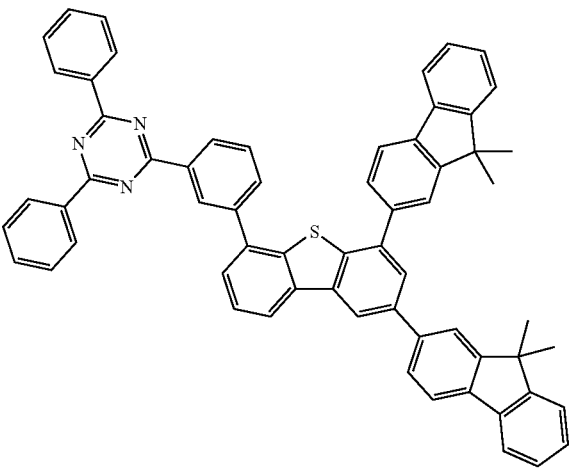

Compound B

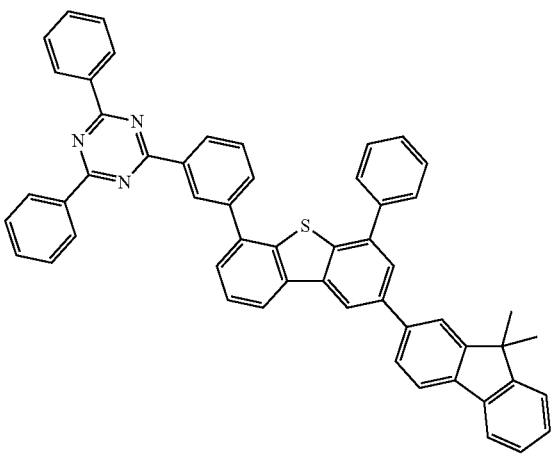

-continued

Compound C

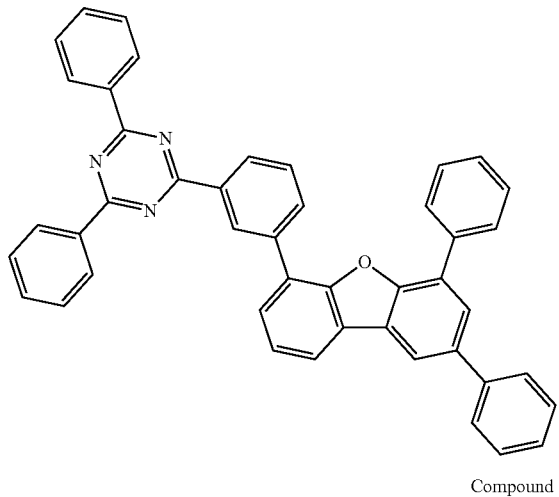

Compound D

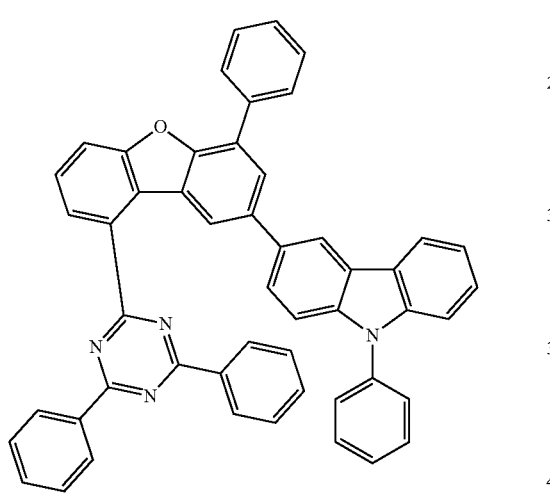

Compound E

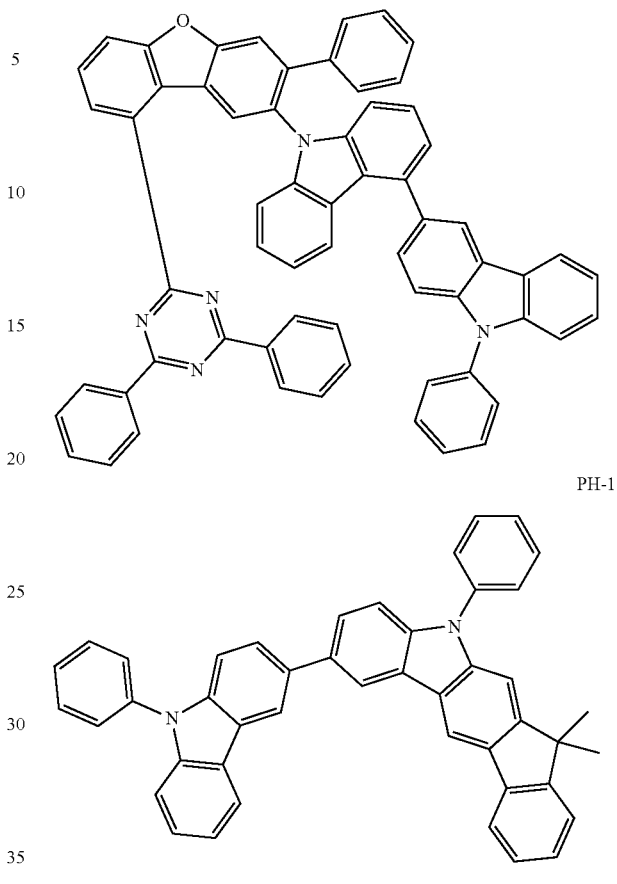

PH-1

The voltage, efficiency, luminance, color coordinate, and lifetime were measured by applying a current to the organic light emitting devices manufactured in the Experimental Examples and Comparative Experimental Examples, and the results are shown in Table 1 below. At this time, T95 means the time required for the luminance to be reduced to 95% when the initial luminance at the current density of 50 mA/cm² is taken as 100%.

TABLE 1

| No. | Host (wt %)/ dopant content | Voltage (V) (@10 mA/cm²) | Efficiency (Cd/A) (@10 mA/cm²) | Color Coordinate (x, y) | Lifetime ($T_{95}$, h) (@50 mA/cm²) |
|---|---|---|---|---|---|
| Experimental Ex. 1 | (Com. 1:Com. 2-4)/YGD (200:200)/12% | 3.49 | 23.7 | (0.462, 0.529) | 135.5 |
| Experimental Ex. 2 | (Com. 2:Com. 2-3)/YGD (280:120)/12% | 3.33 | 22.8 | (0.460, 0.531) | 165.5 |
| Experimental Ex. 3 | (Com. 2:Com. 2-4)/YGD (200:200)/12% | 3.36 | 23.6 | (0.457, 0.534) | 180.3 |
| Experimental Ex. 4 | (Com. 3:Com. 2-4)/YGD (200:200)/12% | 3.39 | 23.5 | (0.459, 0.532) | 140.0 |
| Experimental Ex. 5 | (Com. 3:Com. 2-5)/YGD (200:200)/15% | 3.53 | 24.3 | (0.458, 0.533) | 141.5 |
| Experimental Ex. 6 | (Com. 3:Com. 2-6)/YGD (280:120)/15% | 3.39 | 24.3 | (0.454, 0.537) | 150.0 |
| Experimental Ex. 7 | (Com. 4:Com. 2-5)/YGD (200:200)/15% | 3.35 | 24.0 | (0.458, 0.533) | 120.2 |
| Experimental Ex. 8 | (Com. 5:Com. 2-4)/YGD (120:280)/12% | 3.56 | 23.4 | (0.449, 0.541) | 130.5 |

TABLE 1-continued

| No. | Host (wt %)/ dopant content | Voltage (V) (@10 mA/cm²) | Efficiency (Cd/A) (@10 mA/cm²) | Color Coordinate (x, y) | Lifetime (T₉₅, h) (@50 mA/cm²) |
|---|---|---|---|---|---|
| Experimental Ex. 9 | (Com. 5:Com. 2-7)/YGD (200:200)/12% | 3.22 | 23.4 | (0.458, 0.532) | 126.5 |
| Comparative Experimental Ex. 1 | (Com. 1)/YGD (400)/16% | 3.03 | 21.5 | (0.472, 0.521) | 69.0 |
| Comparative Experimental Ex. 2 | (Com. 1:PH-1)/YGD 150:250)/15% | 3.90 | 23.3 | (0.445, 0.545) | 90.1 |
| Comparative Experimental Ex. 3 | (Com. 2)/YGD (400)/12% | 2.90 | 19.7 | (0.474, 0.519) | 79.2 |
| Comparative Experimental Ex. 4 | (Com. A)/YGD (400)/16% | 2.98 | 20.1 | (0.481, 0.513) | 48.2 |
| Comparative Experimental Ex. 5 | (Com. B:PH-1)/YGD (120/280)/12% | 3.50 | 22.2 | (0.461, 0.530) | 80.2 |
| Comparative Experimental Ex. 6 | (Com. C)/YGD (400)/12% | 3.59 | 19.7 | (0.462, 0.529) | 41.9 |
| Comparative Experimental Ex. 7 | (Com. C:Com. 2-4)/YGD (200/200)/10% | 3.73 | 22.2 | (0.458, 0.533) | 73.3 |
| Comparative Experimental Ex. 8 | (Com. D:Com. 2-3)/YGD (120/280)/12% | 3.68 | 22.6 | (0.454, 0.536) | 74.2 |
| Comparative Experimental Ex. 9 | (Com. D:Com. 2-4)/YGD (200/200)/10% | 3.50 | 22.2 | (0.461, 0.530) | 85.2 |
| Comparative Experimental Ex. 10 | (Com. E)/YGD (400)/16% | 2.98 | 20.1 | (0.481, 0.513) | 27.7 |
| Comparative Experimental Ex. 11 | (Com. E:PH-1)/YGD (200:200)/12% | 4.03 | 21.8 | (0.449, 0.541) | 49.9 |

Experimental Example 10

A glass substrate on which a thin film of ITO (indium tin oxide) was coated in a thickness of 1,300 Å was put into distilled water containing the detergent dissolved therein and washed by the ultrasonic wave. The used detergent was a product commercially available from Fisher Co. and the distilled water was one which had been twice filtered by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol, acetone, and methanol solvent, and dried, after which it was transported to a plasma cleaner. Then, the substrate was cleaned with oxygen plasma for 5 minutes, and then transferred to a vacuum evaporator.

On the ITO transparent electrode thus prepared, a compound HI-1 was thermally vacuum-deposited in a thickness of 500 Å to form a hole injection layer. A compound HT-3 was thermally vacuum-deposited on the hole injection layer in a thickness of 800 Å and sequentially a compound HT-4 was vacuum-deposited in a thickness of 500 Å to form a hole transport layer. Then, the compound 1 previously prepared and the compound 2-1 previously prepared were deposited on the hole transport layer by co-evaporation at a weight ratio (175:175) shown in Table 2 below, wherein a compound GD-1 as a phosphorescent dopant was co-deposited at the weight ratio shown in Table 2 (5%: relative to the total weight of Compound 1, Compound 2-1, and GD-1) to form a light emitting layer in a thickness (350 Å) in Table 2 below. A compound ET-3 was vacuum deposited on the light emitting layer in a thickness of 50 Å to form a hole blocking layer, and further a compound ET-4 and LIQ were co-deposited at a weight ratio of 1:1 to form an electron transport layer in a thickness of 250 Å. Lithium fluoride (LiF) in a thickness of 10 Å and aluminum in a thickness of 1,000 Å were sequentially deposited on the electron transport layer to form a cathode.

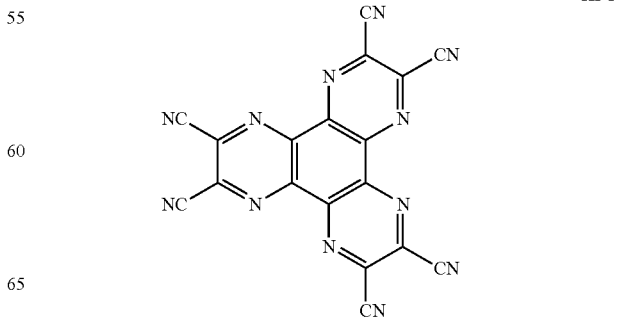

HI-1

HT-3

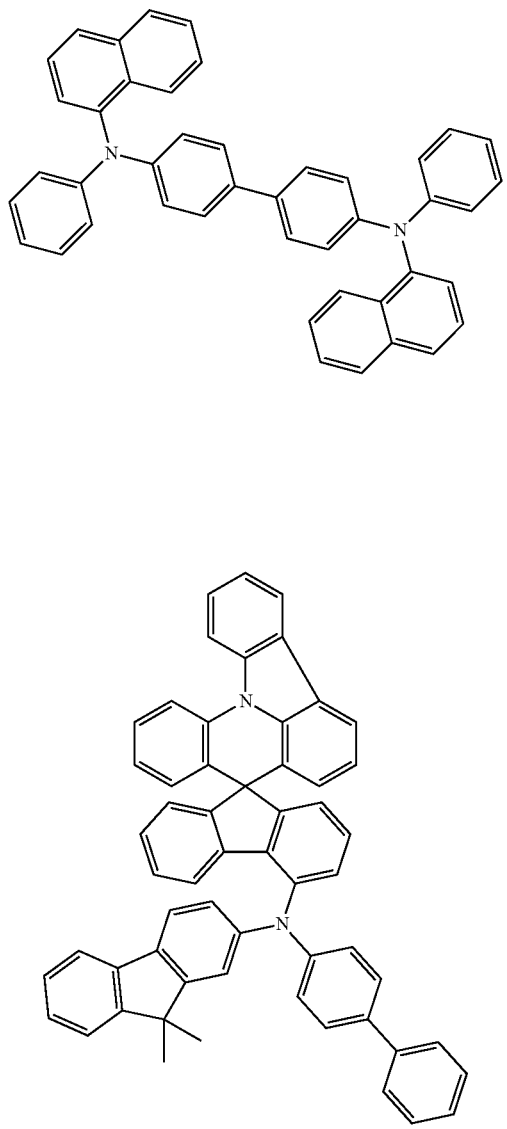

HT-4

GD-1

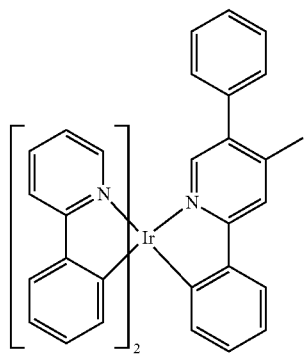

ET-3

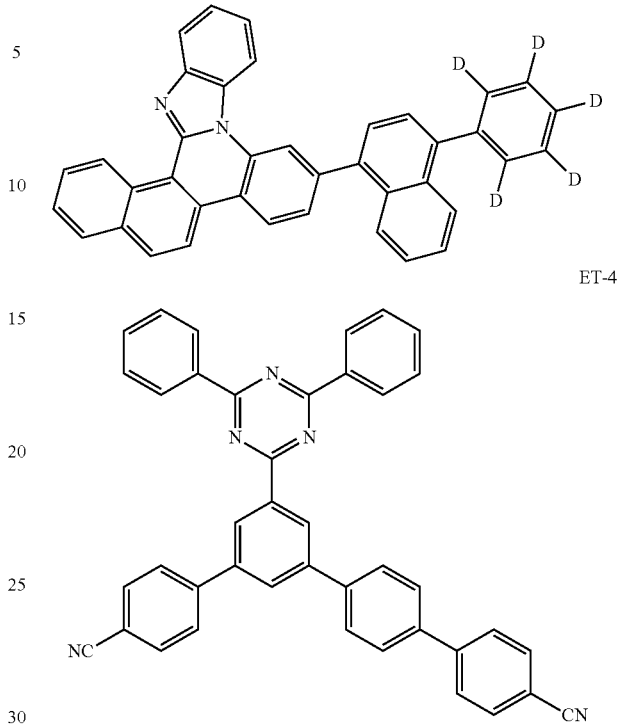

ET-4

In the above process, the vapor deposition rate of the organic material was maintained at 0.4 to 0.7 Å/sec, the vapor deposition rate of lithium fluoride of the cathode was maintained at 0.3 Å/sec, and the vapor deposition rate of aluminum was maintained at 2 Å/sec. The degree of vacuum during vapor deposition was maintained at $1 \times 10^{-7} \sim 5 \times 10^{-8}$ torr.

Examples 11 to 16

The organic light emitting devices were respectively manufactured in the same manner as in Experimental Example 10, except that the contents of the phosphorescent host material and the dopant in the formation of the light emitting layer were changed as shown in Table 2 below.

Comparative Examples 12 to 16

The organic light emitting devices were respectively manufactured in the same manner as in Experimental Example 10, except that the contents of the phosphorescent host material and the dopant the vaporization of the light emitting layer were changed as shown in Table 2 below. The host materials A, C and E used herein were the same as those used in Comparative Experimental Examples 1 to 11, respectively.

The voltage, efficiency, luminance, color coordinate, and lifetime were measured by applying a current to the organic light emitting devices manufactured in the Experimental Examples and Comparative Experimental Examples, and the results are shown in Table 2 below. At this time, T95 means the time required for the luminance to be reduced to 95% when the initial luminance at the current density of 50 mA/cm² is taken as 100%.

TABLE 2

| No. | (Host)/Dopant content | Light emitting layer thickness(Å) | Voltage (V) (@10 mA/cm²) | Efficiency (Cd/A) (@10 mA/cm²) | Color coordinate (x, y) | Lifetime ($T_{95}$, h) (@50 mA/cm²) |
|---|---|---|---|---|---|---|
| Experimental Ex. 10 | (Com. 1:Com. 2-1)/GD-1 (175:175)/5% | 350 | 4.03 | 17.5 | (0.32, 0.63) | 160.5 |
| Experimental Ex. 11 | (Com. 1:Com. 2-2)/GD-1 (175:175)/5% | 350 | 4.17 | 17.5 | (0.32, 0.63) | 150.4 |
| Experimental Ex. 12 | (Com. 1:Com. 2-6)/GD-1 (140:210)/6% | 350 | 4.15 | 16.9 | (0.33, 0.63) | 132.9 |
| Experimental Ex. 13 | (Com. 2:Com. 2-2)/GD-1 (175:175)/5% | 350 | 3.88 | 17.1 | (0.32, 0.64) | 150.3 |
| Experimental Ex. 14 | (Com. 2:Com. 2-1)/GD-1 (200:200)/5% | 400 | 4.10 | 17.9 | (0.35, 0.61) | 158.1 |
| Experimental Ex. 15 | (Com. 3:Com. 2-1)/GD-1 (175:175)/5% | 350 | 4.02 | 18.1 | (0.33, 0.64) | 128.9 |
| Experimental Ex. 16 | (Com. 6:Com. 2-2)/GD-1 (200:200)/5% | 400 | 4.20 | 17.6 | (0.34, 0.62) | 121.6 |
| Experimental Ex. 17 | (Com. 7:Com. 2-2)/GD-1 (140:210)/5% | 350 | 3.95 | 17.5 | (0.33, 0.62) | 133.2 |
| Experimental Ex. 18 | (Com. 8:Com. 2-6)/GD-1 (175:175)/5% | 350 | 4.10 | 18.2 | (0.31, 0.64) | 129.8 |
| Comparative Experimental Ex. 12 | (Com. A:Com. 2-1)/GD-1 (175:175)/5% | 350 | 4.17 | 16.9 | (0.31, 0.64) | 90.8 |
| Comparative Experimental Ex. 13 | (Com. C:Com. 2-1)/GD-1 (200:200)/5% | 400 | 4.35 | 16.6 | (0.35, 0.61) | 75.0 |
| Comparative Experimental Ex. 14 | (Com. 1)/GD-1 (350)/5% | 350 | 3.78 | 15.5 | (0.35, 0.61) | 58.1 |
| Comparative Experimental Ex. 15 | (Com. C)/GD-1 (350)/6% | 350 | 3.95 | 14.9 | (0.35, 0.61) | 46.3 |
| Comparative Experimental Ex. 16 | (Com. E:Com. PH-1)/GD-1 (140:210)/6% | 350 | 4.62 | 16.7 | (0.34, 0.62) | 47.2 |

| [Explanation of Sign] | |
|---|---|
| 1: substrate | 2: anode, |
| 3: light emitting layer | 4: cathode |
| 5: hole injection layer | 6: hole transport layer |
| 7: light emitting layer | 8: electron transport layer |

The invention claimed is:

1. An organic light emitting device comprising:
a cathode; an anode; and at least one light emitting layer interposed between the cathode and the anode, wherein the light emitting layer comprises a first host compound represented by Chemical Formula 1 below, and a second host compound represented by Chemical Formula 2 below:

[Chemical Formula 1]

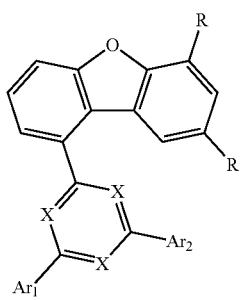

in Chemical Formula 1,
X is N, or CH, with the proviso that at least one X is N,
$Ar_1$ and $Ar_2$ are each independently a substituted or unsubstituted $C_{6-60}$ aryl; or a $C^{2-60}$ heteroaryl containing N, O, or S,
each R is identical and is —L—$Ar_3$,
L is a bond; or a substituted or unsubstituted $C_{6-60}$ arylene,
$Ar_3$ is a substituted or unsubstituted $C_{6-60}$ aryl; or a $C_{2-60}$ heteroaryl containing N, O, or S,

[Chemical Formula 2]

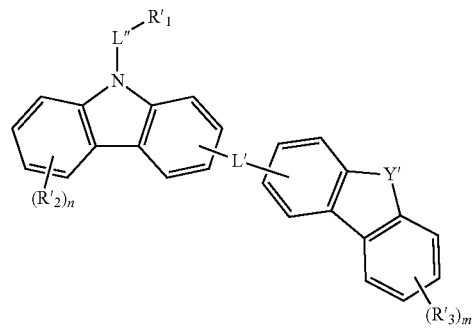

in Chemical Formula 2,
Y' is O, S, NR, or CR'R",
wherein R' and R" are each independently hydrogen; deuterium; halogen; cyano; nitro; amino; a substituted or unsubstituted $C_{1-60}$ alkyl; a substituted or unsubstituted $C_{1-60}$ haloalkyl; a substituted or unsubsti- $C_{2-60}$ haloalkoxy; a substituted or unsubstituted $C_{3-60}$ cycloalkyl; a substituted or unsubstituted $C_{2-60}$ alkenyl; a substituted or unsubstituted $C_{6-60}$ aryl; or a substituted or unsubstituted $C_{2-60}$ heteroaryl containing at least one of O, N, Si and S, or R' and R' together form a substituted or unsubstituted $C_{6-60}$ aromatic ring, L' and L" are each independently a single bond; a substituted or unsubstituted $C_{6-60}$ arylene; or a substituted or unsubstituted $C_{2-60}$ heteroarylene containing at least one of O, N, Si and S, $R'_1$ is a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl containing at least one of O, N, Si and S, $R'_2$ and $R'_3$ are each independently hydrogen; deuterium; halogen; cyano; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl containing at least one of O, N, Si and S, and m and n are each independently an integer of 0 to 4.

2. The organic light emitting device of claim 1, wherein each X is N.

3. The organic light emitting device of claim 1, wherein $Ar_1$ and $Ar_2$ are each independently phenyl or biphenylyl.

4. The organic light emitting device of claim 1, wherein L is a bond, phenylene, or naphthylene.

5. The organic light emitting device of claim 1, wherein $Ar_3$ is phenyl, cyano-substituted phenyl, biphenylyl, terphenylyl, naphthyl, phenanthrenyl, triphenylenyl, pyridinyl, dibenzofuranyl, dibenzothiophenyl, 9,9-dimethyl-9H-fluorenyl, carbazolyl, 9-phenyl-9H-carbazolyl, 9,9-dimethyl-9H-xanthenyl, or phenoxanthinyl.

6. The organic light emitting device of claim 1, wherein the compound represented by Chemical Formula 1 is any one selected from the group consisting of the following:

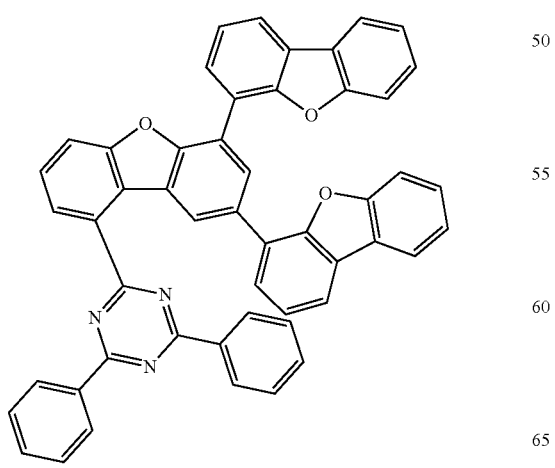

-continued

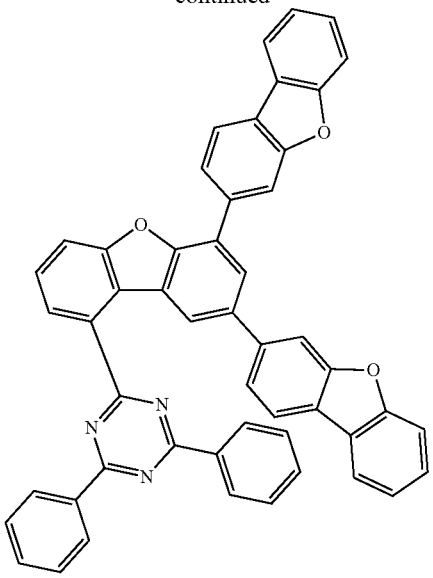

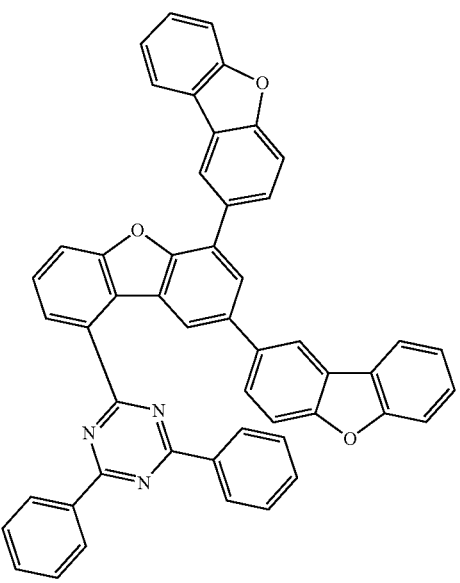

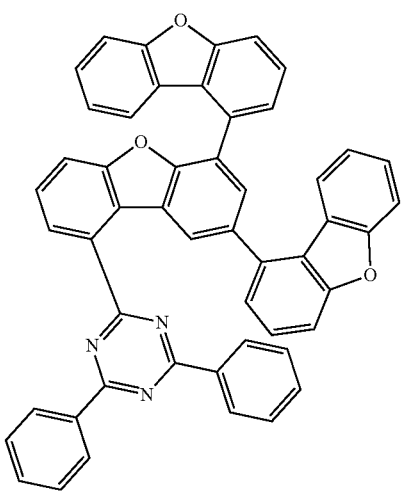

-continued
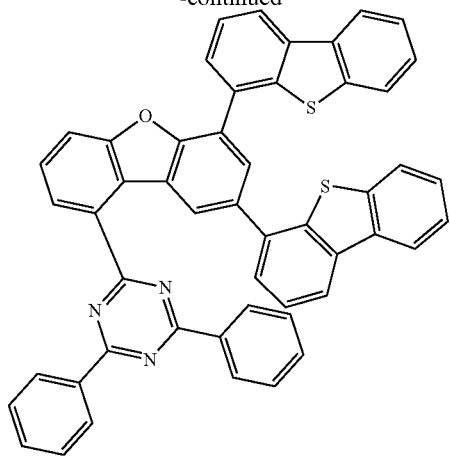
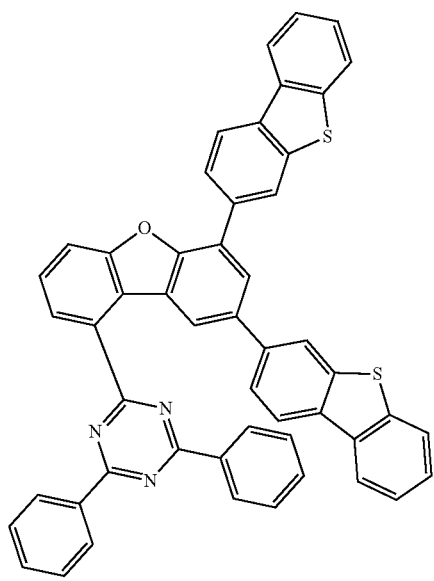
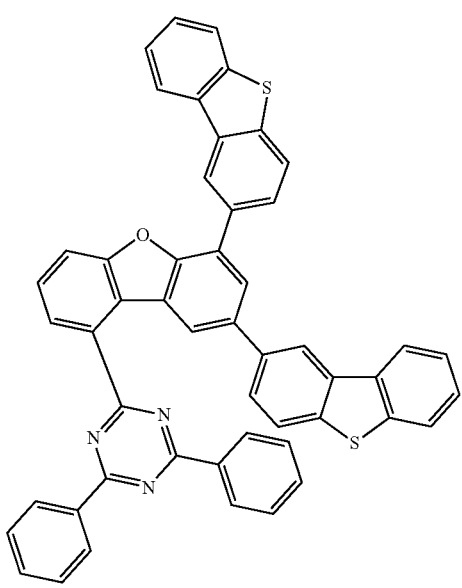
-continued
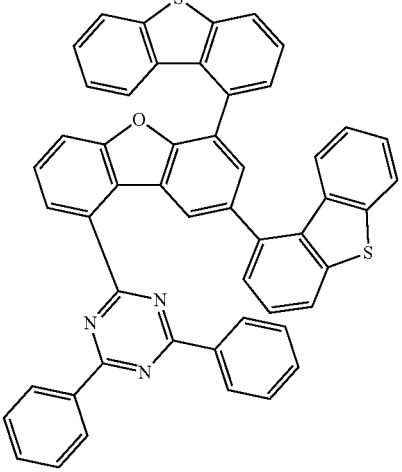
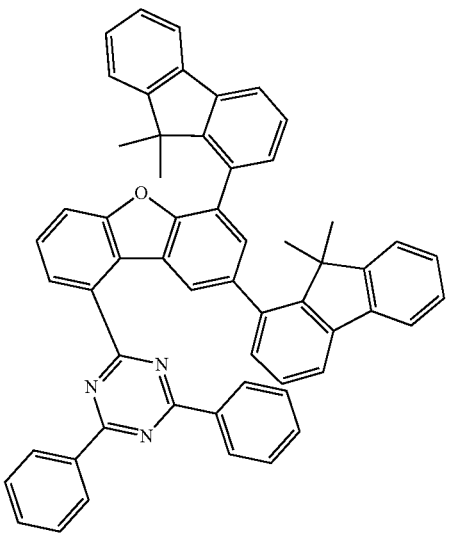
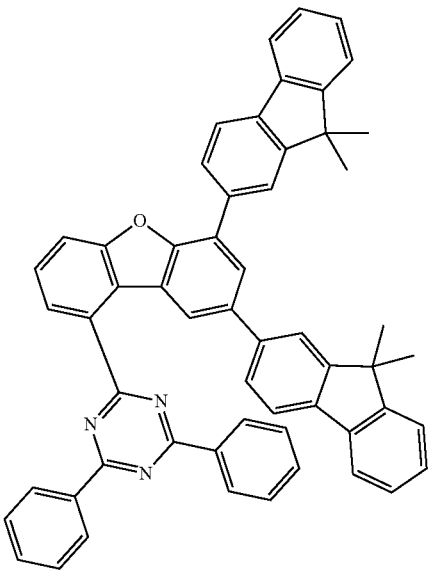

95
-continued
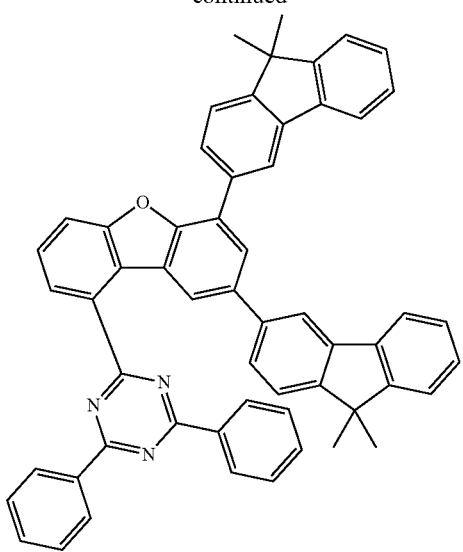
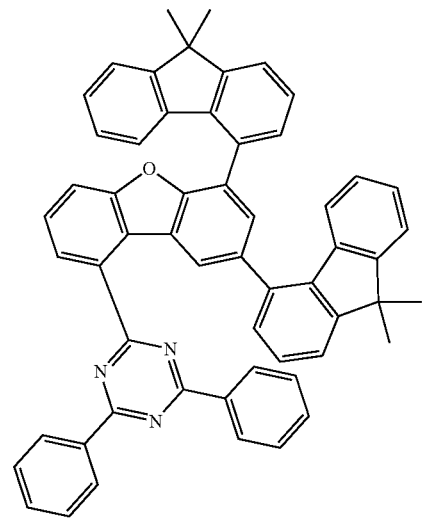
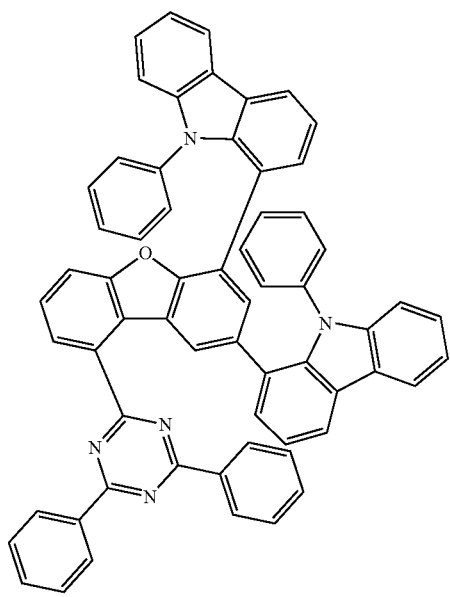
96
-continued
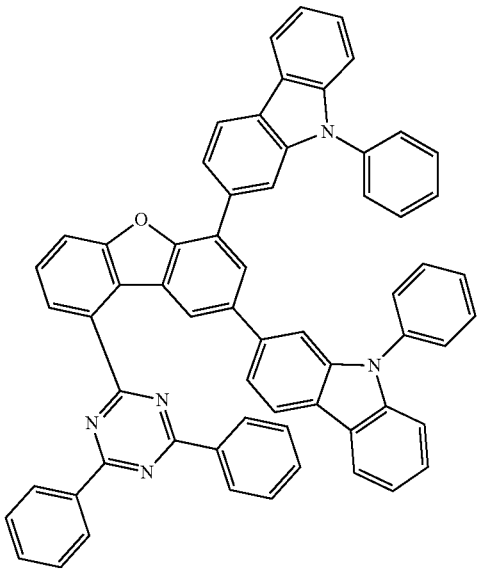
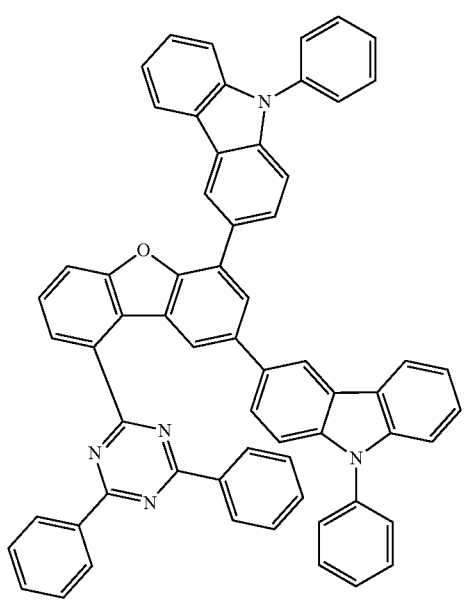

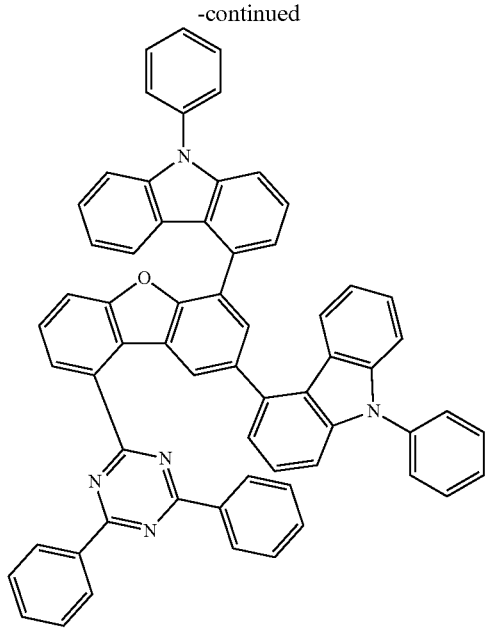
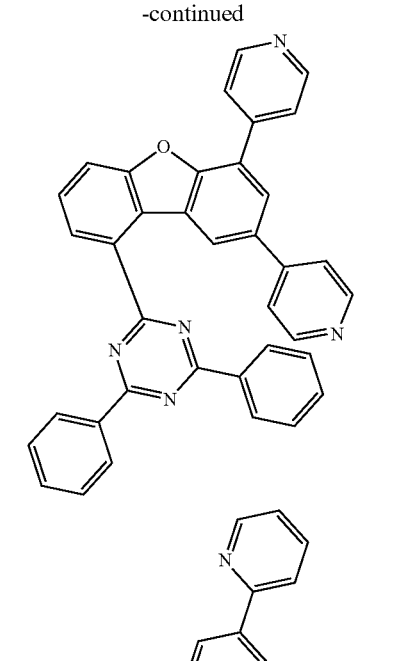
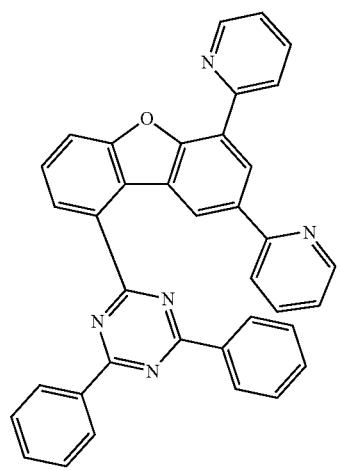
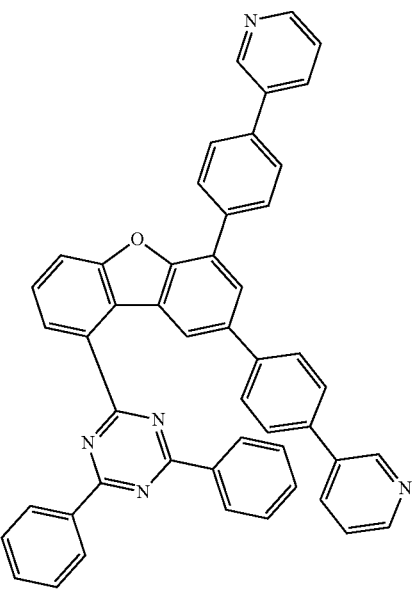
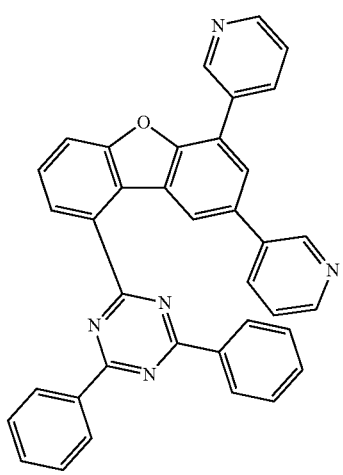

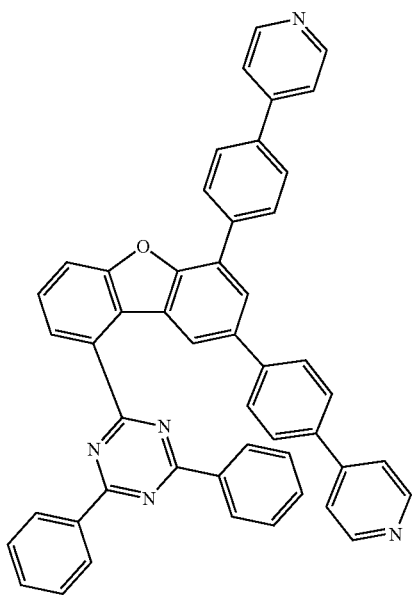
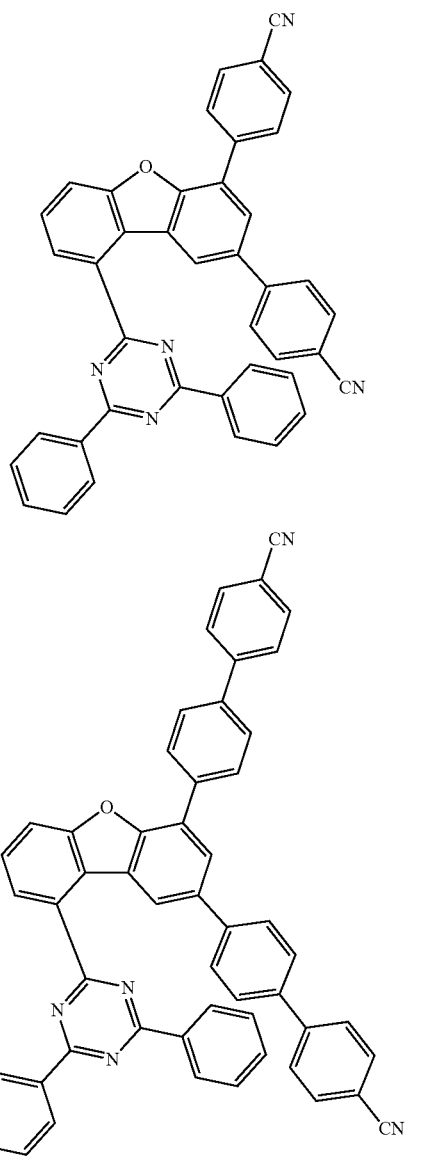
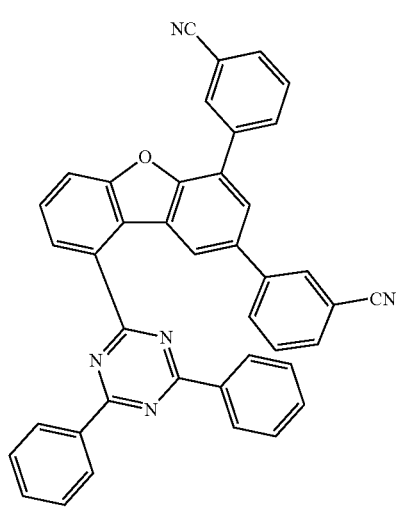

101
-continued
102
-continued
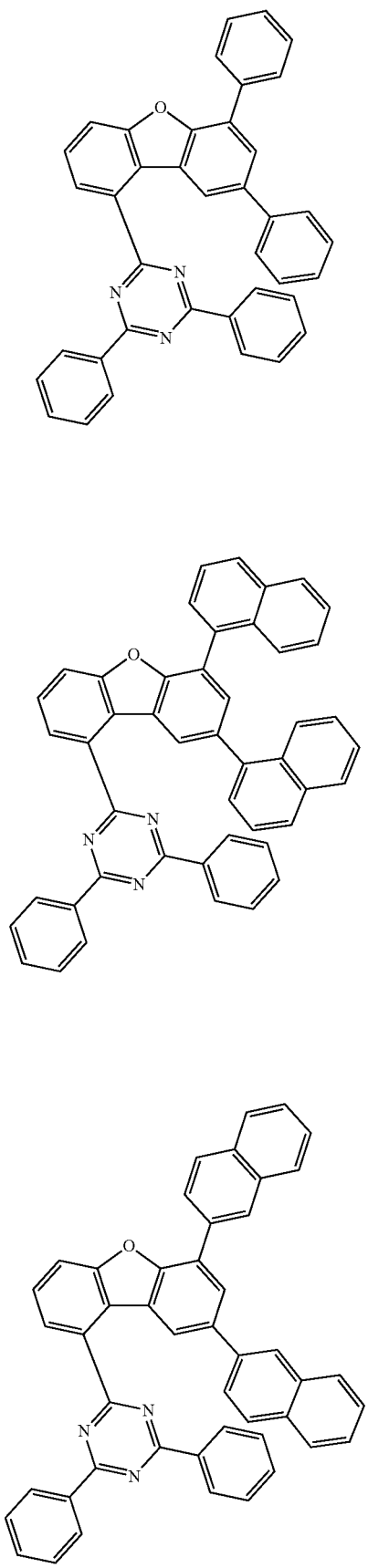
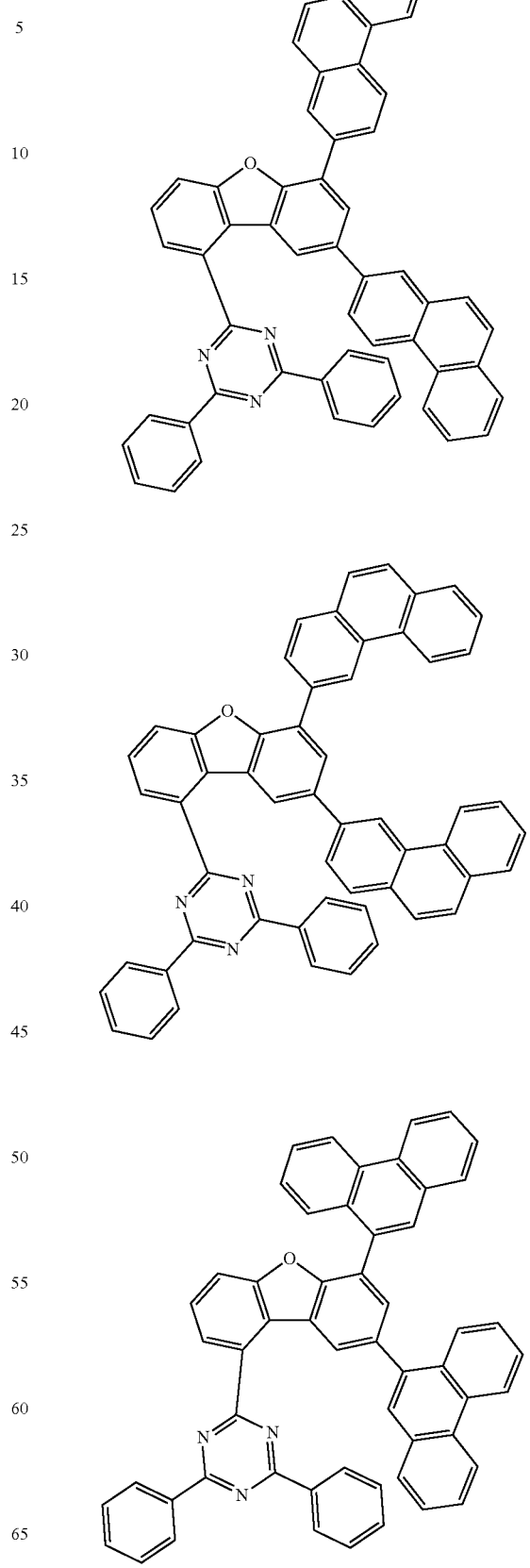

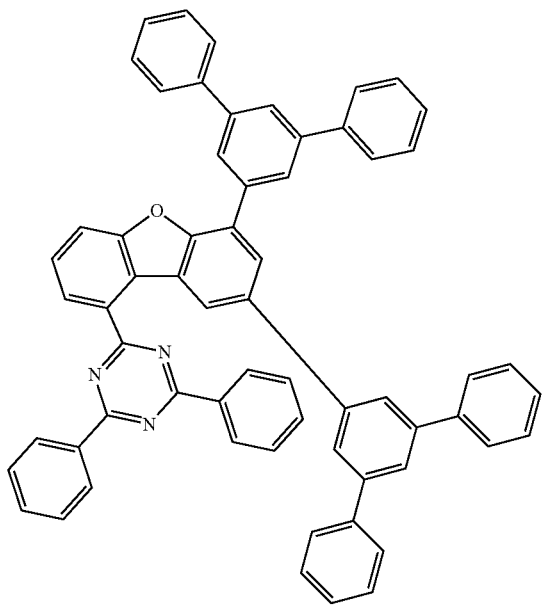
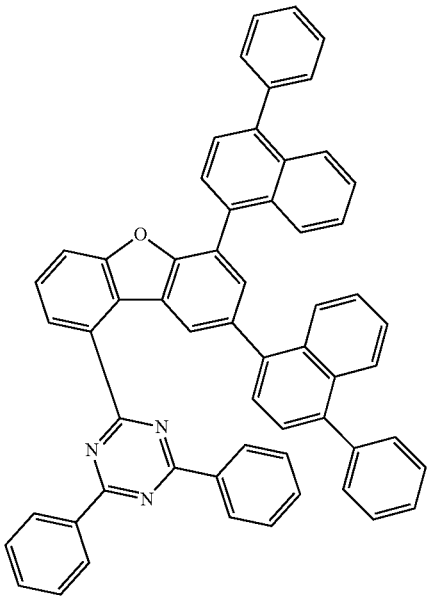
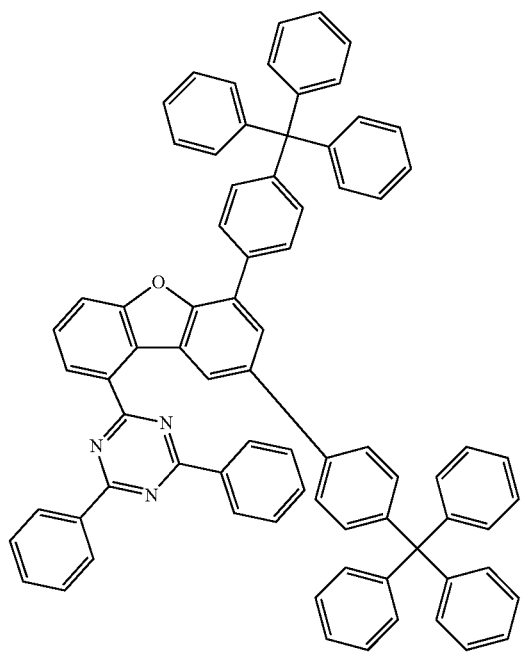
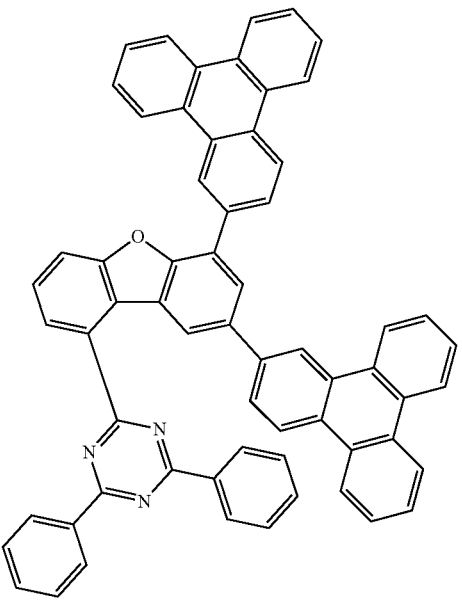

105
-continued
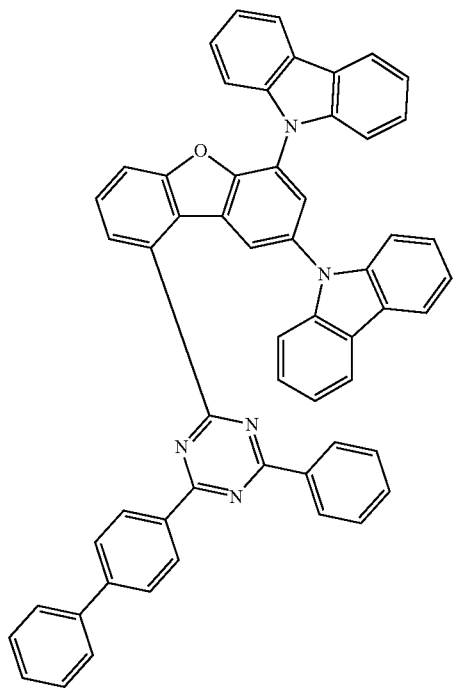
106
-continued
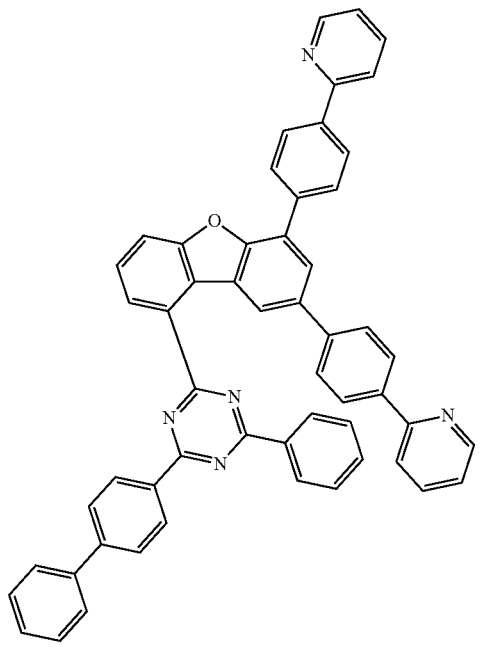
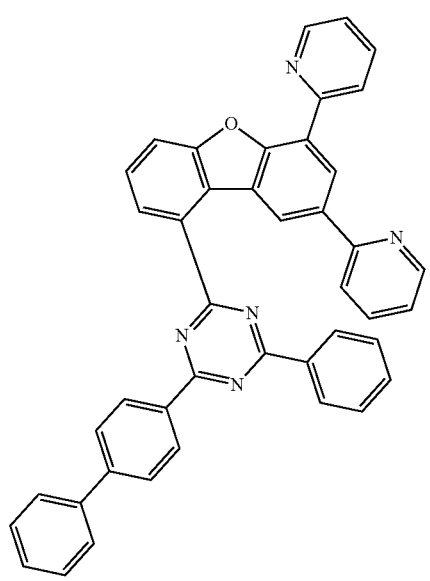
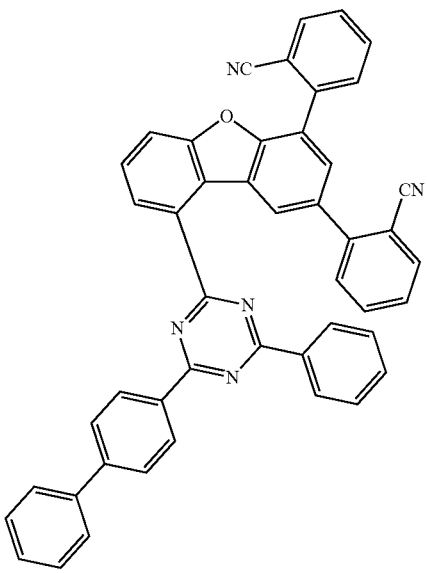

107
-continued
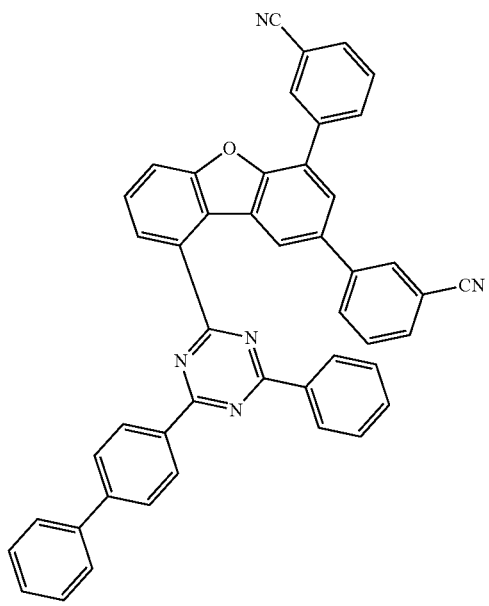
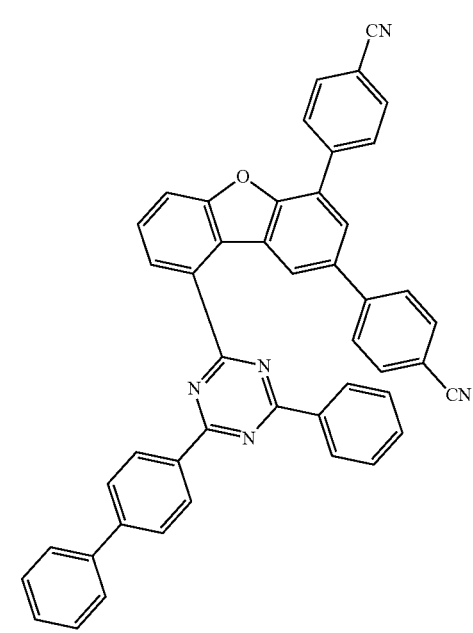
108
-continued
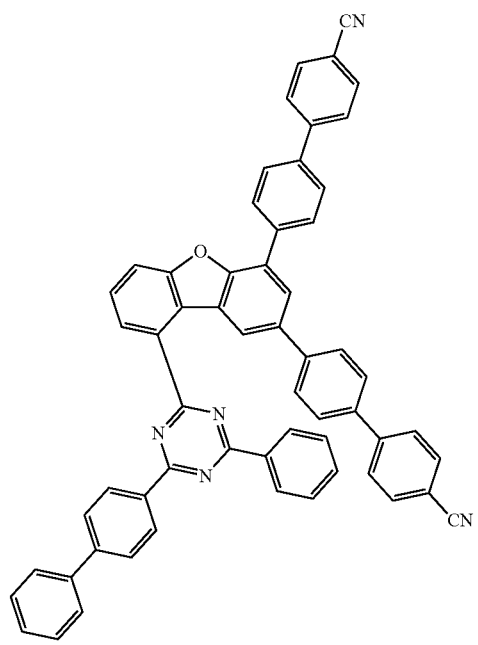
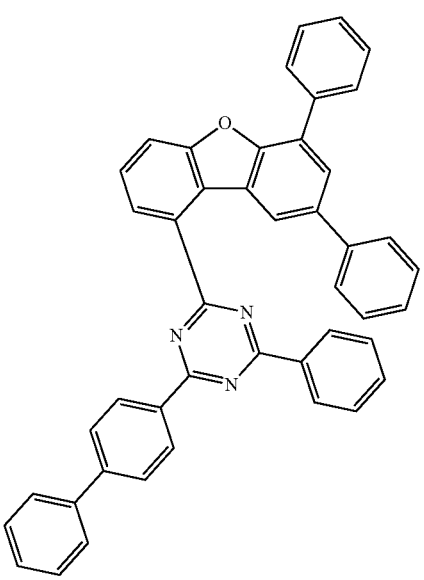

109
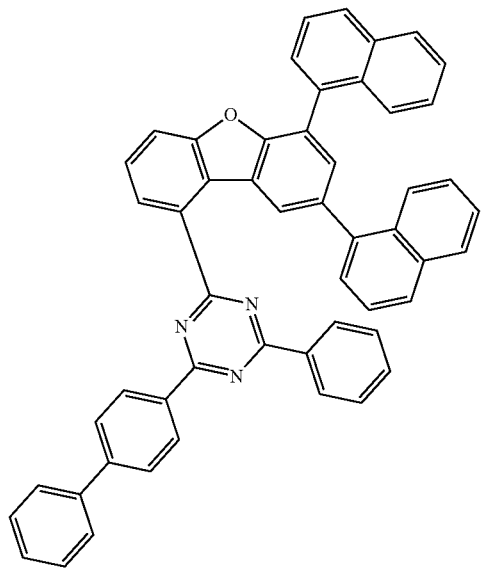
110
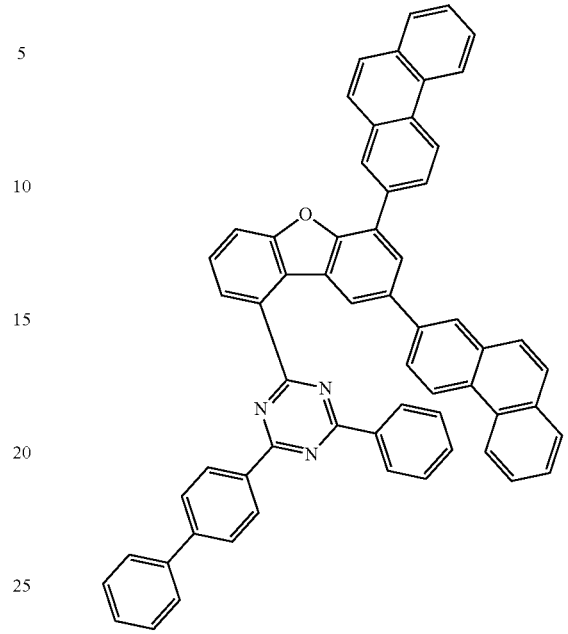
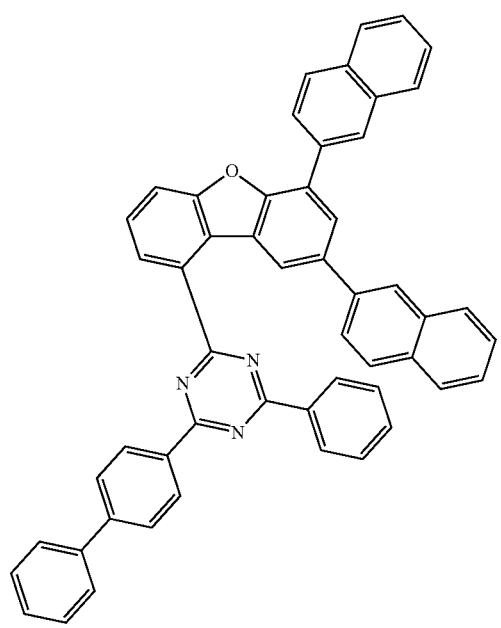
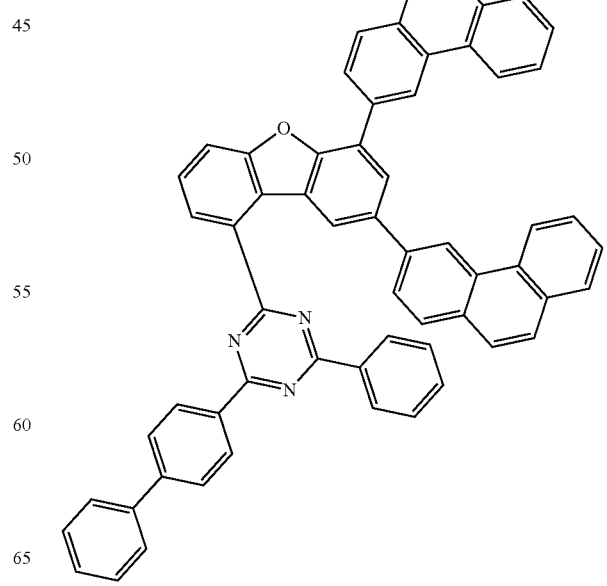

111
-continued
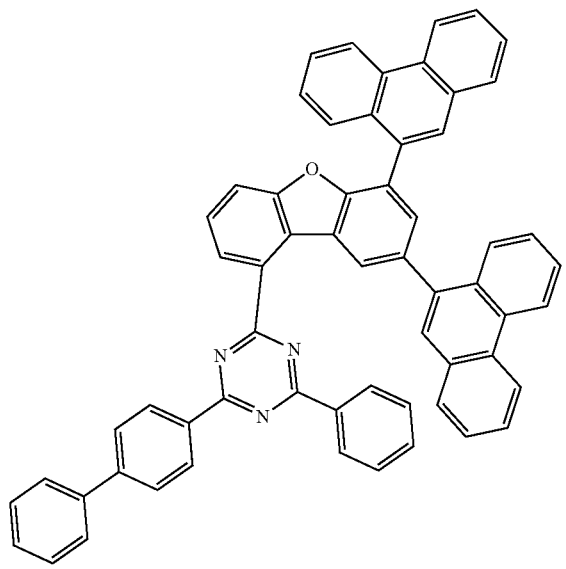
112
-continued
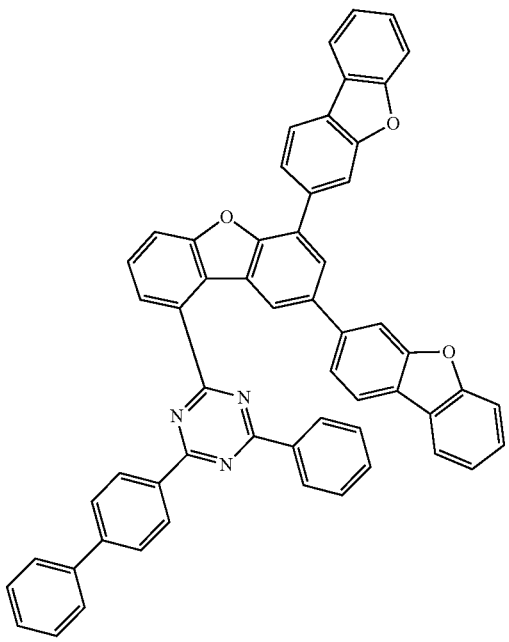
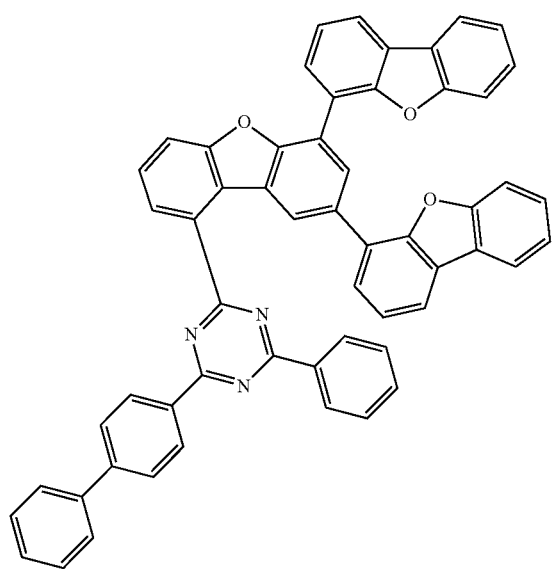
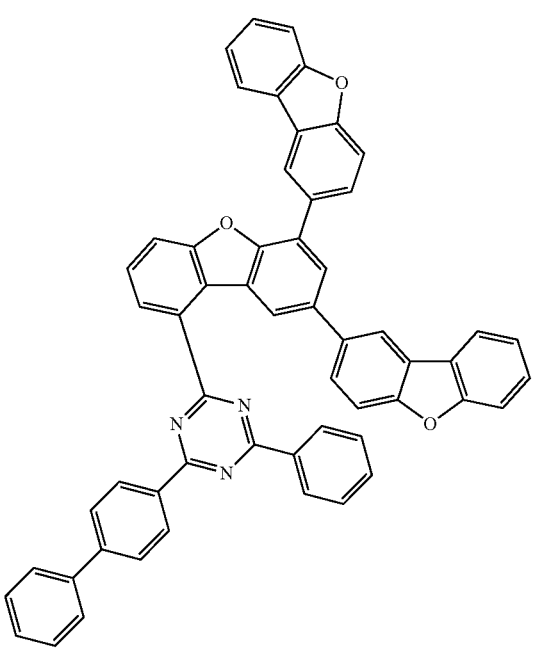

113
-continued
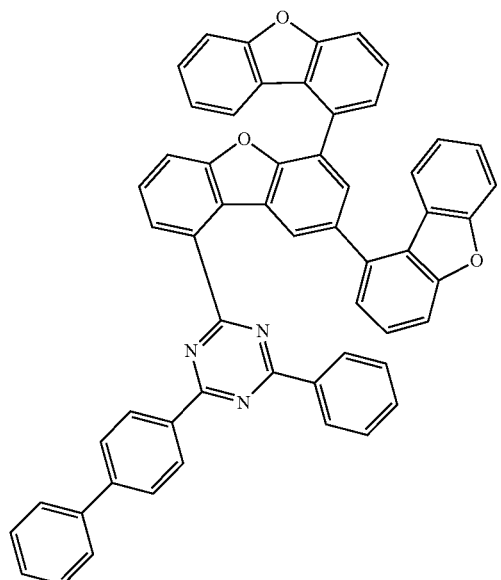
114
-continued
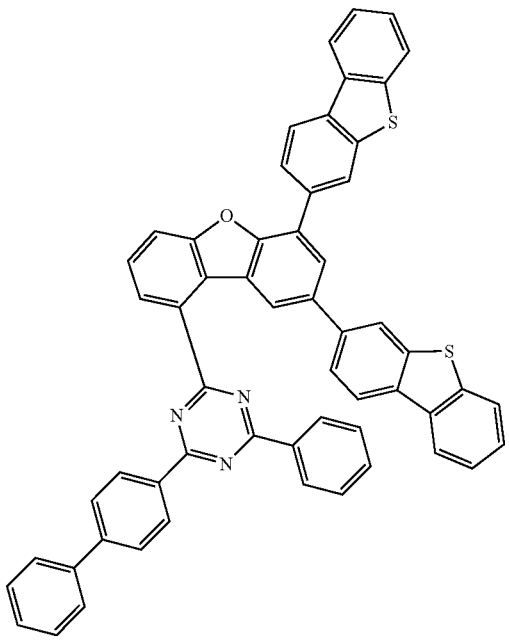
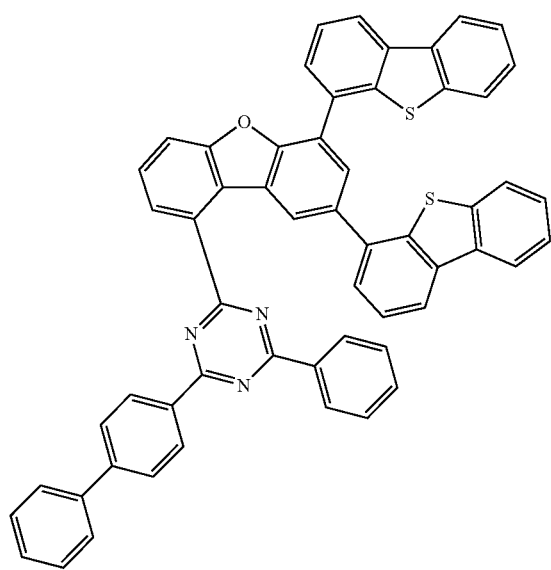
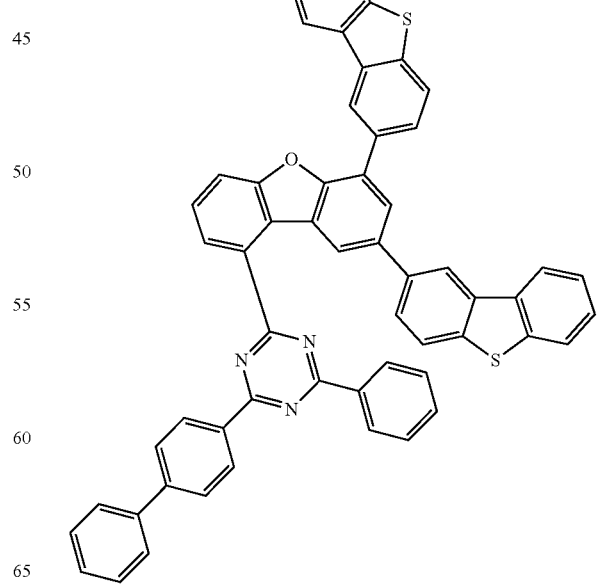

115
-continued
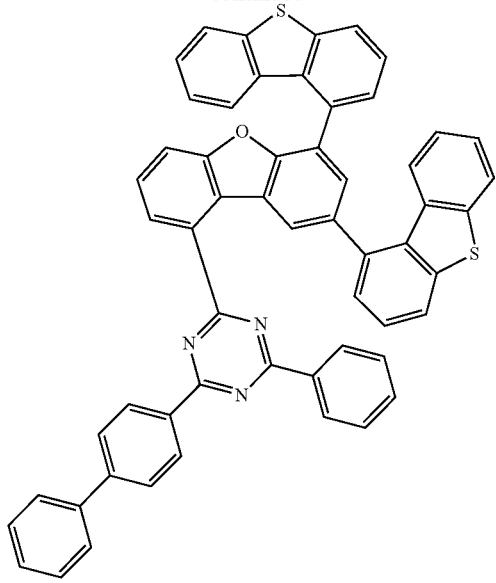
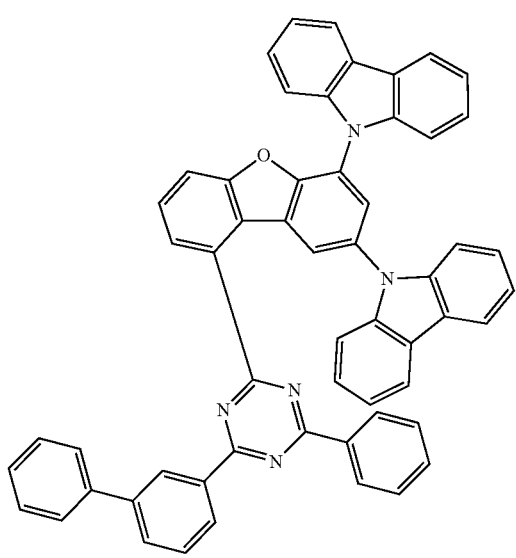
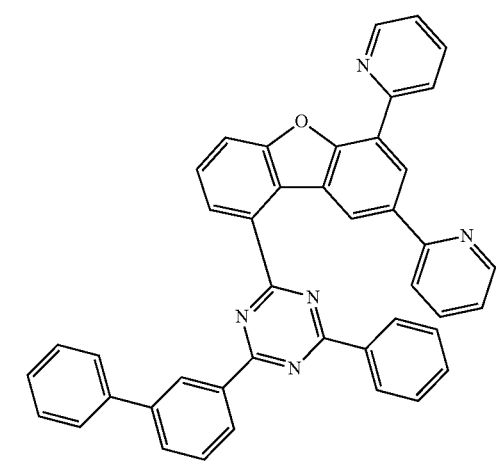
116
-continued
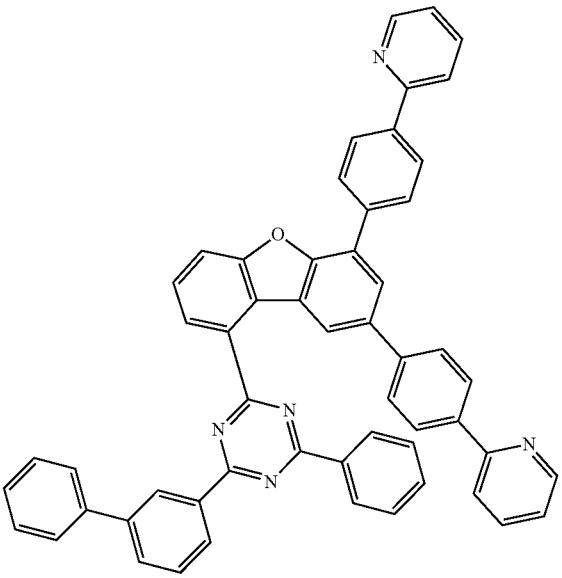
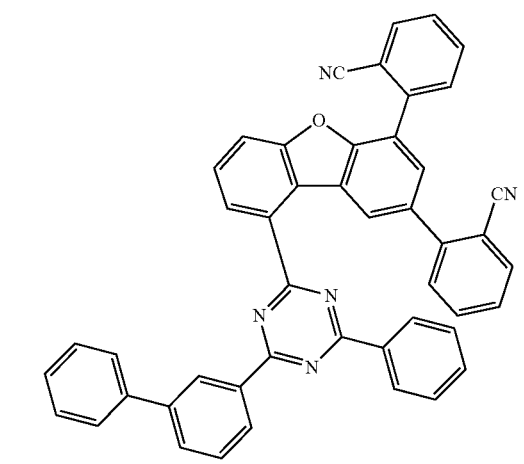
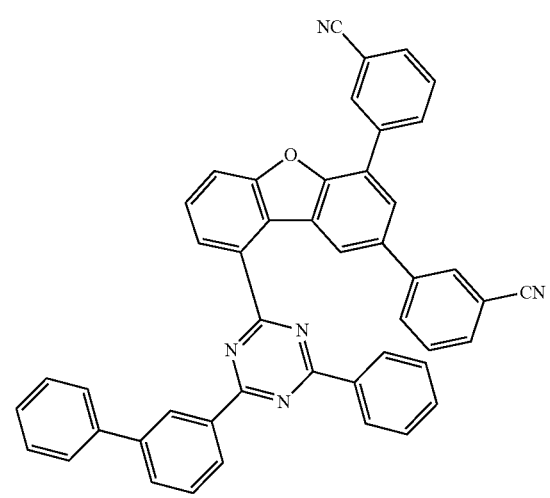

117
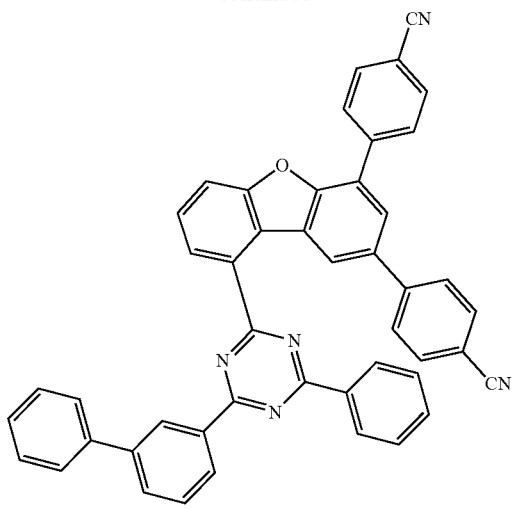
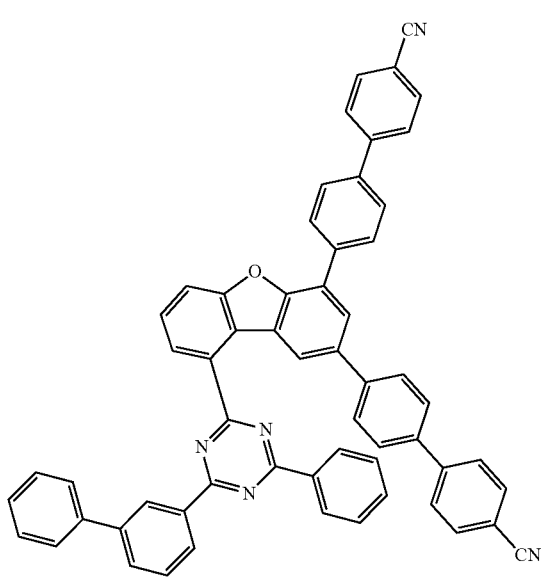
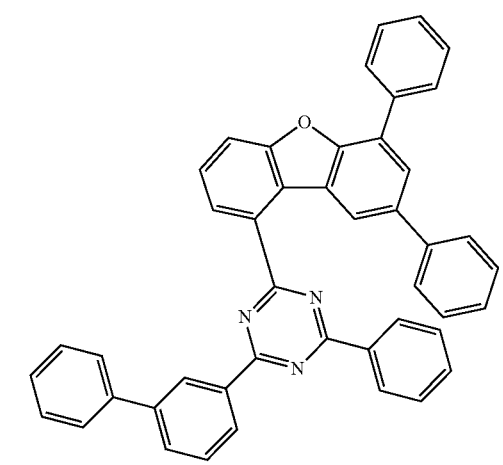
118
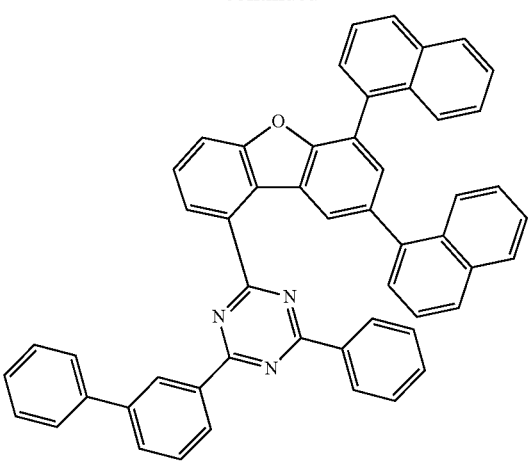
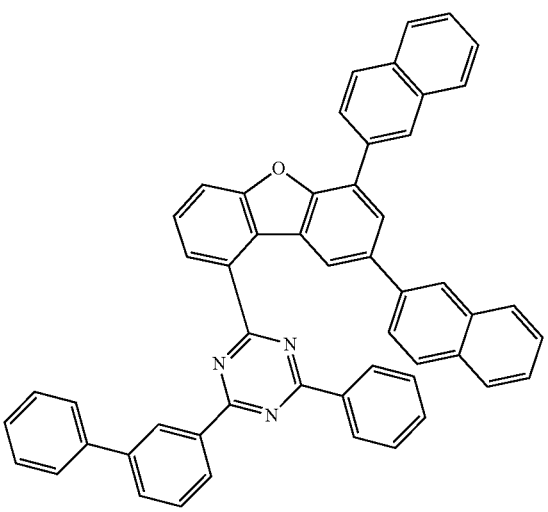
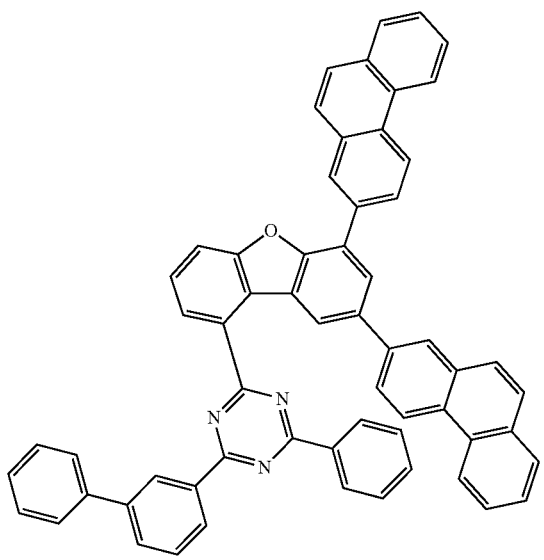

119
-continued
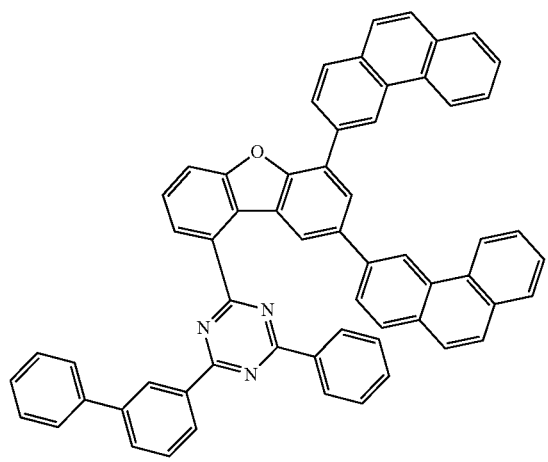
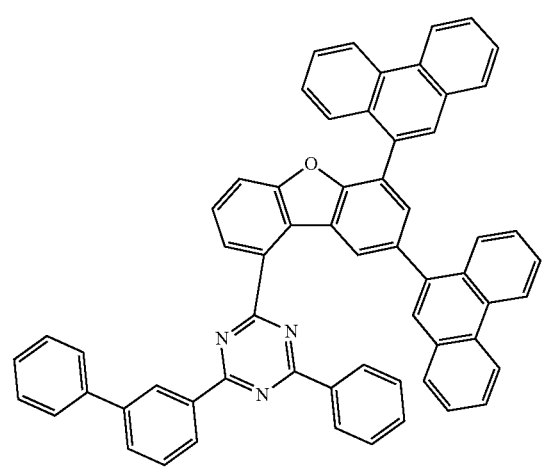
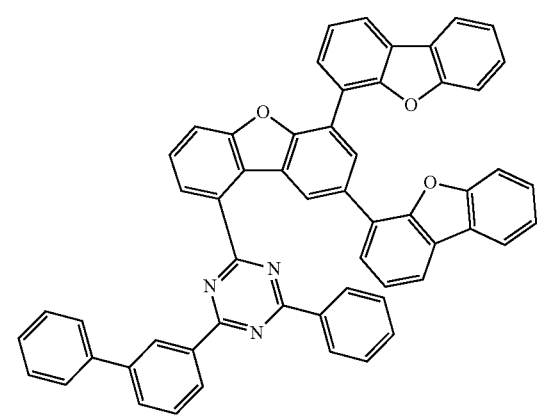
120
-continued
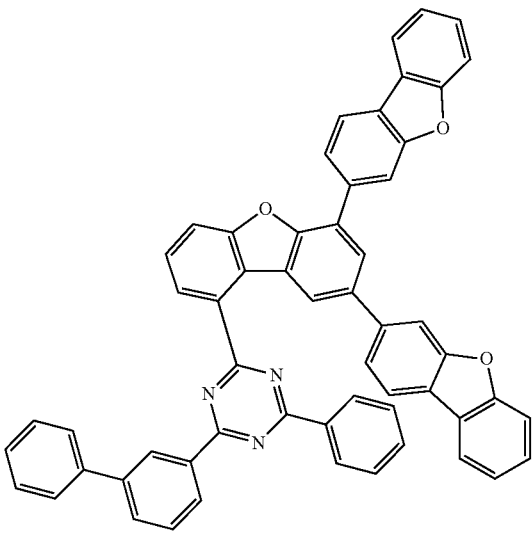
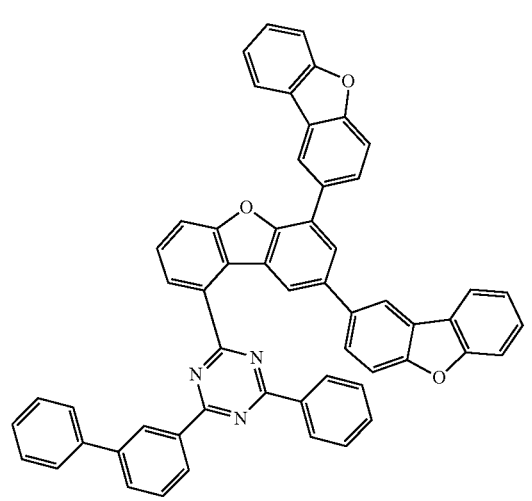
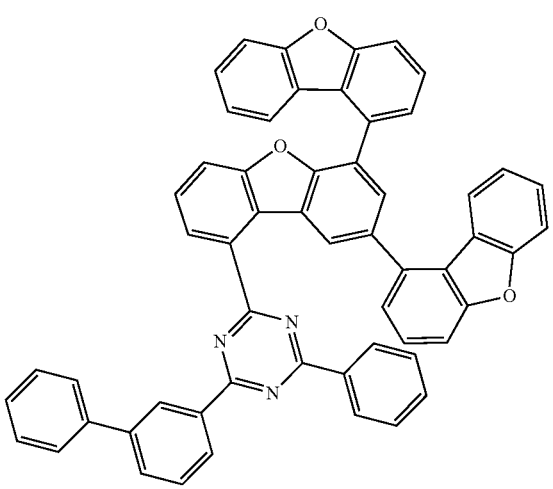

121
-continued
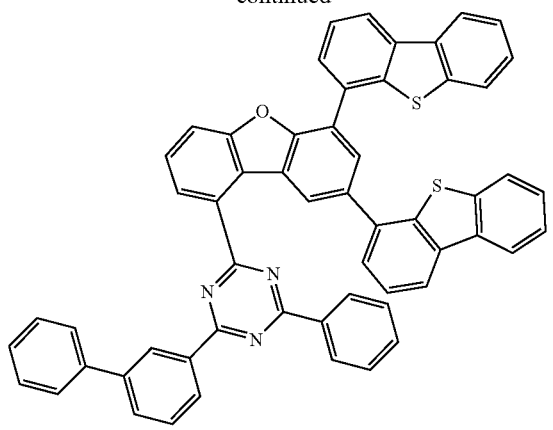
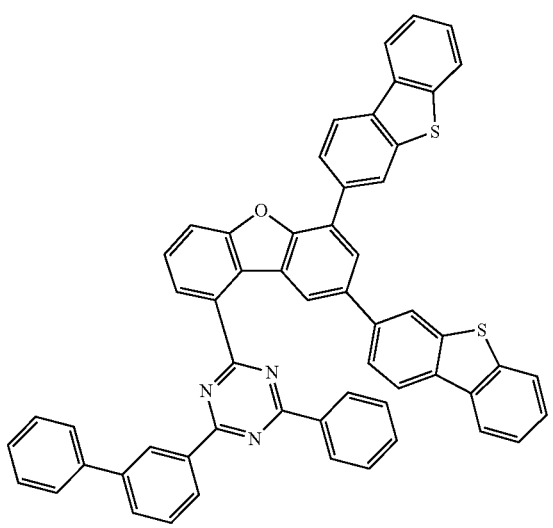
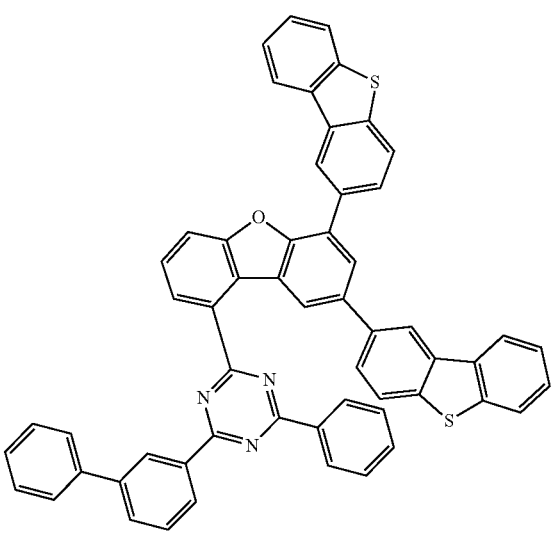
122
-continued
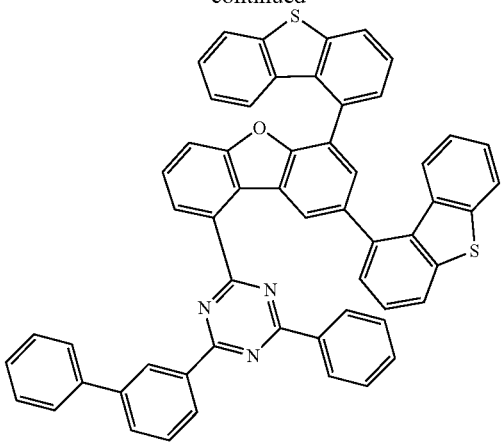
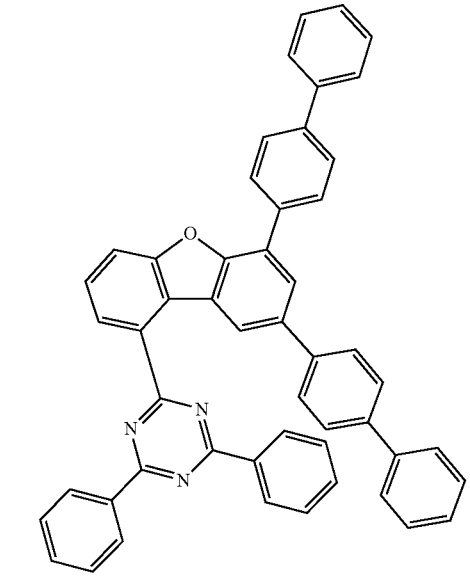
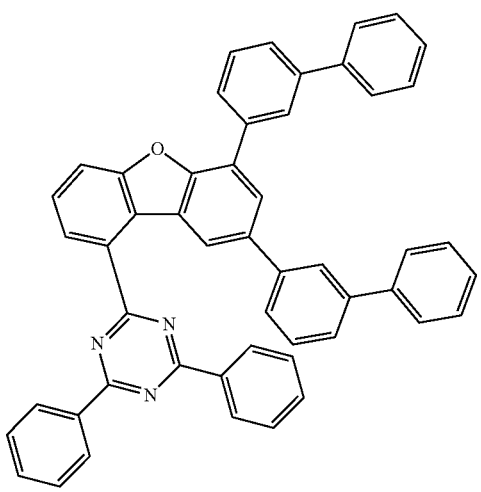

123
124
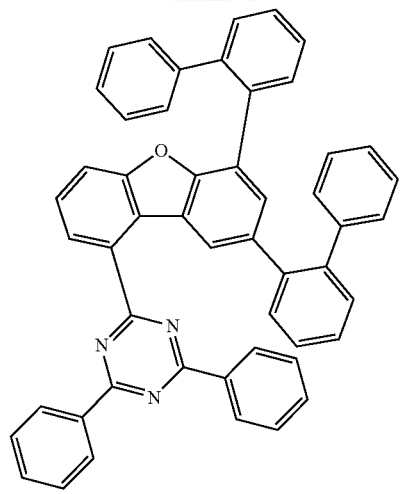
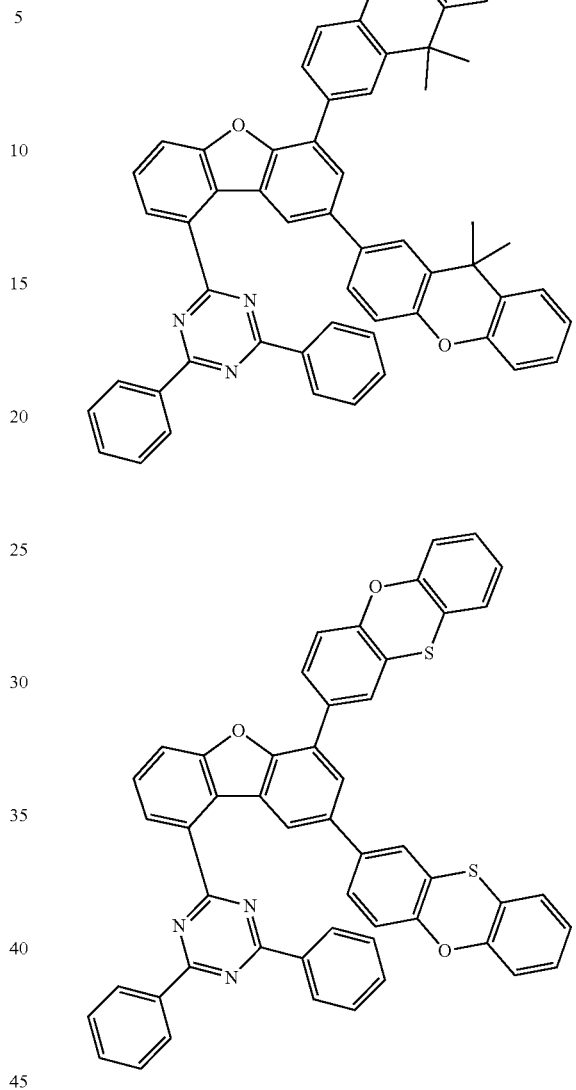
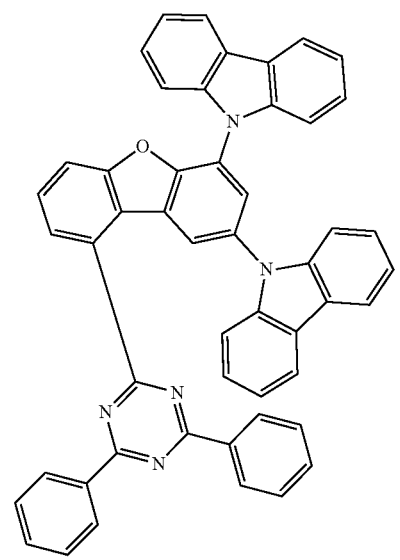
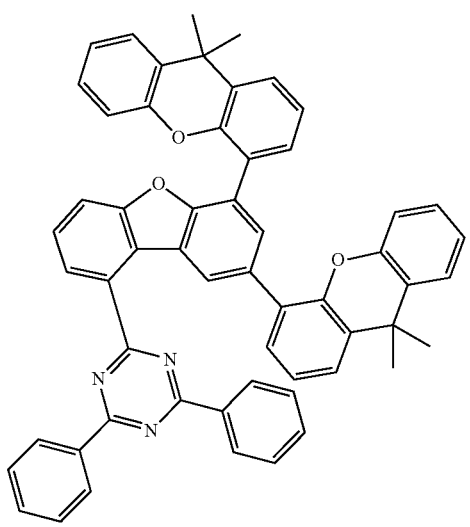
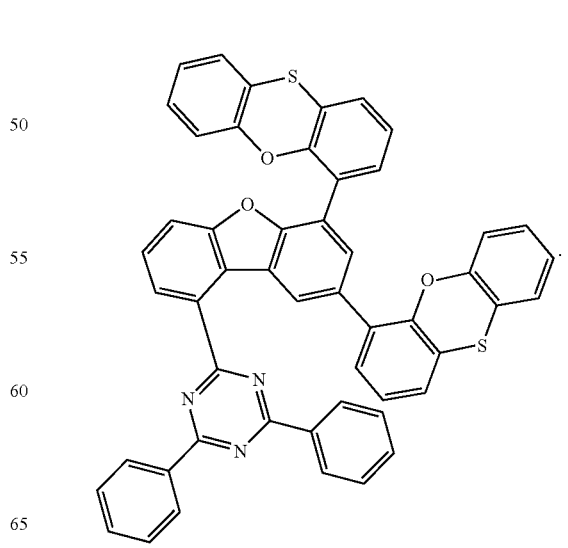

7. The organic light emitting device of claim 1,
wherein Y' is O, NR', C(CH₃)₂, or

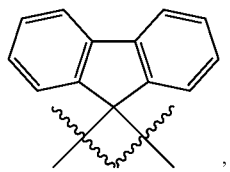, where R' is phenyl, cyano-substituted phenyl, biphenylyl, triphenylenyl, cyclohexyl, dimethylfluorenyl, or dibenzofuranyl.

8. The organic light emitting device of claim 1,
wherein L' and L" are single bonds.

9. The organic light emitting device of claim 1,
wherein $R'_1$ is phenyl, biphenylyl, terphenylyl, triphenylenyl, or phenanthrenyl.

10. The organic light emitting device of claim 1,
wherein $R'_2$ and $R'_3$ are each independently hydrogen; phenyl; cyano-substituted phenyl; or pyridinyl.

11. The organic light emitting device of claim 1,
wherein the compound represented by Chemical Formula 2 is any one selected from the group consisting of the following:

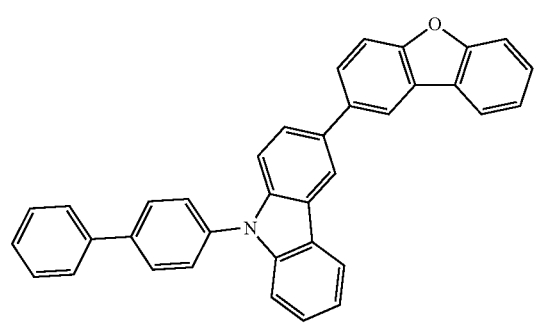

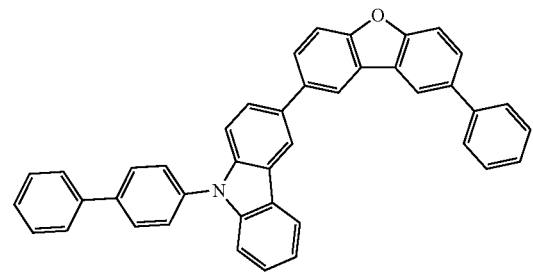

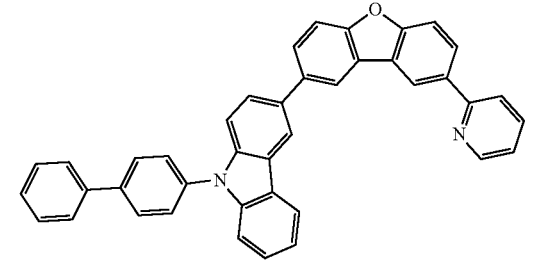

-continued

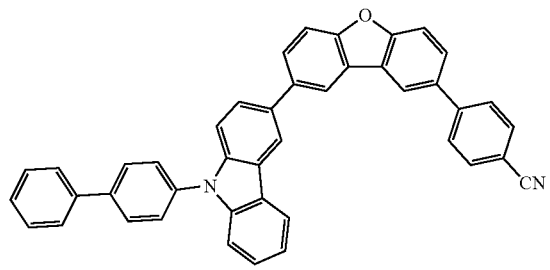

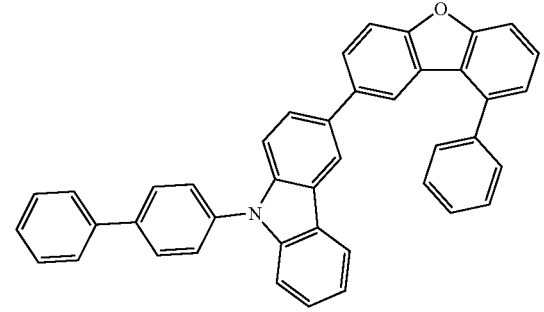

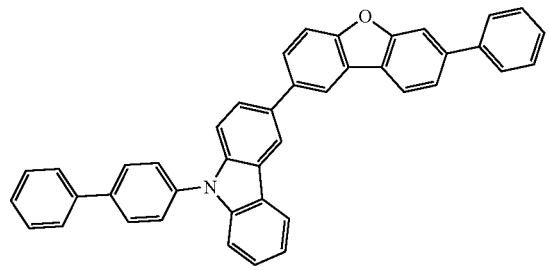

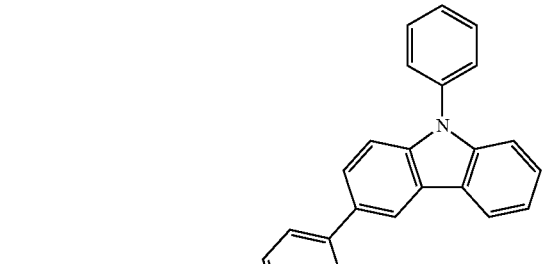

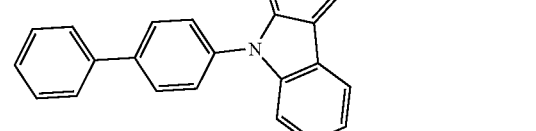

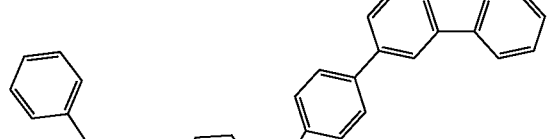

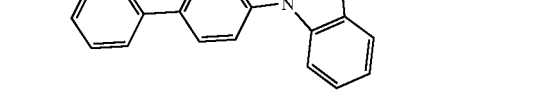

127
-continued
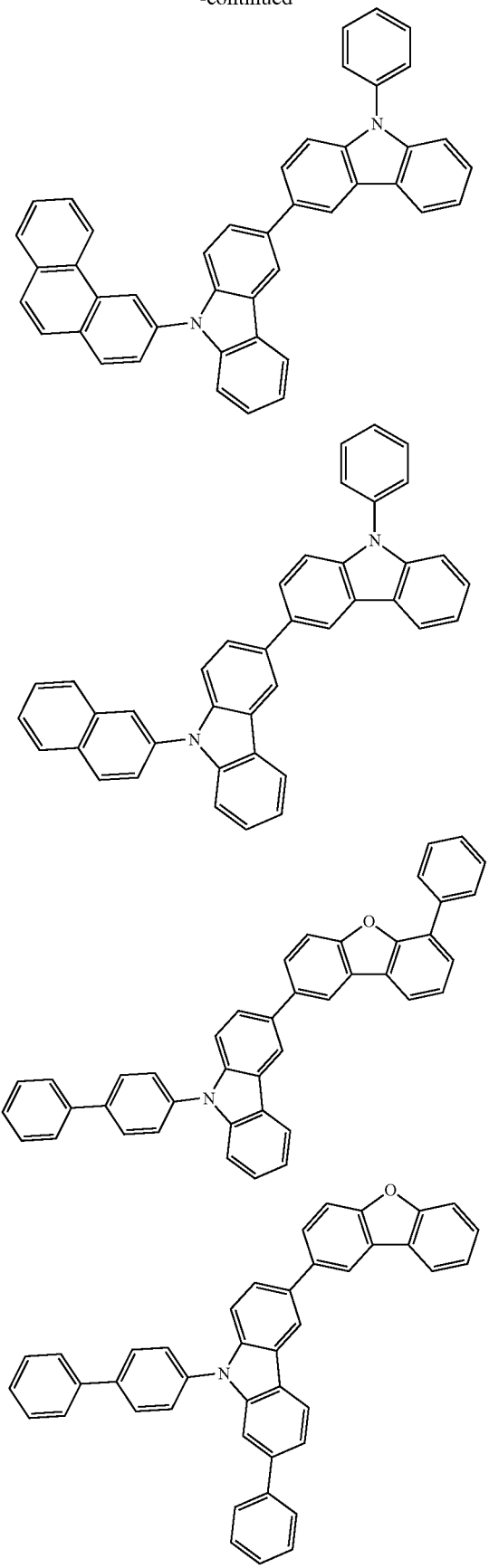
128
-continued
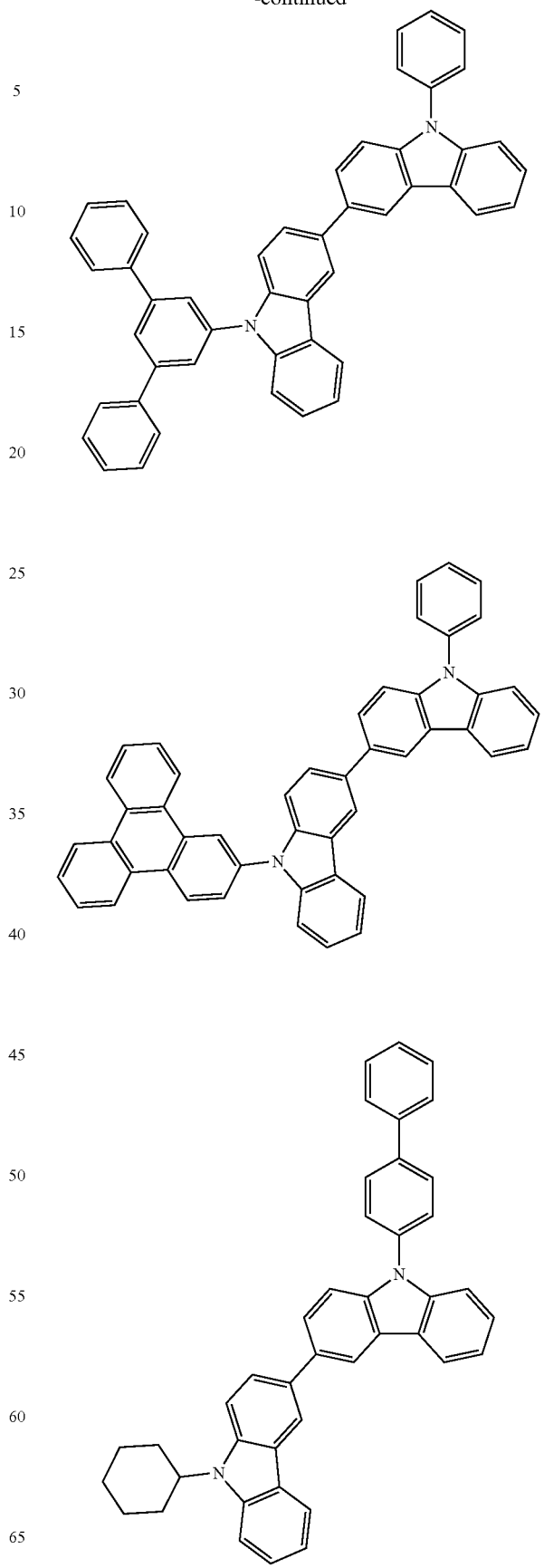

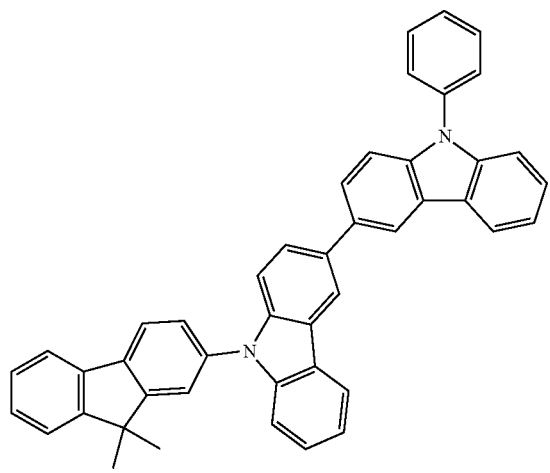
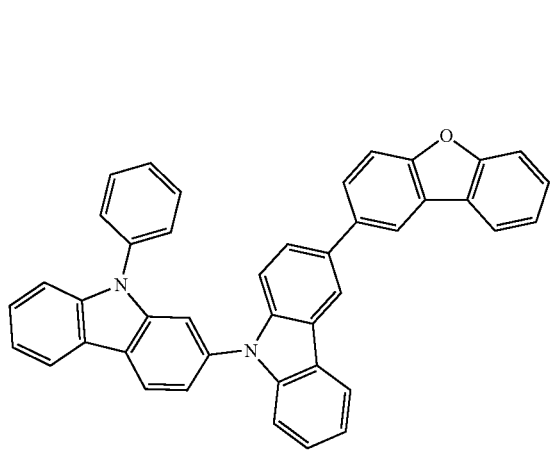
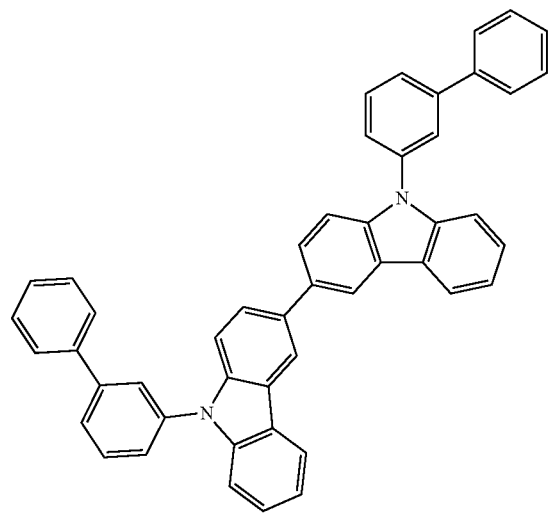
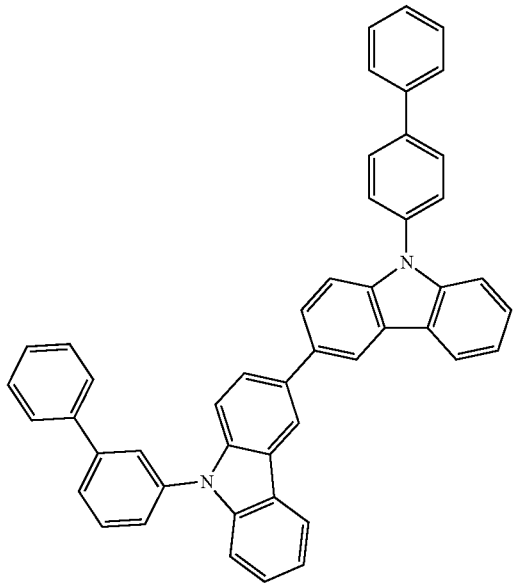
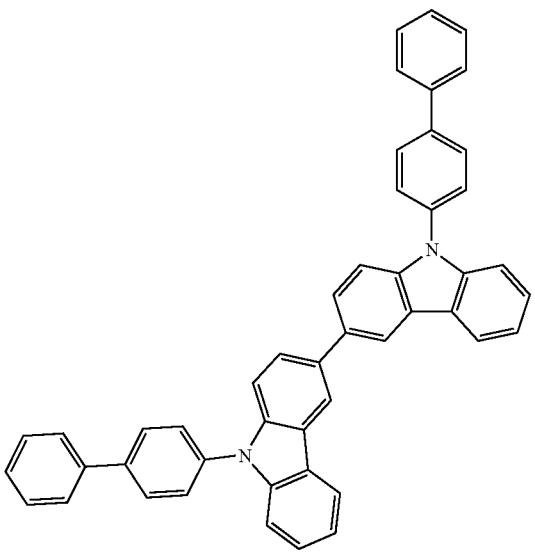
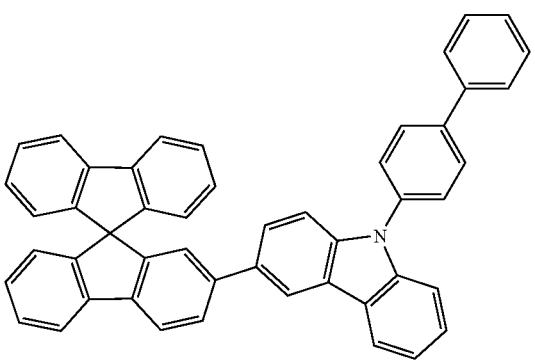

131
-continued
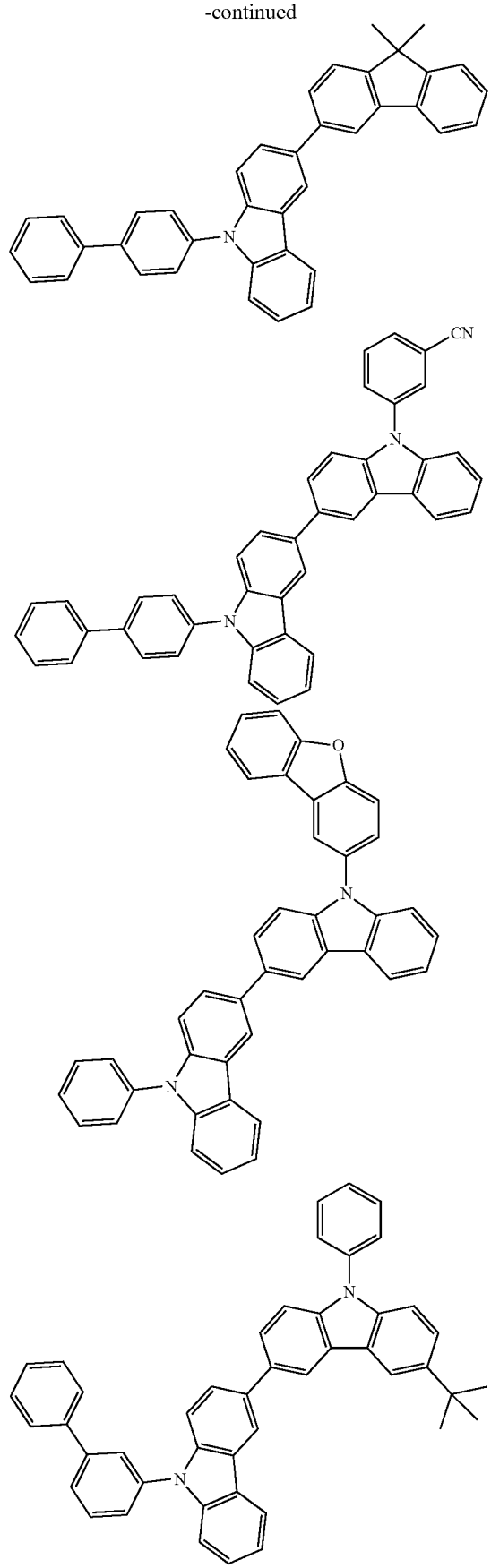
132
-continued
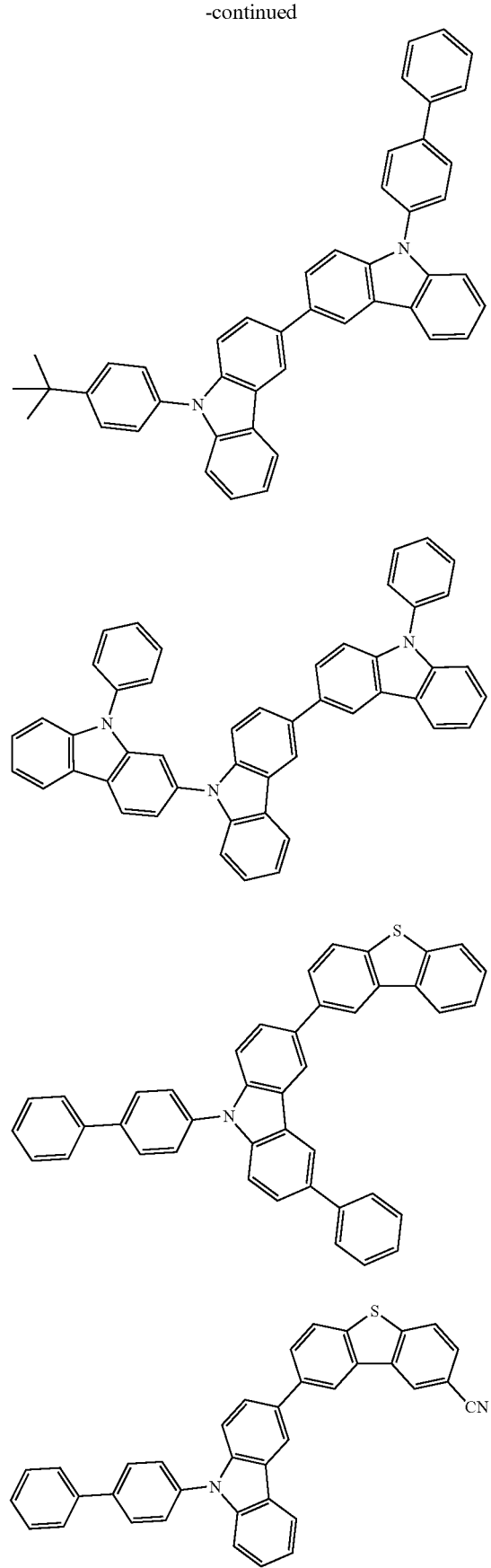

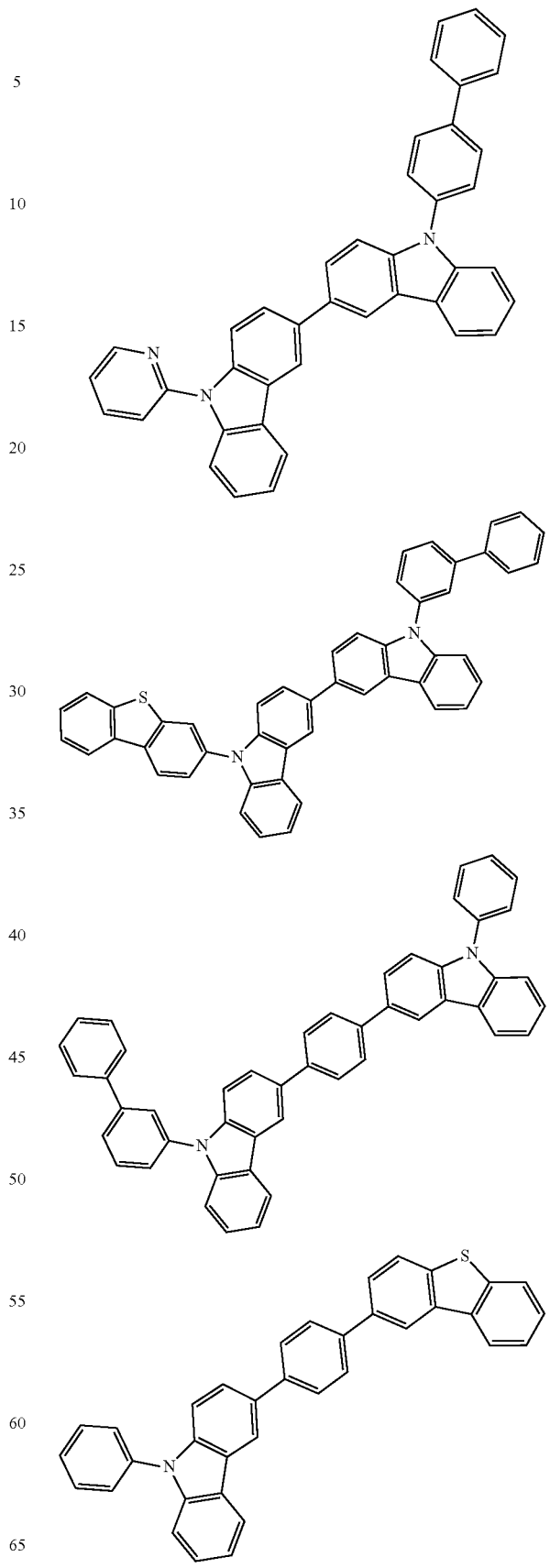

135
-continued
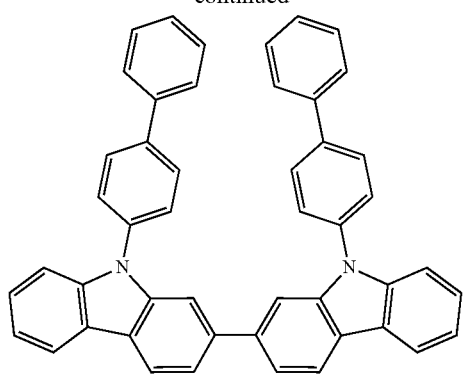
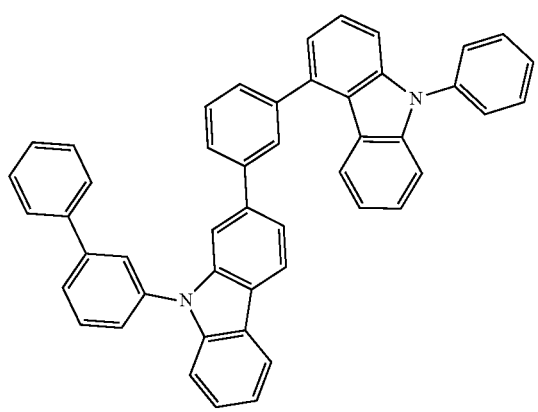
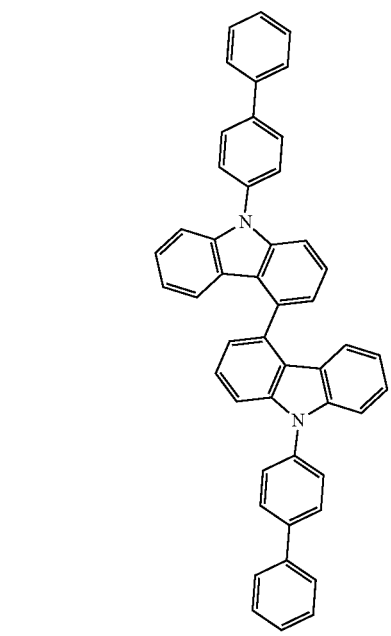
136
-continued
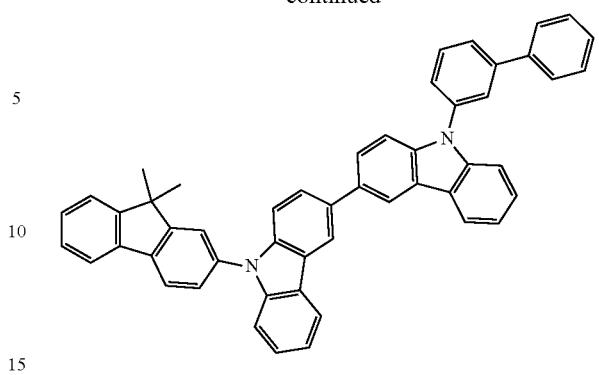
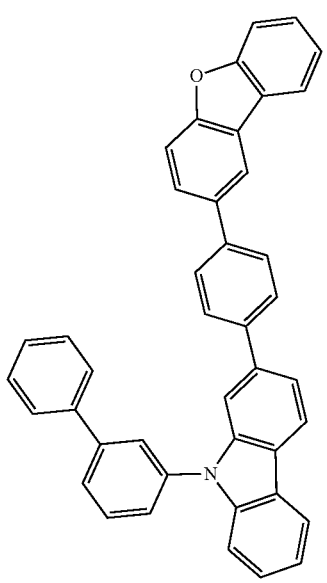
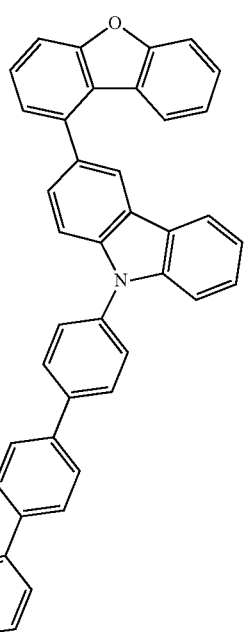

137
-continued
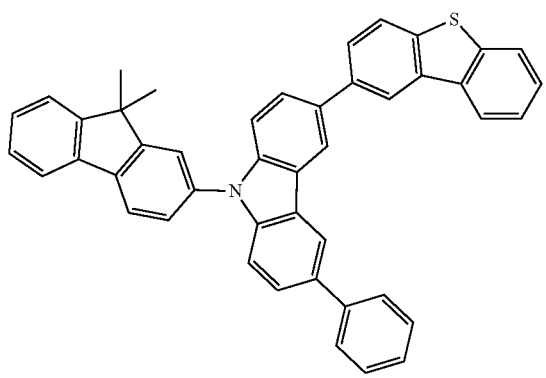
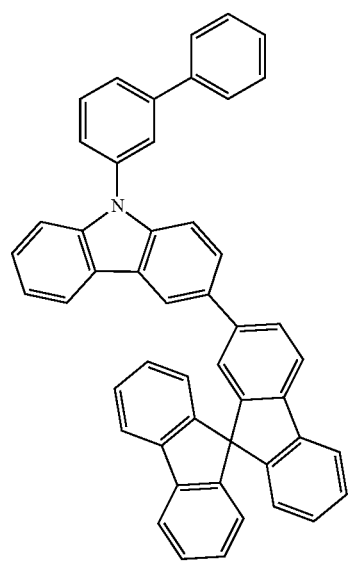
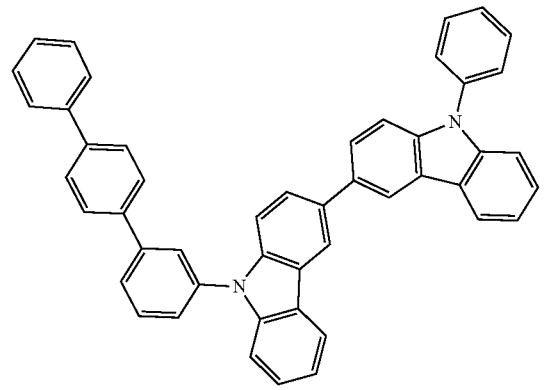
138
-continued
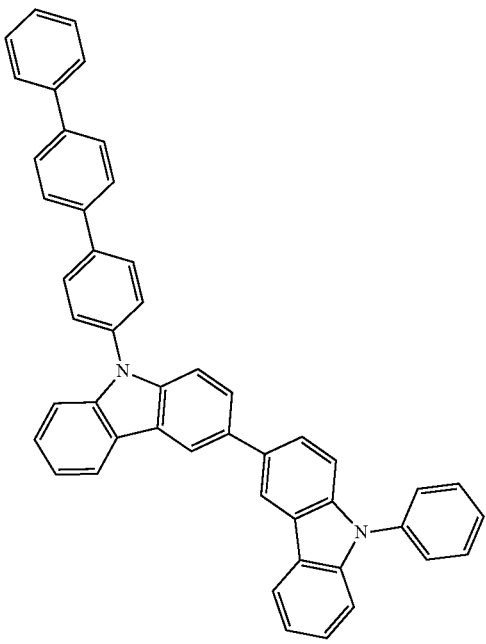
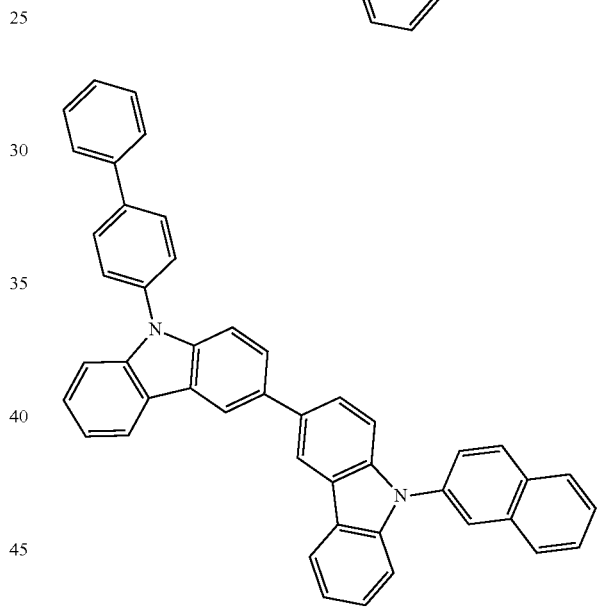
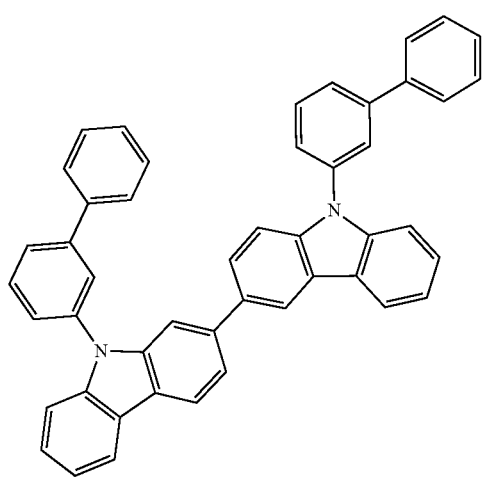

139
-continued
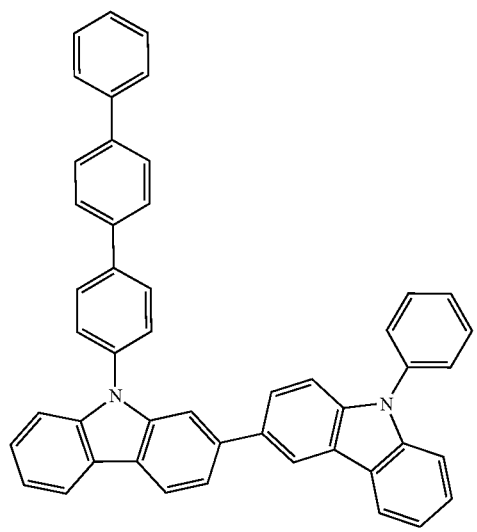
140
-continued
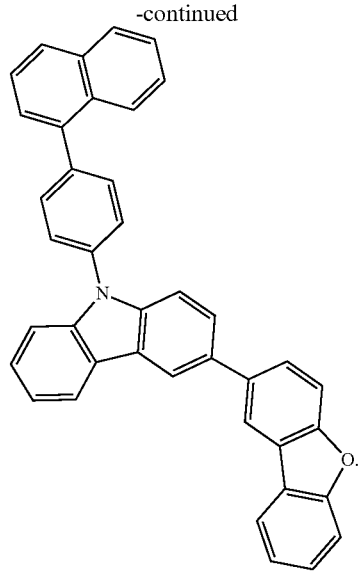
* * * * *